US012666778B2

(12) United States Patent
Song et al.

(10) Patent No.: US 12,666,778 B2
(45) Date of Patent: Jun. 23, 2026

(54) DISPLAY DEVICE AND METHOD OF FABRICATING THE SAME

(71) Applicant: Samsung Display Co., LTD., Yongin-si (KR)

(72) Inventors: Young Jin Song, Asan-si (KR); Sang Jo Kim, Daejeon (KR); Jin Wan Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 611 days.

(21) Appl. No.: 18/112,121

(22) Filed: Feb. 21, 2023

(65) Prior Publication Data

US 2023/0317764 A1      Oct. 5, 2023

(30) Foreign Application Priority Data

Mar. 8, 2022     (KR) ........................ 10-2022-0029227

(51) Int. Cl.
| | |
|---|---|
| *H01L 27/15* | (2006.01) |
| *H10H 20/01* | (2025.01) |
| *H10H 20/821* | (2025.01) |
| *H10H 20/84* | (2025.01) |
| *H10H 29/14* | (2025.01) |

(52) U.S. Cl.
CPC ........ H10H 29/142 (2025.01); H10H 20/018 (2025.01); H10H 20/821 (2025.01); H10H 20/84 (2025.01)

(58) Field of Classification Search
CPC .. H10H 29/142; H10H 20/018; H10H 20/821; H10H 20/84; H10H 20/017; H10H 29/012; H10H 29/8321; H10H 20/01335; H10H 20/0137; H10H 20/813; H10H 20/8215; H10H 20/815; H10H 20/824; H10H 20/83
See application file for complete search history.

(56) References Cited

U.S. PATENT DOCUMENTS

| | | | | |
|---|---|---|---|---|
| 2018/0190672 A1* | 7/2018 | Lee | ..................... | H01L 25/0753 |
| 2021/0288222 A1 | 9/2021 | Young et al. | | |

FOREIGN PATENT DOCUMENTS

| | | |
|---|---|---|
| CN | 102171846 | 8/2011 |
| EP | 3 796 389 | 3/2021 |
| KR | 10-2011-0021879 | 3/2011 |

(Continued)

OTHER PUBLICATIONS

Extended European Search Report for European Application No. 23160768.0, dated Aug. 21, 2023.

*Primary Examiner* — Mohammed R Alam
(74) *Attorney, Agent, or Firm* — Womble Bond Dickinson (US) LLP

(57) ABSTRACT

A display device includes a plurality of pixel electrodes spaced apart from each other on a substrate, a plurality of light emitting elements disposed on the plurality of pixel electrodes, the plurality of light emitting elements including a first semiconductor layer, a semiconductor pattern disposed on the first semiconductor layer, a common electrode layer disposed on the semiconductor pattern, and a void disposed between the first semiconductor layer, the semiconductor pattern, and the common electrode layer. The plurality of light emitting elements include a first light emitting element and a second light emitting element.

20 Claims, 36 Drawing Sheets

(56)     References Cited

FOREIGN PATENT DOCUMENTS

| KR | 10-2015-0048147 | 5/2015 |
| KR | 10-2022-0049065 | 4/2022 |
| WO | 2009/023722 | 2/2009 |

* cited by examiner

FIG. 1
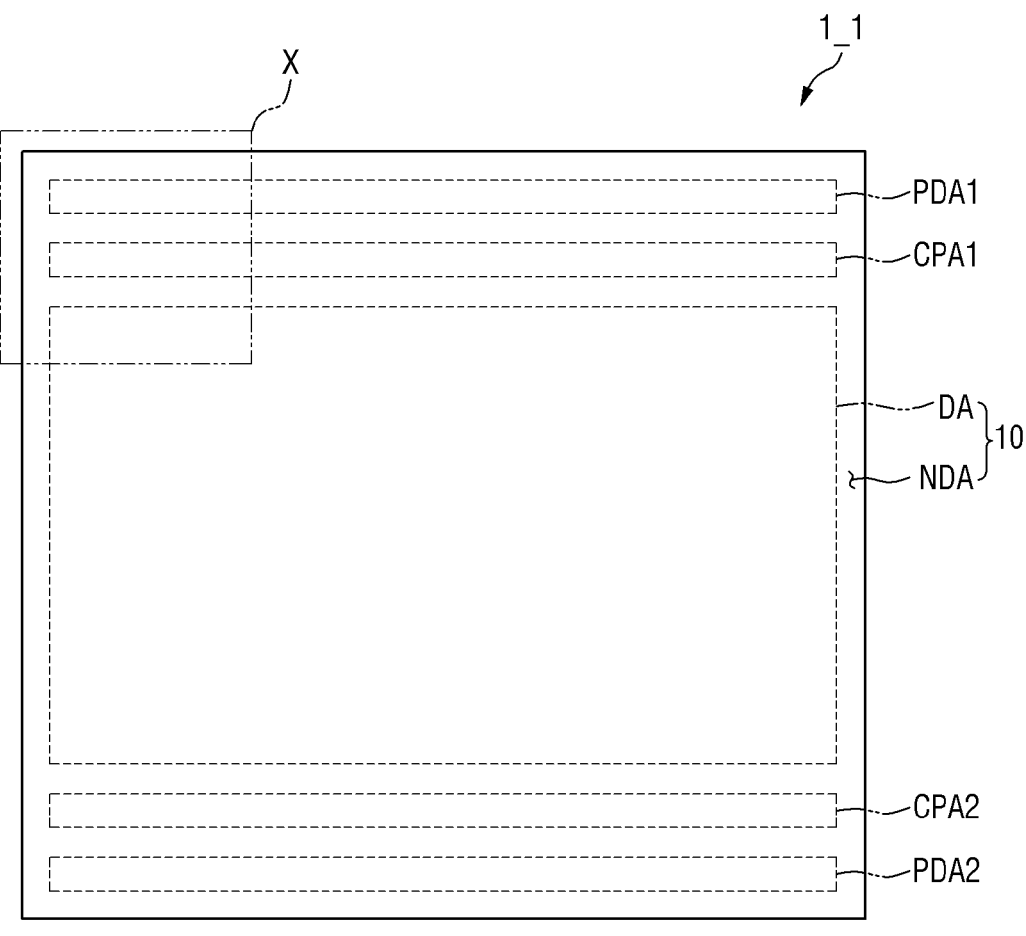
1_1
X
PDA1
CPA1
DA
NDA } 10
CPA2
PDA2
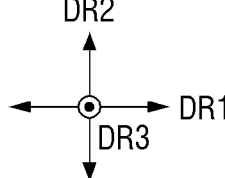
DR2
DR1
DR3

FIG. 3
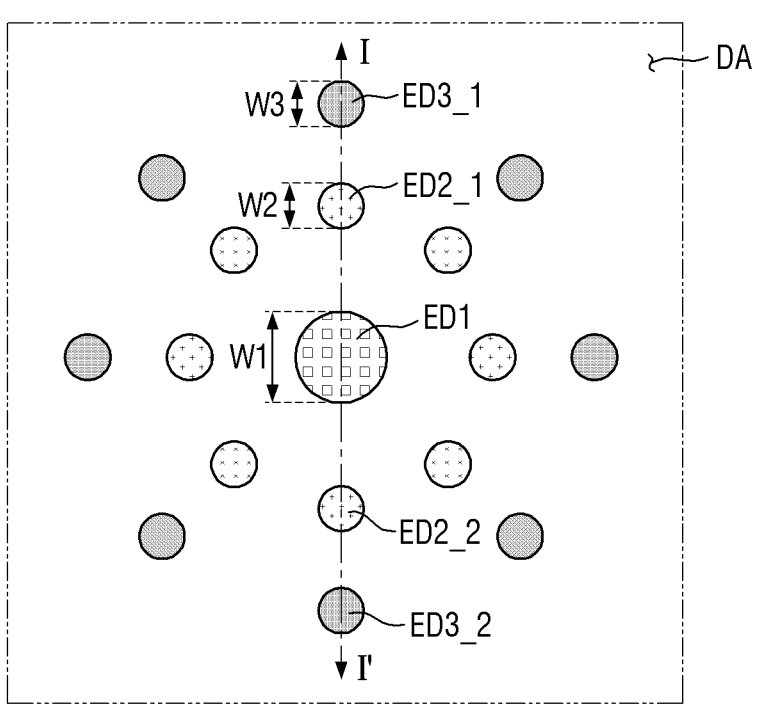
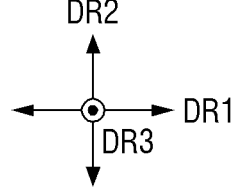
PX: ED1, ED2, ED3
ED2: ED2_1, ED2_2
ED3: ED3_1, ED3_2

FIG. 6

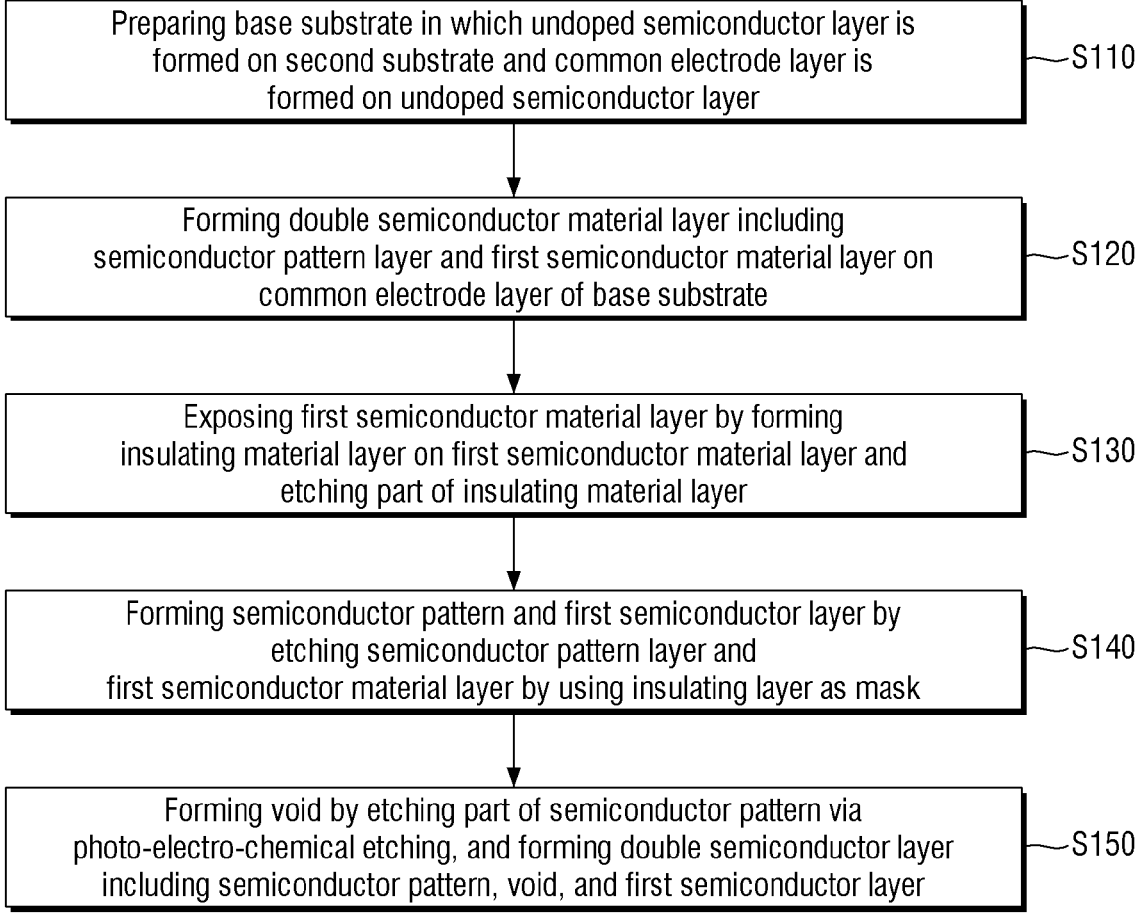

Preparing base substrate in which undoped semiconductor layer is formed on second substrate and common electrode layer is formed on undoped semiconductor layer — S110

Forming double semiconductor material layer including semiconductor pattern layer and first semiconductor material layer on common electrode layer of base substrate — S120

Exposing first semiconductor material layer by forming insulating material layer on first semiconductor material layer and etching part of insulating material layer — S130

Forming semiconductor pattern and first semiconductor layer by etching semiconductor pattern layer and first semiconductor material layer by using insulating layer as mask — S140

Forming void by etching part of semiconductor pattern via photo-electro-chemical etching, and forming double semiconductor layer including semiconductor pattern, void, and first semiconductor layer — S150

FIG. 7

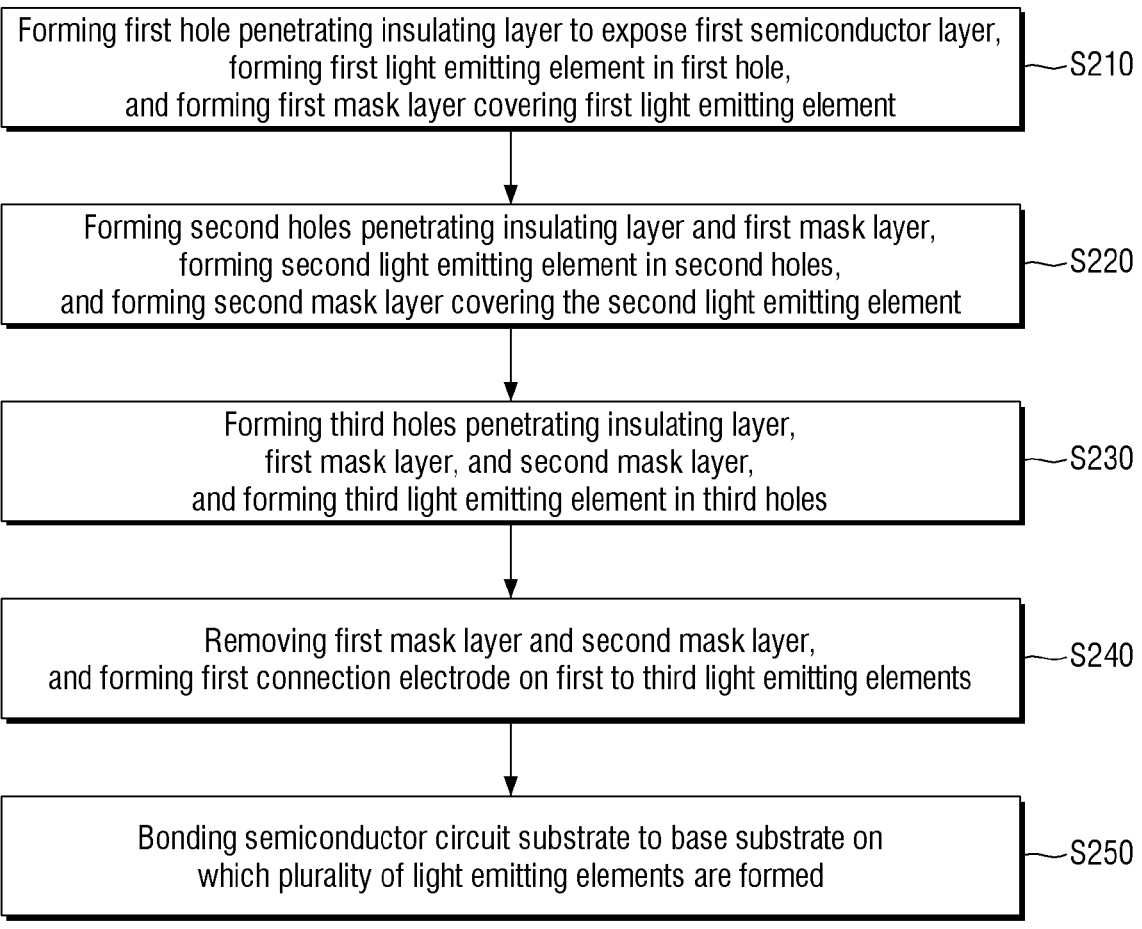

Forming first hole penetrating insulating layer to expose first semiconductor layer,
forming first light emitting element in first hole,
and forming first mask layer covering first light emitting element —S210

Forming second holes penetrating insulating layer and first mask layer,
forming second light emitting element in second holes,
and forming second mask layer covering the second light emitting element —S220

Forming third holes penetrating insulating layer,
first mask layer, and second mask layer,
and forming third light emitting element in third holes —S230

Removing first mask layer and second mask layer,
and forming first connection electrode on first to third light emitting elements —S240

Bonding semiconductor circuit substrate to base substrate on
which plurality of light emitting elements are formed —S250

DR3

FIG. 9
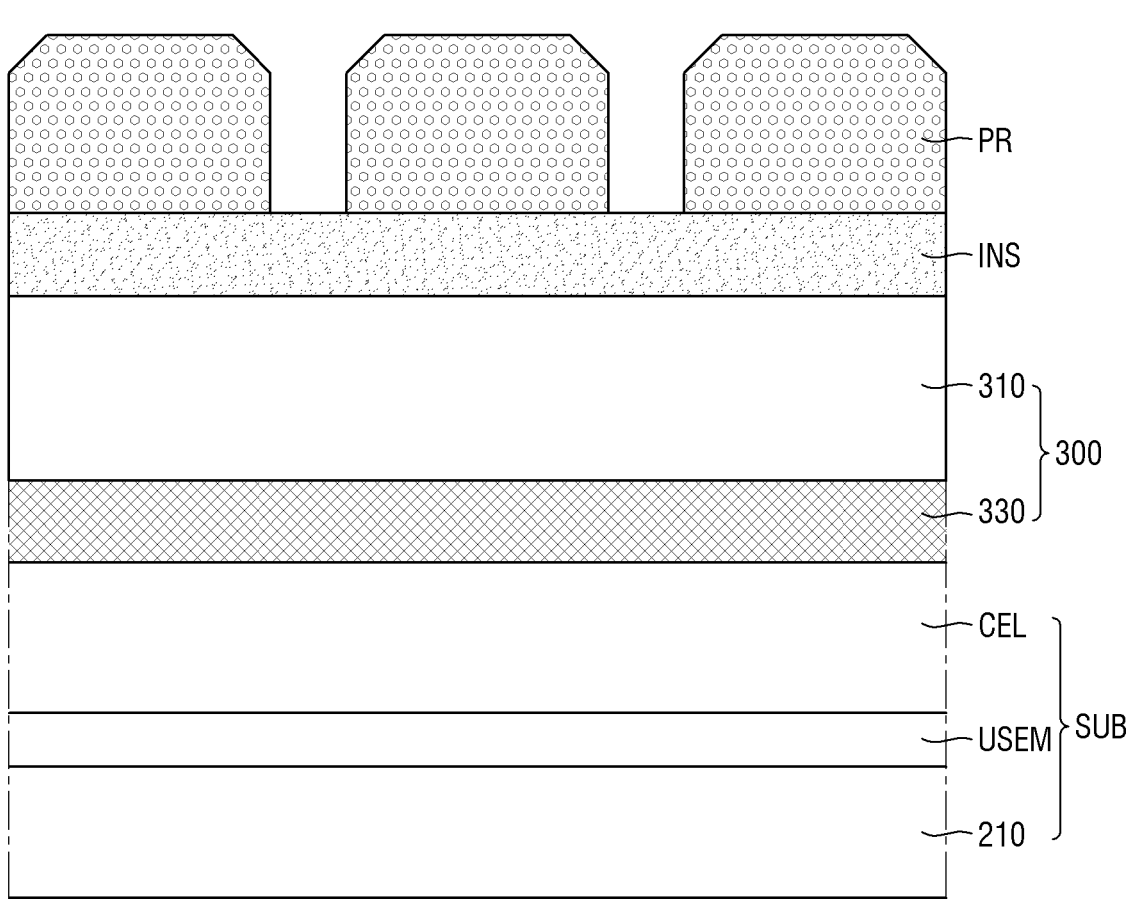
DR3

FIG. 10
etching (Etch1)
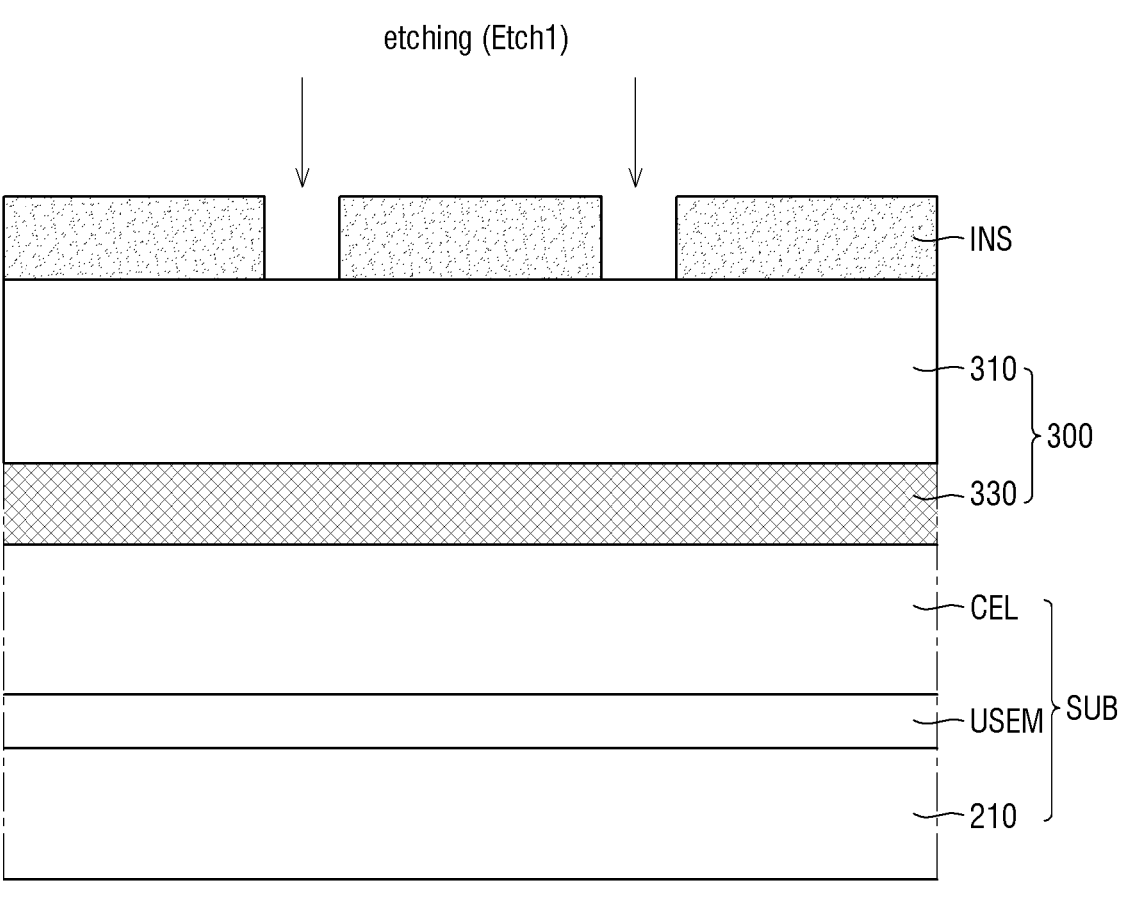
DR3

FIG. 11
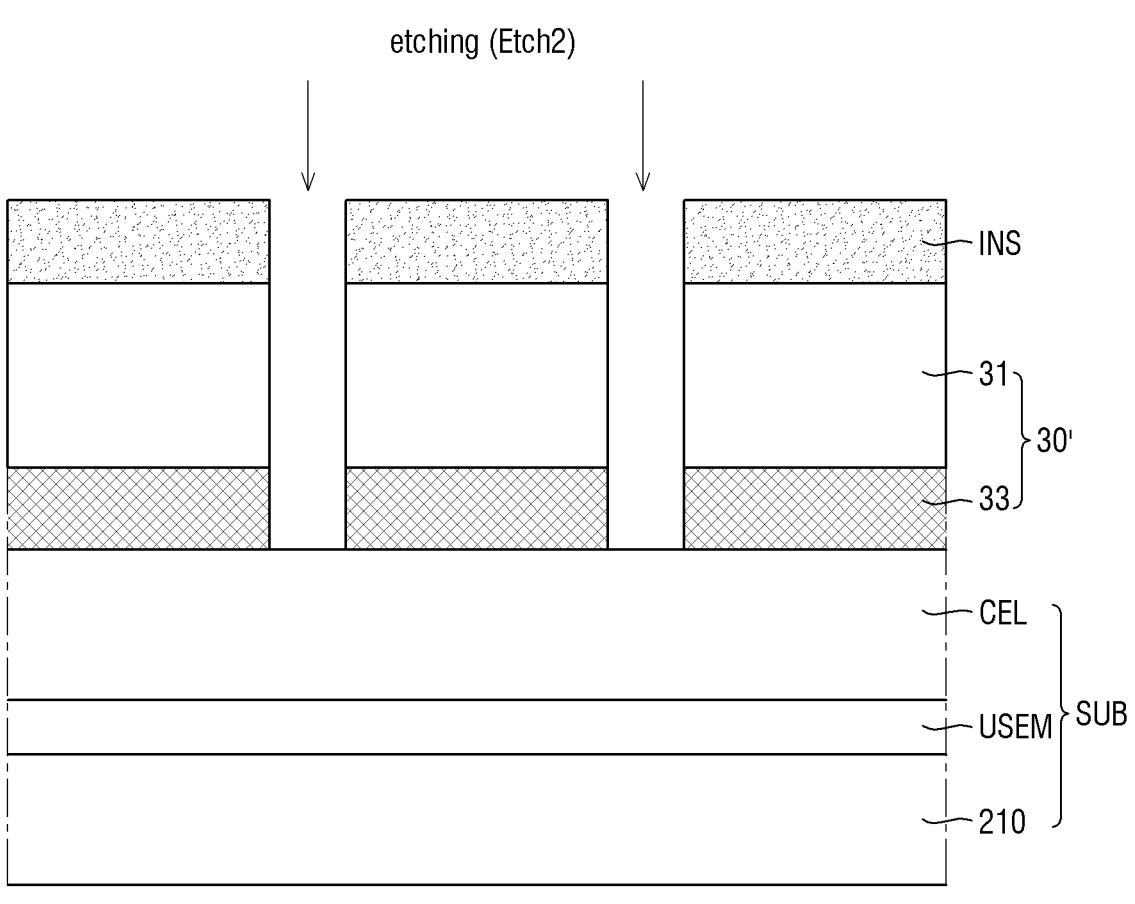
etching (Etch2)
INS
31
33
30'
CEL
USEM
210
SUB
DR3

FIG. 12
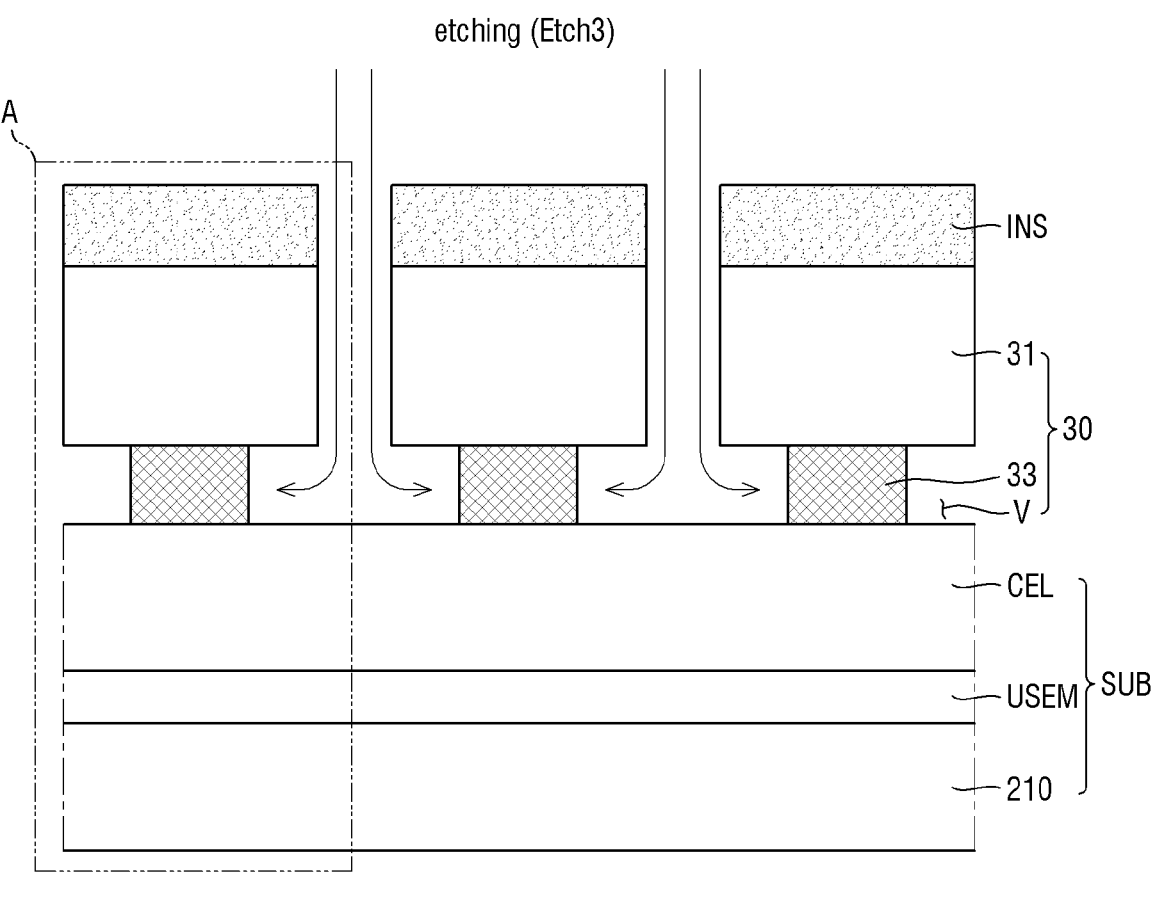

FIG. 13
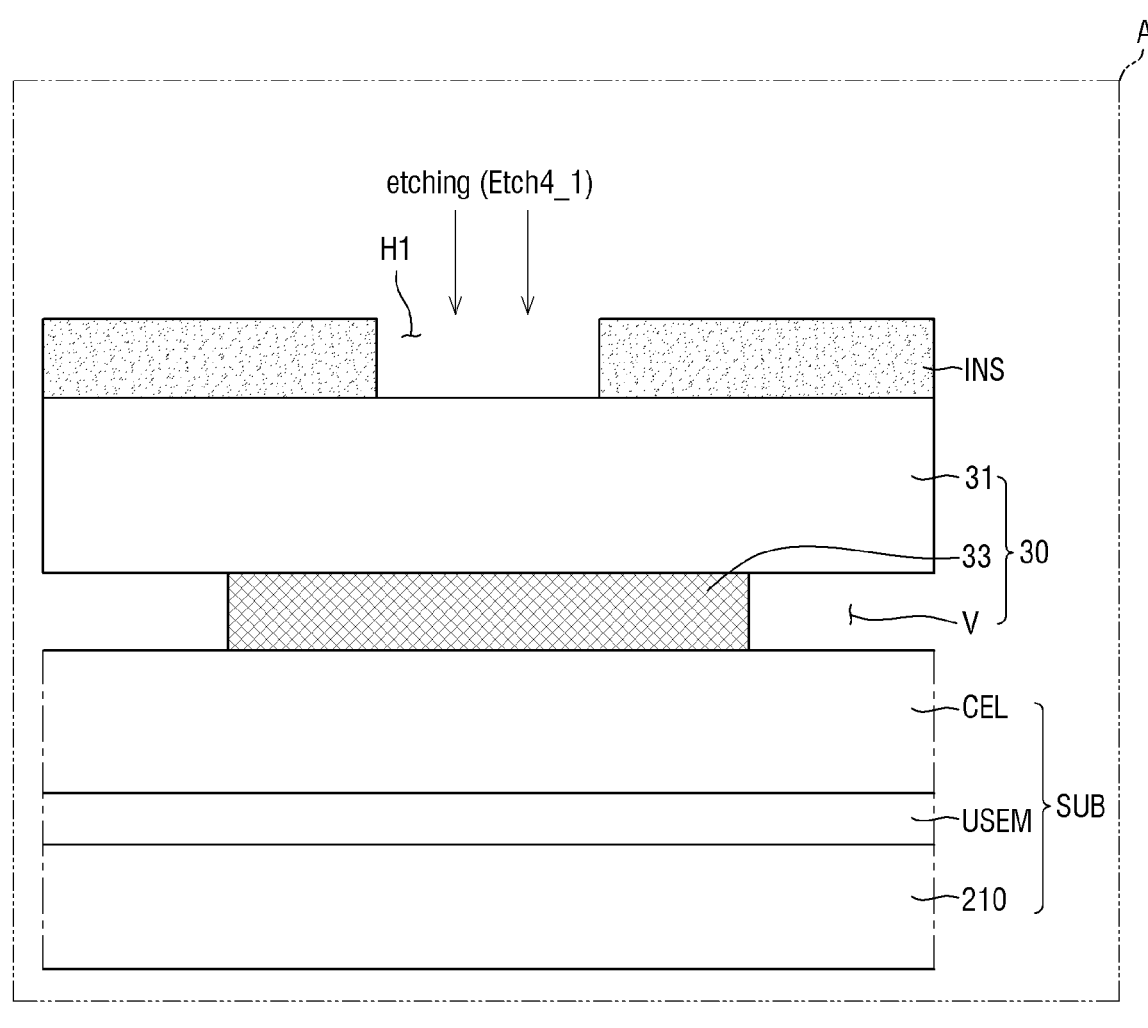

Figure 24:
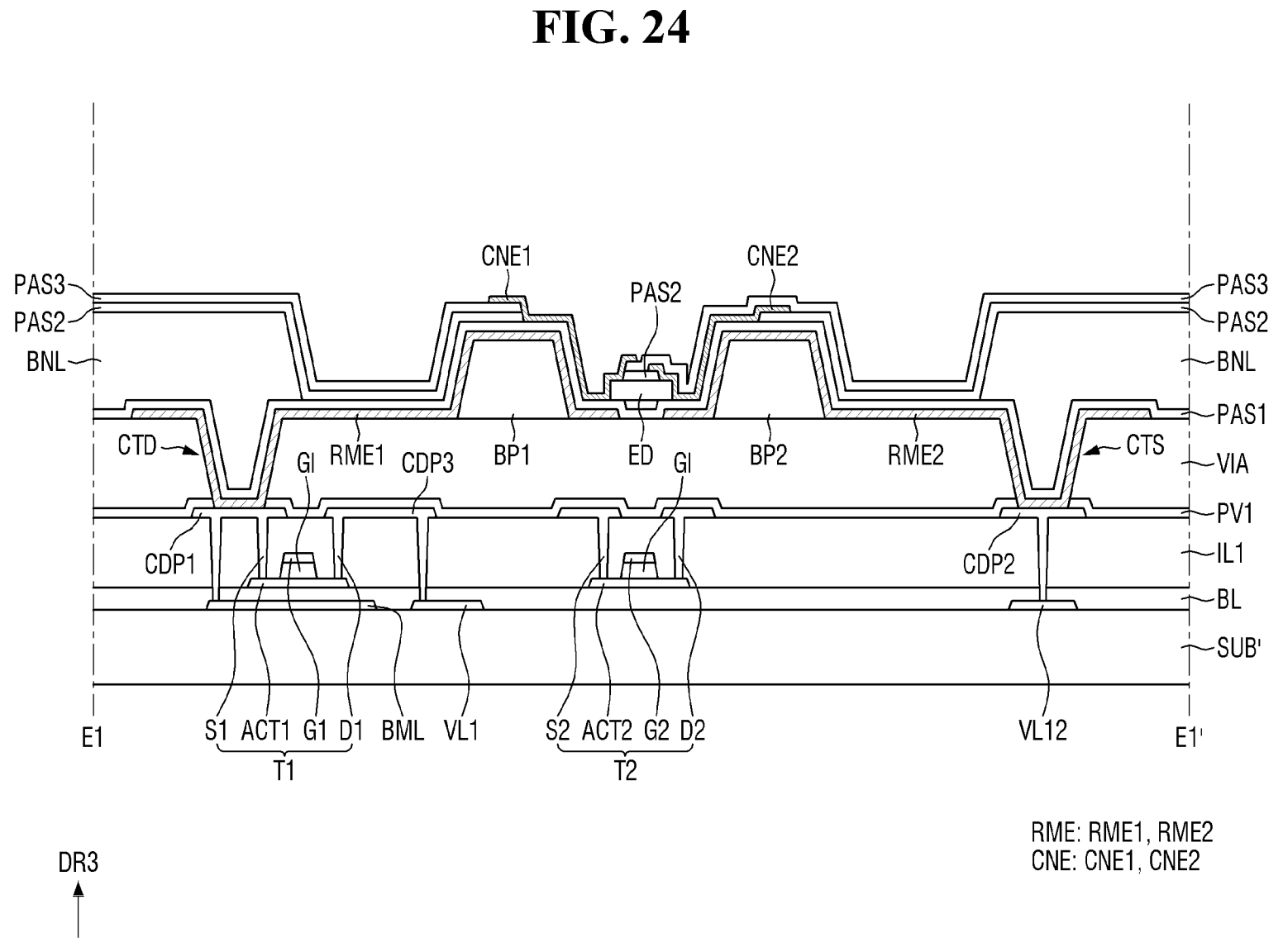

PAS3
PAS2
BNL
PAS1
VIA
PV1
IL1
BL
SUB'

CTS

RME2

CDP2

VL12

CNE2

BP2

PAS2

ED  GI

S2 ACT2 G2 D2

T2

CNE1

BP1

CDP3

RME1

VL1

BML

GI RME1 CDP3

GI

S1 ACT1 G1 D1

T1

CTD

CDP1

E1'

E1

PAS3
PAS2
BNL

RME: RME1, RME2
CNE: CNE1, CNE2

RME: RME1, RME2
CNE: CNE1, CNE2

FIG. 27

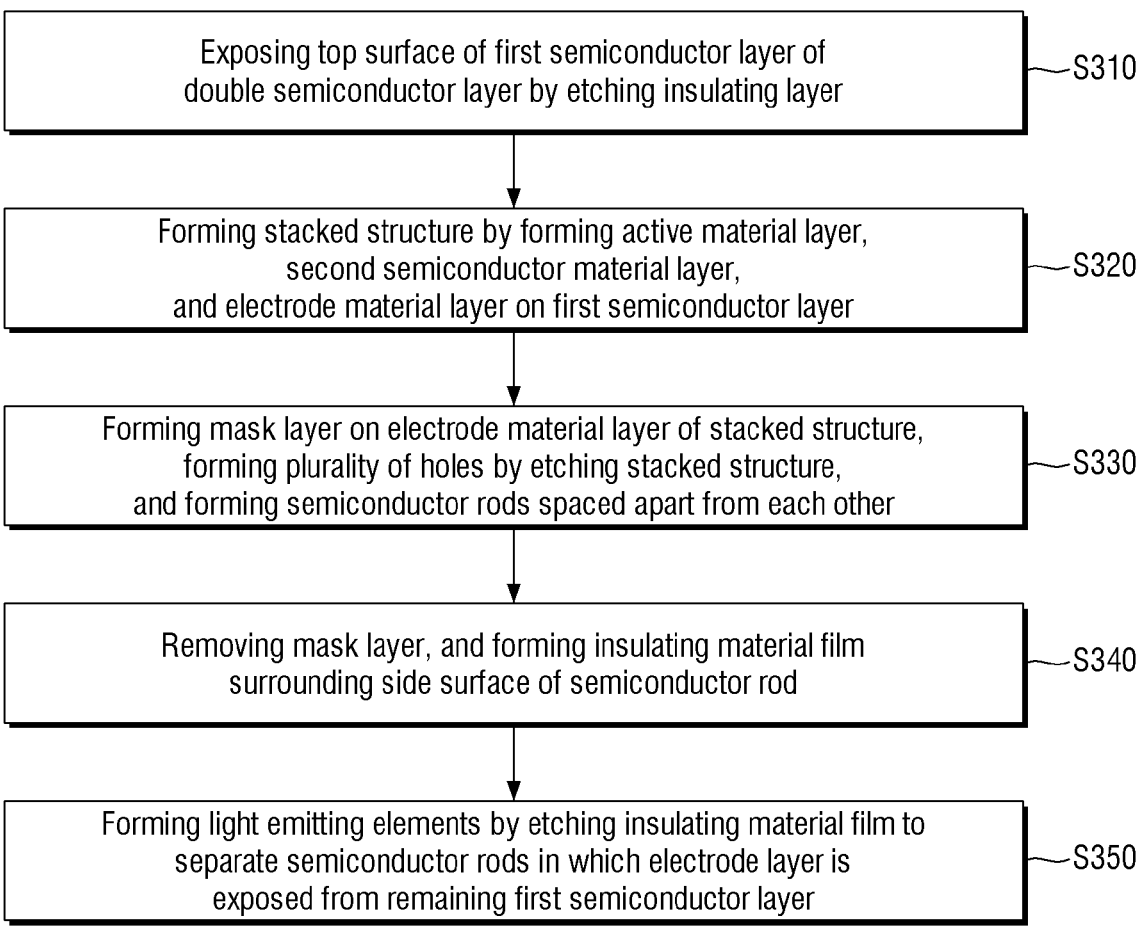

Exposing top surface of first semiconductor layer of
double semiconductor layer by etching insulating layer — S310

Forming stacked structure by forming active material layer,
second semiconductor material layer,
and electrode material layer on first semiconductor layer — S320

Forming mask layer on electrode material layer of stacked structure,
forming plurality of holes by etching stacked structure,
and forming semiconductor rods spaced apart from each other — S330

Removing mask layer, and forming insulating material film
surrounding side surface of semiconductor rod — S340

Forming light emitting elements by etching insulating material film to
separate semiconductor rods in which electrode layer is
exposed from remaining first semiconductor layer — S350

FIG. 28
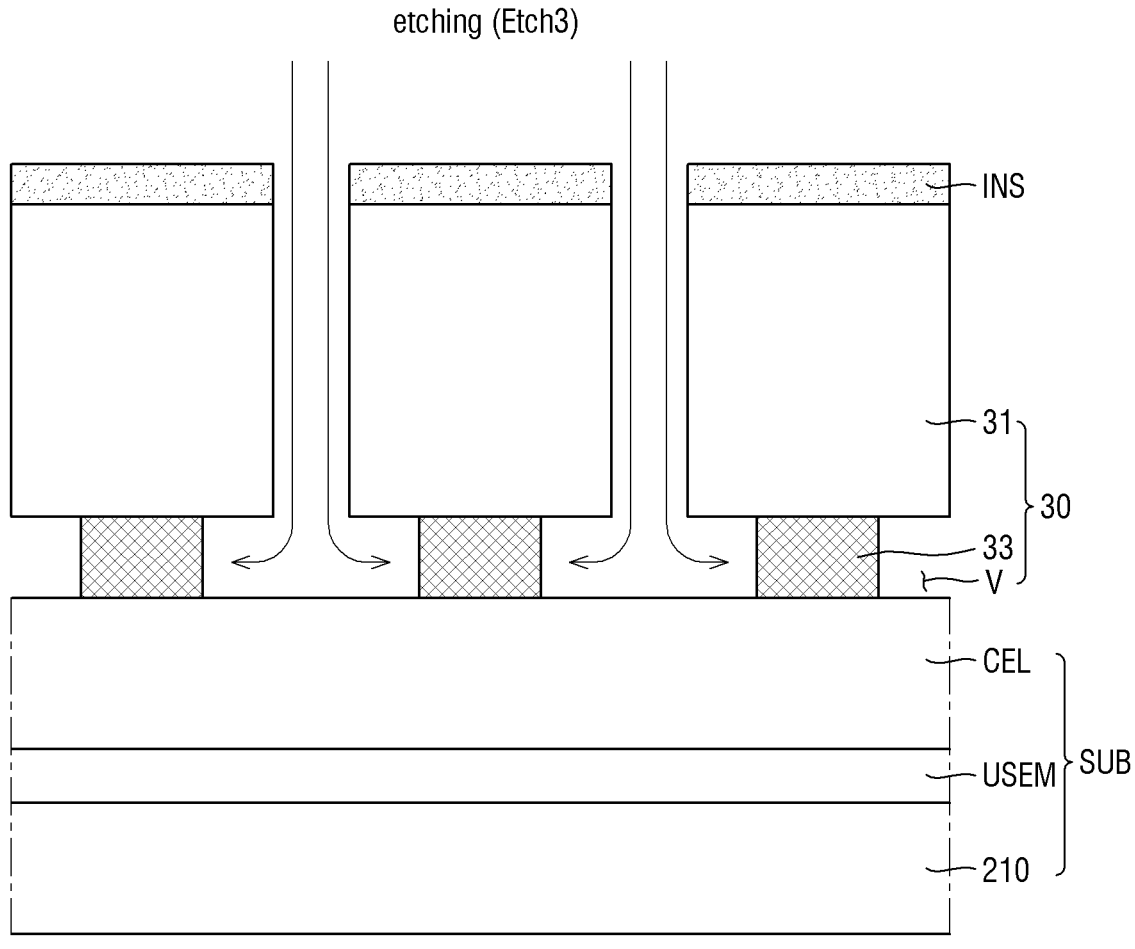
etching (Etch3)
INS
31 ⎫
   ⎬ 30
33 ⎭
V
CEL ⎫
USEM ⎬ SUB
210 ⎭
DR3

FIG. 29
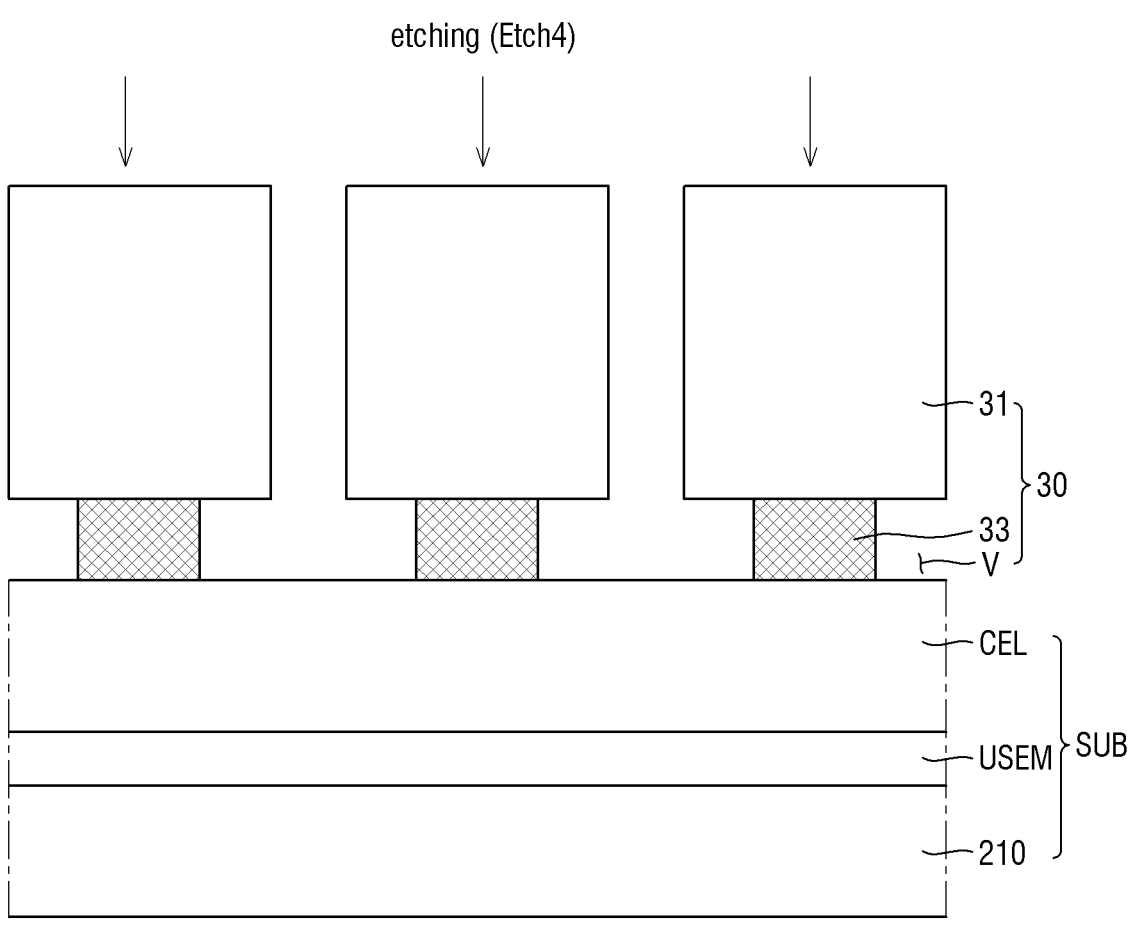
etching (Etch4)
DR3

30: 31, 33, V

B 430
410  } 400
420

370
320
360

LS

31

33

V

CEL

USEM  } SUB

210

DR3

30: 31, 33, V

B etching (Etch5)

HOL 430
410 } 400
420
370
320
360

SR

31

33

V

CEL
USEM } SUB
210

DR3

30: 31, 33, V

HOL 370
320
360

SR

31

33

V

CEL

USEM

SUB

210

DR3

30: 31, 33, V

B 370
320
360

SR

380

31

33

V

CEL

USEM    SUB

210

DR3

30: 31, 33, V

B etching (Etch6)

370
320
360

SR

380

31

33

V

CEL

USEM    SUB

210

DR3

30: 31, 33, V

DR3

30: 31, 33, V

DISPLAY DEVICE AND METHOD OF FABRICATING THE SAME

CROSS-REFERENCE TO RELATED APPLICATION

This application claims priority to and benefit of Korean Patent Application No. 10-2022-0029227 under 35 U.S.C. 119, filed on Mar. 8, 2022, in the Korean Intellectual Property Office (KIPO), the contents of which are incorporated by reference in its entirety.

BACKGROUND

1. Technical Field

The disclosure relates to a display device and a method of fabricating the same.

2. Description of the Related Art

The importance of display devices has steadily increased with the development of multimedia technology. In response thereto, various types of display devices such as an organic light emitting display (OLED), a liquid crystal display (LCD) and the like have been used.

As a device for displaying an image of a display device, there is a self-light emitting display device including a light emitting element. The self-light emitting display device includes an organic light emitting display device using an organic material as a light emitting material as a light emitting element, an inorganic light emitting display device using an inorganic material as a light emitting material, or the like.

SUMMARY

Aspects of the disclosure provide a display device in which defects are improved when a light emitting element of a long wavelength band is grown.

Aspects of the disclosure also provide a method of fabricating a display device in which defects are improved when a light emitting element of a long wavelength band is grown.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device may include a plurality of pixel electrodes spaced apart from each other on a substrate, a plurality of light emitting elements disposed on the plurality of pixel electrodes, the plurality of light emitting elements including a first semiconductor layer, a semiconductor pattern disposed on the first semiconductor layer, a common electrode layer disposed on the semiconductor pattern, and a void disposed between the first semiconductor layer, the semiconductor pattern, and the common electrode layer. The plurality of light emitting elements may include a first light emitting element and a second light emitting element.

In an embodiment, the first semiconductor layer and the semiconductor pattern may include different materials.

In an embodiment, a lattice constant of the semiconductor pattern may be greater than a lattice constant of the first semiconductor layer.

In an embodiment, the first semiconductor layer and the semiconductor pattern may be each doped with an n-type dopant.

In an embodiment, each of the plurality of light emitting elements may further include a second semiconductor layer electrically connected to a corresponding one of the plurality of pixel electrodes, and an active layer disposed between the first semiconductor layer and the second semiconductor layer.

In an embodiment, the semiconductor pattern and the active layer may include a same material.

In an embodiment, the first semiconductor layer and the common electrode layer may be spaced apart from each other in a thickness direction of the substrate and may be electrically connected to each other.

In an embodiment, a width of the semiconductor pattern in a direction may be smaller than a width of the first semiconductor layer in the direction.

In an embodiment, the width of the semiconductor pattern in the direction may be greater than a width of the first light emitting element in the direction.

In an embodiment, the void may be surrounded by each of the first semiconductor layer, the semiconductor pattern, and the common electrode layer.

In an embodiment, the semiconductor pattern may overlap the first light emitting element in a thickness direction of the substrate.

In an embodiment, the semiconductor pattern may not overlap the second light emitting element in the thickness direction of the substrate.

In an embodiment, the first light emitting element may emit light of a blue wavelength band, and the second light emitting element may emit light of a red wavelength band.

In an embodiment, the void may overlap at least one of the plurality of light emitting elements in a thickness direction of the substrate.

According to an embodiment of the disclosure, a method of fabricating a display device may include forming a common electrode layer including an n-type semiconductor on a substrate, forming a semiconductor material layer on the common electrode layer, forming a semiconductor pattern layer on the semiconductor material layer, forming an insulating layer on the semiconductor material layer, forming a semiconductor pattern and a first semiconductor layer by etching the semiconductor pattern layer and the semiconductor material layer, forming a void by etching a portion of the semiconductor pattern, forming a plurality of holes penetrating the insulating layer to expose a portion of the first semiconductor layer, and forming an active layer and a second semiconductor layer including a p-type semiconductor in each of the plurality of holes.

In an embodiment, the forming of the void by etching a portion of the semiconductor pattern may include exposing another portion of the first semiconductor layer and a portion of the common electrode layer.

In an embodiment, the display device may include a plurality of light emitting elements, the plurality of light emitting elements may include the first semiconductor layer, the active layer, and the second semiconductor layer, and the plurality of light emitting elements may include a blue light emitting element, a green light emitting element, and a red light emitting element which are sequentially arranged in a direction.

In an embodiment, a lattice constant of the semiconductor pattern may be greater than a lattice constant of the first semiconductor layer.

According to an embodiment of the disclosure, a method of fabricating a display device may include forming a common electrode layer including an n-type semiconductor on a substrate, forming a first semiconductor material layer on the common electrode layer, forming a semiconductor pattern layer on the first semiconductor material layer, forming a semiconductor pattern and a first semiconductor layer by etching the semiconductor pattern layer and the first semiconductor material layer, forming a void by etching a portion of the semiconductor pattern, forming a stacked structure by forming an active material layer on the first semiconductor layer and forming a second semiconductor material layer on the active material layer, forming semiconductor rods spaced apart from each other by forming a plurality of holes by etching the stacked structure in a thickness direction of the substrate, forming an insulating material film surrounding outer surfaces of the semiconductor rods, and separating the semiconductor rods from the substrate to form light emitting elements.

In an embodiment, at least some of the semiconductor rods may overlap the semiconductor pattern in the thickness direction of the substrate, and other of the semiconductor rods may overlap the void in the thickness direction of the substrate.

According to the display device and the method of fabricating the same according to the embodiments, by forming a semiconductor layer of the light emitting element on a semiconductor pattern, the strain of the semiconductor layer may be relieved, and the lattice constant may increase, so that defects during growth of the light emitting element of a long wavelength band may be improved.

However, the effects of the disclosure are not limited to the aforementioned effects, and various other effects are included in the disclosure.

BRIEF DESCRIPTION OF THE DRAWINGS

The above and other aspects and features of the disclosure will become more apparent by describing in detail embodiments thereof with reference to the attached drawings, in which:

FIG. 1 is a plan view of a display device according to an embodiment;

FIG. 3 is an enlarged plan view illustrating another embodiment of a display area of FIG. 1;

FIG. 6 is a flowchart illustrating a method of fabricating a base substrate and a double semiconductor layer of a display device according to an embodiment;

FIG. 7 is a flowchart showing a method of fabricating a display device according to an embodiment;

FIGS. 8 to 22 are schematic cross-sectional views sequentially illustrating a fabricating process of a display device according to an embodiment;

FIG. 24 is a schematic cross-sectional view taken along line E1-E1' of FIG. 23;

FIG. 25 is a schematic cross-sectional view taken along line E2-E2' of FIG. 23;

FIG. 27 is a flowchart illustrating a method of fabricating a display device according to another embodiment; and FIGS. 28 to 36 are schematic cross-sectional views sequentially illustrating a fabricating process of a display device according to another embodiment.

DETAILED DESCRIPTION OF THE EMBODIMENTS

Figure 2:
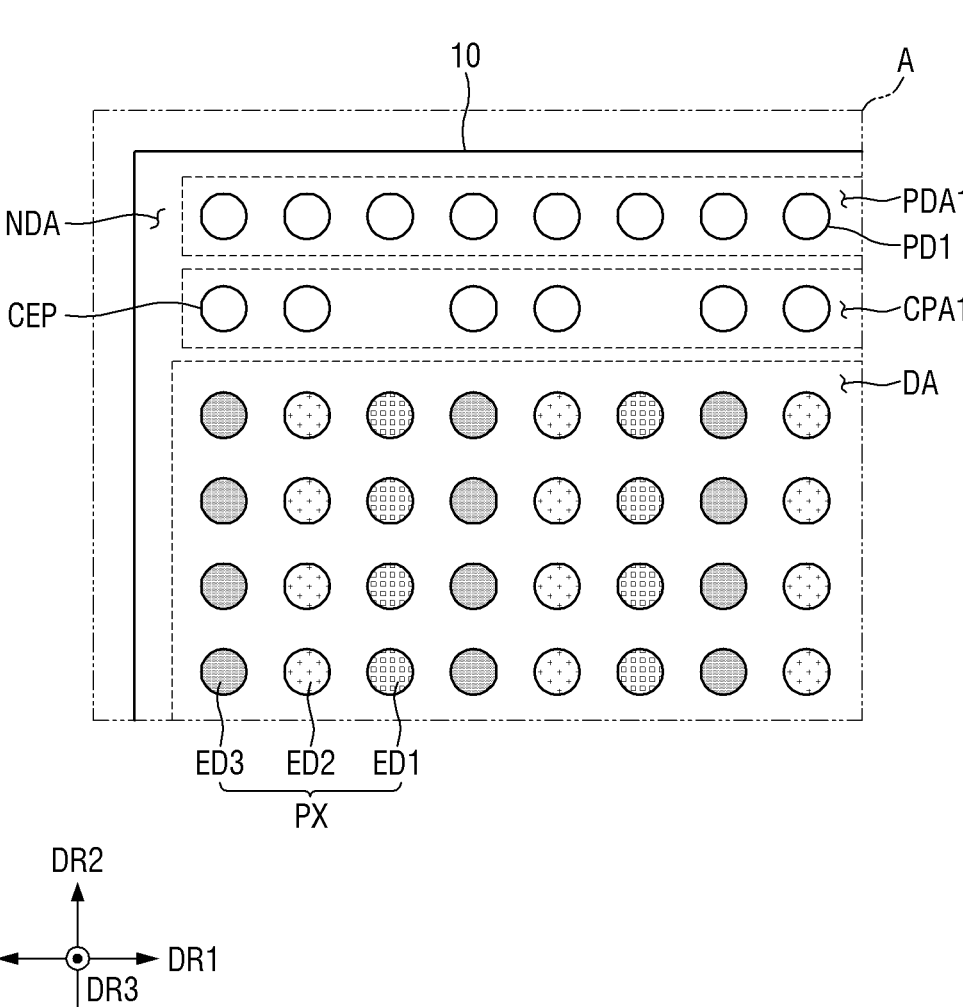
FIG. 2 is an enlarged plan view illustrating an embodiment of region X of FIG. 1.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be more thorough and complete, and will more fully convey the scope of the disclosure to those skilled in the art.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

In the specification and the claims, the phrase "at least one of" is intended to include the meaning of "at least one selected from the group of" for the purpose of its meaning and interpretation. For example, "at least one of A and B" may be understood to mean "A, B, or A and B."

Each of the features of the various embodiments of the disclosure may be combined or combined with each other, in part or in whole, and technically various interlocking and driving are possible. Each embodiment may be implemented independently of each other or may be implemented together in an association.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments will be described in detail with reference to the accompanying drawings.

FIG. 1 is a plan view of a display device according to an embodiment. FIG. 2 is an enlarged plan view illustrating an embodiment of region X of FIG. 1.

In FIGS. 1 to 2, a display device 1_1 is described as being an ultra-small light emitting diode display device (micro or nano light emitting diode display device) including an ultra-small light emitting diode (micro or nano light emitting diode) as a light emitting element ED, but the embodiment of the disclosure is not limited thereto.

In FIGS. 1 and 2, a first direction DR1 may indicate a horizontal direction of a display panel 10, a second direction DR2 may indicate a vertical direction of the display panel 10, and a third direction DR3 may indicate a thickness direction of the display panel 10 or a thickness direction of the semiconductor circuit substrate 100. "left", "right", "upper" and "lower" may indicate directions when the display panel 10 is viewed from above. For example, "right side" may indicate a side of the first direction DR1, "left side" may indicate another side of the first direction DR1, "upper side" may indicate a side of the second direction DR2, and "lower side" may indicate another side of the second direction DR2. Further, "upper portion" may indicate a side of the third direction DR3, and "lower portion" may indicate another side of the third direction DR3.

The display device 1_1 according to an embodiment may include a display panel 10 including a display area DA and a non-display area NDA.

The display panel 10 may have a quadrilateral planar shape having long sides in the first direction DR1 and short sides in the second direction DR2. However, the planar shape of the display panel 10 is not limited thereto, and may have a polygonal shape other than a quadrilateral shape, a circular shape, an elliptical shape, or an atypical shape.

The display area DA may be an area where an image is displayed, and the non-display area NDA may be an area where an image is not displayed. The non-display area NDA may be disposed adjacent to the periphery of display area DA. The non-display areas NDA may form a bezel of the display panel 10. Wires or circuit drivers included in the display panel 10 may be disposed in the non-display areas NDA, or external devices may be mounted thereon.

The display area DA of the display panel 10 may include multiple pixels PX. Each of the pixels PX may include multiple light emitting elements ED. Each of the pixels PX may include one or more light emitting elements ED to display a specific color. The pixel PX may include multiple light emitting elements ED (ED1, ED2, and ED3), and the pixel PX may be defined as a minimum light emitting unit capable of displaying white light.

For example, the first light emitting element ED1 may emit light of a first color, the second light emitting element ED2 may emit light of a second color, and the third light emitting element ED3 may emit light of a third color. For example, the first color may be blue, the second color may be green, and the third color may be red. For example, the main peak wavelength of the first color light may be positioned at approximately 370 nm to approximately 460 nm, the main peak wavelength of the second color light may be positioned approximately 480 nm to approximately 560 nm, the main peak wavelength of the third color light may be positioned between approximately 600 nm to approximately 750 nm, but the disclosure is not limited thereto. For example, each of the light emitting elements ED may emit light of the same color, and any one of the light emitting elements ED may emit yellow light. A pixel PX may include three light emitting elements ED1, ED2, and ED3, but is not limited thereto.

Each of the light emitting elements ED may have a circular shape in a plan view. However, the disclosure is not limited thereto, and the light emitting element ED may have a polygonal shape such as a quadrilateral shape or a pentagonal shape, an elliptical shape, or an atypical shape other than a circular shape.

The light emitting elements ED1, ED2, and ED3 may be disposed to be spaced apart from each other in the first direction DR1 and the second direction DR2. The first light emitting element ED1, the second light emitting element ED2, and the third light emitting element ED3 may be alternately arranged in the first direction DR1, and each of the first light emitting elements ED1, second light emitting elements ED2, and third light emitting elements ED3 may be repeatedly disposed in the second direction DR2. The first light emitting element ED1, the second light emitting element ED2, and the third light emitting element ED3 may be sequentially disposed in the first direction DR1, and this arrangement may be repeated.

The area of the first light emitting element ED1, the area of the second light emitting element ED2, and the area of the third light emitting element ED3 may be substantially the same, but is not limited thereto.

Each of the light emitting elements ED may be electrically connected to a pixel electrode AE of the semiconductor circuit substrate 100 in FIG. 4 through a connection electrode BE in FIG. 4, which will be described later. Each of the light emitting elements ED may be electrically connected to a common electrode layer CEL of a display substrate 200 of FIG. 4.

The non-display area NDA of the display panel 10 may include a first common electrode area CPA1, a second common electrode area CPA2, a first pad area PDA1, and a second pad area PDA2.

The first common electrode area CPA1 may be disposed between the first pad area PDA1 and the display area DA. The second common electrode area CPA2 may be disposed between the second pad area PDA2 and the display area DA. Each of the first common electrode area CPA1 and the second common electrode area CPA2 may include common electrode connection portions CEP. The common electrode connection portions CEP may be spaced apart from each other in the first direction DR1 in the common electrode areas CPA1 and CPA2, but the disclosure is not limited thereto.

The common electrode connection portions CEP may be disposed on the semiconductor circuit substrate 100 to receive a common voltage from a pixel circuit part PXC. In the common electrode areas CPA1 and CPA2, the common electrode connection portion CEP may be electrically connected to the common electrode layer CEL.

The first pad area PDA1 may be disposed on the upper side of the display panel 10. The first pad portion PDA1 may include first pads PD1 electrically connected to a circuit board (not illustrated). The second pad area PDA2 may be disposed on the lower side of the display panel 10. The second pad area PDA2 may include second pads to be electrically connected to the circuit board. The second pad area PDA2 may be omitted.

The first pads PD1 may be electrically connected to the circuit board. The first pads PD1 may be arranged to be spaced apart from each other in the first direction DR1 in the first pad area PDA1. The disposition of the first pads PD1 may be designed according to the number of light emitting elements ED disposed in the display area DA and the disposition of wires electrically connected thereto. The disposition of different pads may be variously modified according to the disposition of the light emitting elements ED and the disposition of wires electrically connected thereto.

FIG. 3 is an enlarged plan view illustrating another embodiment of a display area of FIG. 1.

In FIG. 3, a pixel PX may include a first light emitting element ED1, a second light emitting element ED2, and a third light emitting element ED3. The second light emitting element ED2 may include multiple first sub light emitting elements ED2_1 and ED2_2, and the third light emitting element ED3 may include multiple second sub light emitting elements ED3_1 and ED3_2.

The light emitting elements ED1, ED2, and ED3 may be disposed to be spaced apart from each other in the first direction DR1, the second direction DR2, and a diagonal direction. The second light emitting element ED2 and the third light emitting element ED3 may be disposed to be spaced apart from each other in the first direction DR1, the second direction DR2, and a diagonal direction with respect to the first light emitting element ED1. The first sub light emitting elements ED2_1 and ED2_2 of the second light emitting element ED2 may be disposed on a side of (or around) the first light emitting element ED1. The second sub light emitting elements ED3_1 and ED3_2 of the third light emitting element ED3 may be disposed around the second light emitting element ED2.

For example, in a direction, the second sub light emitting element ED3_1 of the third light emitting element ED3, the first sub light emitting element ED2_1 of the second light emitting element ED2, the first light emitting element ED1, the first sub light emitting element ED2_2 of the second light emitting element ED2, and the second sub light emitting element ED3_2 of the third light emitting element ED3 may be sequentially disposed.

An area of the first light emitting element ED1 may be greater than an area of one of the second light emitting element ED2 and an area of one of the third light emitting element ED3. The area of the second light emitting element ED2 may be the same as or different from the area of the third light emitting element ED3.

An area of the light emitting element may correspond to a width of the light emitting element in one direction. Accordingly, a first width W1 of the first light emitting element ED1 may be greater than a second width W2 of the second light emitting element ED2 and a third width W3 of the third light emitting element ED3. The second width W2 of the second light emitting element ED2 may be the same as or different from the third width W3 of the third light emitting element ED3. The first width W1 of the first light emitting element ED1 may be twice the second width W2 of the second light emitting element ED2 or the third width W3 of the third light emitting element ED3, but is not limited thereto.

Figure 4:
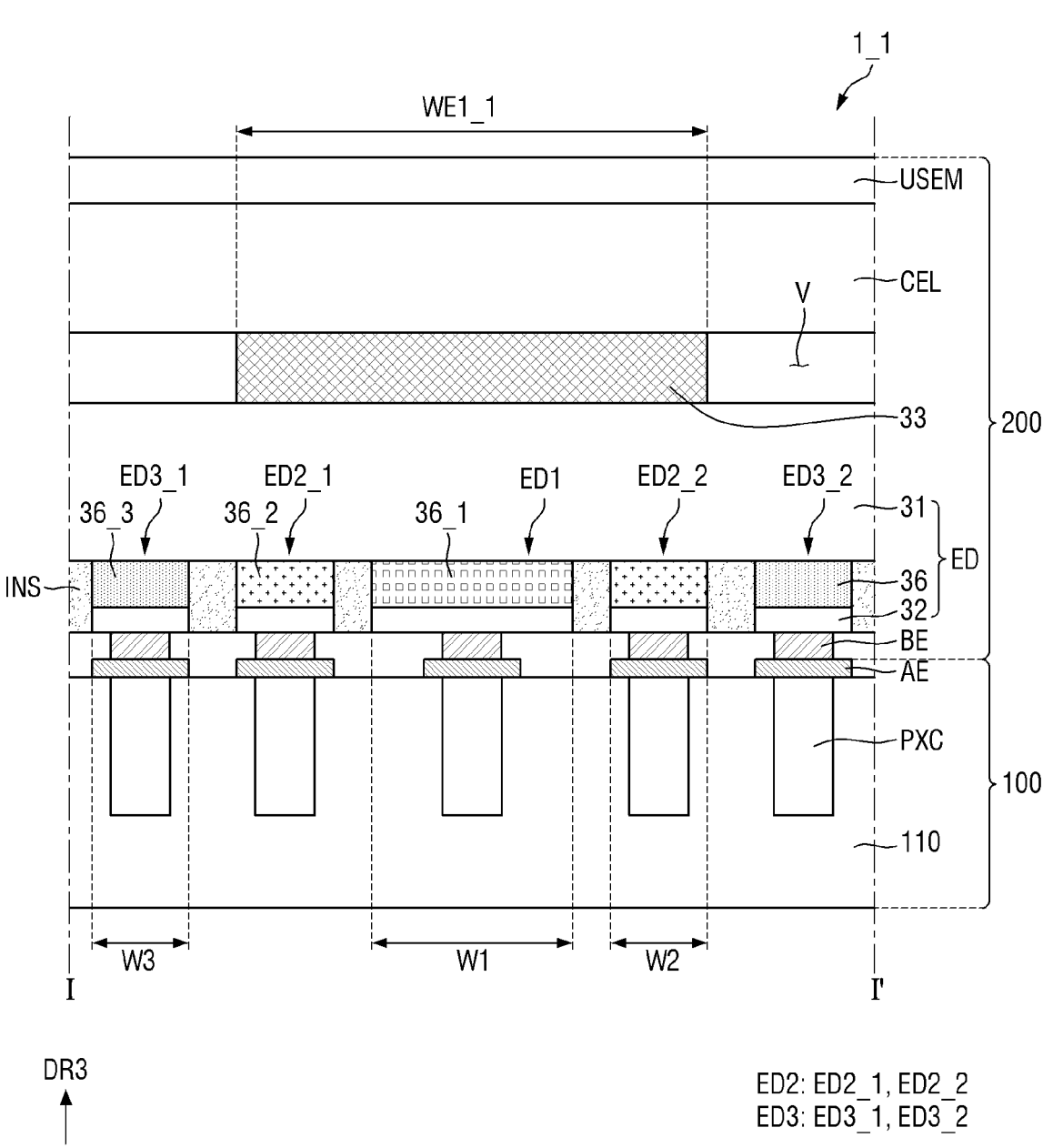
FIG. 4 is a schematic cross-sectional view taken along line I-I' of FIG. 3 according to an embodiment.
Figure 5:
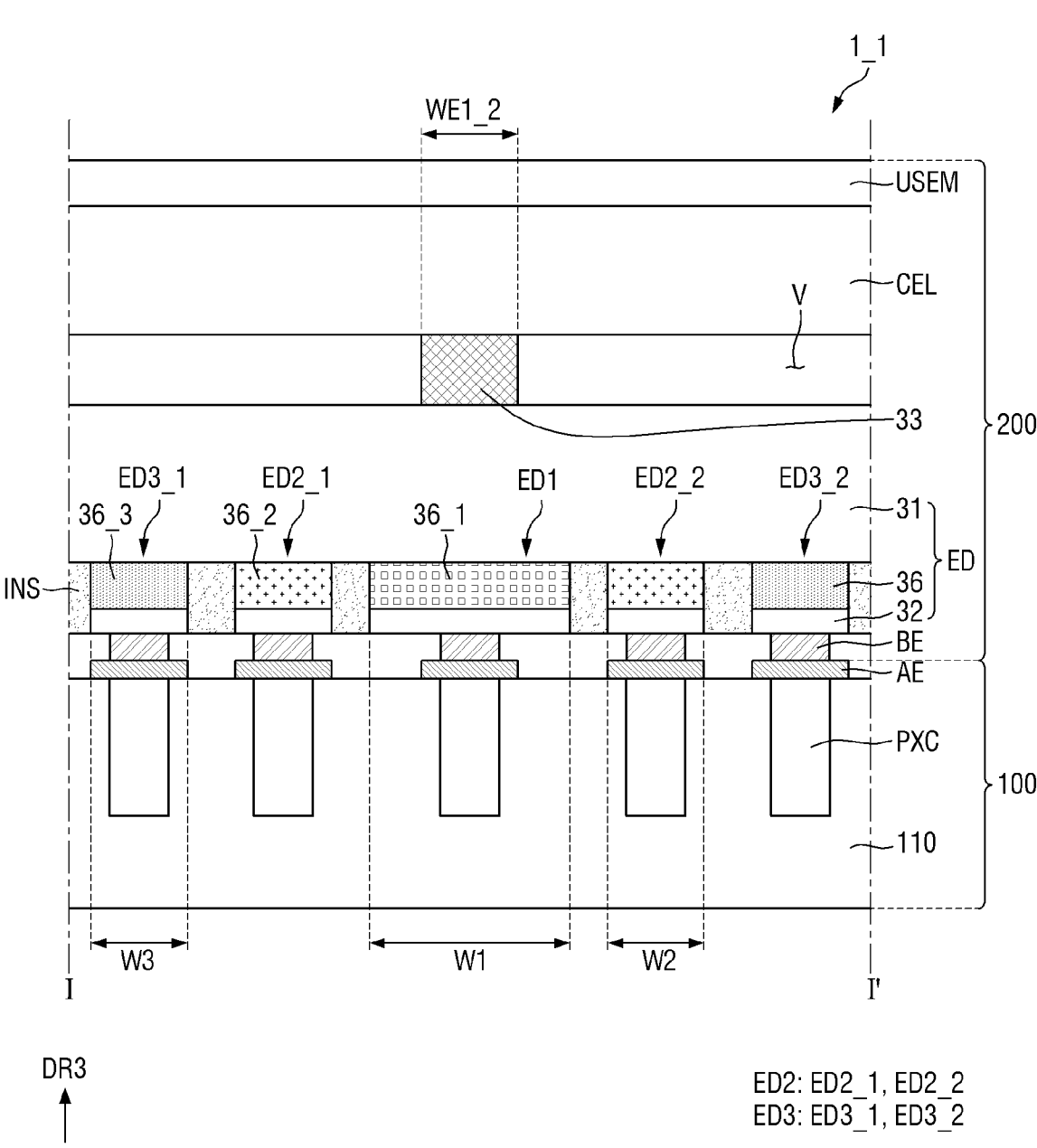
FIG. 5 is a schematic cross-sectional view taken along line I-I' of FIG. 3 according to another embodiment.

FIG. 4 is a schematic cross-sectional view taken along line I-I' of FIG. 3 according to an embodiment. FIG. 5 is a schematic cross-sectional view taken along line I-I' of FIG. 3 according to another embodiment.

Referring to FIG. 4, the display device 1_1 according to an embodiment may include a semiconductor circuit substrate 100 and a display substrate 200.

The semiconductor circuit substrate 100 may include a first substrate 110, multiple pixel circuit parts PXC, and multiple pixel electrodes AE. The display substrate 200 may include light emitting elements ED, an insulating layer INS, a semiconductor pattern 33, a void V, a common electrode layer CEL, an undoped semiconductor layer USEM, and connection electrodes BE. A space may be formed between the semiconductor circuit substrate 100 and the display substrate 200 of the display device 1_1. The space may be formed of a vacuum or may be formed of a separate filler.

The first substrate 110 may be a silicon wafer substrate. The first substrate 110 may be made of monocrystalline silicon.

Each of the pixel circuit parts PXC may be disposed on the first substrate 110. Each of the pixel circuit parts PXC may include a complementary metal-oxide semiconductor (CMOS) circuit formed using a semiconductor process. Each of the pixel circuit parts PXC may include at least one transistor formed by the semiconductor process. Further, each of the pixel circuit parts PXC may include at least one capacitor formed by the semiconductor process.

The pixel circuit parts PXC may be disposed in the display area DA. Among the pixel circuit parts PXC, each of the pixel circuit parts PXC disposed in the display area DA may be electrically connected to a pixel electrode AE corresponding thereto. For example, the pixel circuit parts PXC and the pixel electrodes AE may be electrically connected in a one-to-one correspondence. Each of the pixel circuit parts PXC may apply an anode voltage to the pixel electrode AE.

The pixel electrodes AE may be disposed in the display area DA, and each of them may be disposed on the pixel circuit part PXC corresponding thereto. Each of the pixel electrodes AE may be an exposed electrode that is formed integrally with the pixel circuit part PXC and exposed from the pixel circuit part PXC. For example, each of the pixel electrodes AE may protrude from the top surface of the pixel circuit part PXC. Each of the pixel electrodes AE may be supplied with an anode voltage from the pixel circuit part PXC. The pixel electrode AE may include a metal material such as aluminum (Al).

Among the pixel circuit parts PXC, each of the pixel circuit parts PXC disposed in the non-display area NDA in FIG. 2 may be electrically connected to the corresponding common electrode connection portion CEP in FIG. 2. Each of the pixel circuit parts PXC may apply a cathode voltage to the common electrode connection portion CEP. For example, the common electrode connection portion CEP may receive a cathode voltage from the pixel circuit part PXC. The common electrode connection portion CEP may be electrically connected to the common electrode layer CEL of the display substrate 200. The cathode voltage provided to the common electrode layer CEL through the common electrode connection portion CEP may be provided to a first semiconductor layer 31 of the light emitting element ED through the semiconductor pattern 33.

The display substrate 200 may include the insulating layer INS, the light emitting elements ED, the semiconductor pattern 33, the void V, the common electrode layer CEL, and the undoped semiconductor layer USEM, and may be disposed on the semiconductor circuit substrate 100.

The light emitting elements ED may be disposed to correspond to the pixel electrodes AE of the semiconductor circuit substrate 100. The light emitting element ED may be a light emitting diode. For example, the light emitting element ED may be an inorganic light emitting diode that has a nanometer or micrometer size, and is made of an inorganic material.

The light emitting element ED according to an embodiment may have a shape elongated in a direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped and a hexagonal prism, or may have various shapes such as a shape elongated in a direction and having a side surface partially inclined. For example, each of the light emitting elements ED may have a shape extending in the third direction DR3 (i.e., the thickness direction of the first substrate 110). The lengths of the first to third light emitting elements ED1, ED2, and ED3 in the third direction DR3 may be longer or may also be shorter than a length in the horizontal direction.

The light emitting element ED may include a semiconductor layer doped with any conductivity type (e.g., p-type or n-type) dopant. The semiconductor layer may emit light of a specific wavelength band by receiving an electrical signal applied from an external power source. The light emitting element ED may include a first semiconductor layer 31, a second semiconductor layer 32, and an active layer 36.

The first semiconductor layer 31 may be an n-type semiconductor. The first semiconductor layer 31 may include a semiconductor material having a chemical formula of $Al_xGa_yIn_{1-x-y}N$ ($0 \le x \le 1$, $0 \le y \le 1$, $0 \le x+y \le 1$). For example, the first semiconductor layer 31 may include any one or more of AlGaInN, GaN, AlGaN, InGaN, AlN, and InN doped with an n-type dopant. The n-type dopant doped into the first semiconductor layer 31 may be Si, Ge, Sn, Se, or the like.

The second semiconductor layer 32 may be disposed on the first semiconductor layer 31 with the active layer 36 interposed therebetween. The second semiconductor layer 32 may be a p-type semiconductor, and the second semiconductor layer 32 may include a semiconductor material having a chemical formula of $Al_xGa_yIn_{1-x-y}N$ ($0 \le x \le 1$, $0 \le y \le 1$, $0x+y \le 1$). For example, the second semiconductor layer 32 may include any one or more of AlGaInN, GaN, AlGaN, InGaN, AlN, and InN doped with a p-type dopant. The p-type dopant doped into the second semiconductor layer 32 may be Mg, Zn, Ca, Ba, or the like.

Although it is illustrated in the drawing that each of the first semiconductor layer 31 and the second semiconductor layer 32 are configured as one layer, the disclosure is not limited thereto. Depending on the material of the active layer 36, the first semiconductor layer 31 and the second semiconductor layer 32 may further include a larger number of layers, such as a cladding layer or a tensile strain barrier reducing (TSBR) layer. For example, the light emitting element ED may further include another semiconductor layer disposed between the first semiconductor layer 31 and the active layer 36 or between the second semiconductor layer 32 and the active layer 36. The semiconductor layer disposed between the first semiconductor layer 31 and the active layer 36 may include one or more of AlGaInN, GaN, AlGaN, InGaN, AlN, InN, and SLs doped with an n-type dopant, and the semiconductor layer disposed between the second semiconductor layer 32 and the active layer 36 may include one or more of AlGaInN, GaN, AlGaN, InGaN, AlN, and InN doped with a p-type dopant.

The active layer 36 may be disposed between the first semiconductor layer 31 and the second semiconductor layer 32. The active layer 36 may include a material having a single or multiple quantum well structure. In case that the active layer 36 includes a material having a multiple quantum well structure, the active layer 36 may have a structure in which multiple well layers and barrier layers are alternately laminated. The well layer may be formed of InGaN, and the barrier layer may be formed of GaN or AlGaN, but the disclosure is not limited thereto. For example, the active layer 36 may have a structure in which semiconductor materials having a large band gap energy and semiconductor materials having a small band gap energy are alternately stacked each other, and may include group III to V semiconductor materials depending on the wavelength band of the emitted light. The active layer 36 may emit light by coupling of electron-hole pairs in response to an electrical signal applied through the first semiconductor layer 31 and the second semiconductor layer 32.

The light emitting elements ED of the display device 1_1 may include different active layers 36 to emit lights of different colors. For example, the first light emitting element ED1 may include a first active layer 36_1 to emit blue light of a first color, the second light emitting element ED2 may include a second active layer 36_2 to emit green light of a second color, and the third light emitting element ED3 may include a third active layer 36_3 to emit red light of a third color. For a concentration of a dopant doped in the first semiconductor layer 31, the active layer 36, and the second semiconductor layer 32 of each of the first to third light emitting elements ED1, ED2, and ED3, or in the chemical formula of $Al_xGa_yIn_{1-x-y}N$ ($0 \le x \le 1$, $0 \le y \le 1$, $0x+y \le 1$), the 'x' and 'y' values may be different from each other. The first to third light emitting elements ED1, ED2, and ED3 may have substantially the same structure and material, but may emit light of different colors due to different component ratios of the semiconductor layers.

For example, in case that the active layers 36_1, 36_2, and 36_3 include InGaN, each layer may emit light of different colors according to the content of indium (In). For example, as the content of indium (In) increases, the wavelength band of the light emitted by the active layer may move to the red wavelength band, and as the content of indium (In) decreases, the wavelength band of the light emitted by the active layer may move to the blue wavelength band. Accordingly, the content of indium (In) in the third active layer 36_3 may be higher than the content of indium (In) in each of the first active layer 36_1 and the second active layer 36_2. The content of indium (In) in the second active layer 36_2 may be higher than the content of indium (In) in the first active layer 36_1. For example, the content of indium (In) in the first active layer 36_1 may be approximately 10% to approximately 20%, the content of indium (In) in the second active layer 36_2 may be approximately 20% to approximately 30%, and the content of indium (In) in the third active layer 36_3 may be approximately 30% to approximately 45%. For example, by adjusting the content of indium (In) in the active layer 36, the light emitting elements ED may emit light of different colors.

As the indium (In) content of the active layers 36_1, 36_2, and 36_3 increases, the lattice constant inside the active layers 36_1, 36_2, and 36_3 may be larger. In the disclosure, the lattice constant may be a constant for defining the arrangement of atoms constituting the crystal structure of the material (InGaN) of the active layers 36_1, 36_2, and 36_3 repeatedly arranged with regularity in a three-dimensional space, and may be expressed as lengths of sides (e.g., x-axis length: a, y-axis length: b, and z-axis length: c) of the unit cell, which is a minimum repeating unit constituting the lattice. Since the content of indium (In) increases in the order of the first active layer 36_1, the second active layer 36_2, and the third active layer 36_3, the lattice constant of the third active layer 36_3 may be the largest, the lattice constant of the second active layer 36_2 may be the next largest, and the lattice constant of the first active layer 36_1 may be the smallest.

The higher the indium (In) content of the active layers 36_1, 36_2, and 36_3, the greater the lattice constant of the active layers 36_1, 36_2, and 36_3, which means that the separation distance between atoms of InGaN in each of the active layers 36_1, 36_2, and 36_3 may be large. In the case of the active layers 36_1, 36_2, and 36_3 grown in the third direction DR3 from the first semiconductor layer 31, in case that a and b values of lattice constants of an active layer are significantly larger than the lattice constants a and b of the material of the first semiconductor layer 31 disposed below, internal defects may be created in the active layers 36_1, 36_2, and 36_3 in the process of growing the active layers 36_1, 36_2, and 36_3. In an embodiment, a lattice constant of each of the active layers 36_1, 36_2, and 36_3 may be greater than a lattice constant of the first semiconductor layer 31.

As described above, since the lattice constant of the third active layer 36_3 is the largest, the lattice constant of the second active layer 36_2 is the next largest, and the lattice constant of the first active layer 36_1 is the smallest, the possibility that an internal defect in the third active layer 36_3 will occur may be especially high.

Since the common electrode layer CEL including the same material as the first semiconductor layer 31 is grown on the second substrate 210 having a lattice constant different from the common electrode layer CEL, the common electrode layer CEL may have internal defects due to strain. In an embodiment, in case that the third active layer 36_3 having a high lattice constant is formed on the common electrode layer CEL having internal defects, internal defects of the third active layer 36_3 may occur.

The display device according to an embodiment, as will be described later with reference to FIG. 8, the undoped semiconductor layer USEM and the common electrode layer CEL may be formed on the second substrate 210, and a semiconductor pattern layer 330 having a lattice constant greater than a lattice constant of the common electrode layer CEL may be formed on the common electrode layer CEL. Thereafter, the first semiconductor material layer 310 including the same material as the common electrode layer CEL may be formed. Accordingly, the lattice constant of the first semiconductor layer 31 that is a result of the etching of the first semiconductor material layer 310 may be increased. A surface of the first semiconductor layer 31 in contact with each active layer 36 may have less stress than the common electrode layer CEL.

The reason the lattice constant of the first semiconductor layer 31 increases by the semiconductor pattern 33, and the reason internal defects decreases by strain may be as follows. During the bonding process between the semiconductor pattern layer 330 and the first semiconductor material layer 310, atoms constituting the material of the semiconductor pattern layer 330 and atoms constituting the material of the first semiconductor material layer 310 may be bonded. The difference between the lattice constant (here, a or b) of the material of the semiconductor pattern layer 330 and the lattice constant (a or b) of the material of the first semiconductor material layer 310 may decrease as the semiconductor pattern layer 330 and the first semiconductor material layer 310 are bonded to each other. Accordingly, since the first semiconductor material layer 310 grows on the semiconductor pattern layer 330 having a reduced lattice constant difference, internal defects due to strain may be minimized.

Accordingly, the light emitting elements ED1, ED2, and ED3 may be grown on a surface of the first semiconductor layer 31, and in this process, internal defects of the third active layer 36_3 of the third light emitting element ED3 may be minimized. The first semiconductor layer 31 may be in contact (e.g., directly in contact) with the active layers 36_1, 36_2, and 36_3 of the light emitting elements ED1, ED2, and ED3.

The insulating layer INS may be disposed between the pixel electrode AE of the semiconductor circuit substrate 100 and the first semiconductor layer 31. The insulating layer INS may not overlap the pixel electrode AE in the third direction DR3 and may be in contact (e.g., directly in contact) with a surface of the first semiconductor layer 31. As will be described later with reference to FIG. 10, the insulating layer INS may include multiple holes H1, H2, and H3 exposing a portion of the first semiconductor layer 31. The holes H1, H2, and H3 may provide a space in which the light emitting element ED of each pixel may be formed, and may define an emission area thereof.

The insulating layer INS may be disposed to surround each of the light emitting elements ED, and may be in contact with side surfaces of the light emitting elements ED. The insulating layer INS may protect the light emitting element ED from foreign matters, for example, dust or air, and may insulate the light emitting element ED from other layers. The insulating layer INS may include an inorganic insulating material such as silicon nitride ($SiN_x$), silicon oxide ($SiO_x$), silicon oxynitride ($SiO_xN_y$), aluminum oxide ($AlO_y$), aluminum nitride ($AlN_x$), and the like.

The semiconductor pattern 33 and the void V may be disposed on the first semiconductor layer 31, and may be disposed between the first semiconductor layer 31 and the common electrode layer CEL, which are spaced apart from each other in the third direction DR3. Each of the semiconductor pattern 33 and the void V may overlap the first semiconductor layer 31 in the third direction DR3.

The semiconductor pattern 33 may include a material having a lattice constant greater than a lattice constant of the first semiconductor layer 31 and the common electrode layer CEL. In an embodiment, the semiconductor pattern 33 may be an n-type semiconductor. For example, the semiconductor pattern 33 may include any one or more of AlGaInN, AlGaN, InGaN, AlN, and InN that are doped with n-type dopant, and in particular, the semiconductor pattern 33 may be InGaN doped with n-type dopant. Although not limited thereto, the content of indium (In) in the semiconductor pattern 33 may be about 1% to about 40%. In another embodiment, the semiconductor pattern 33 may include an undoped semiconductor and may include a material not doped with n-type or p-type. For example, the semiconductor pattern 33 may include at least one of InAlGaN, AlGaN, InGaN, AlN, and InN that are undoped, and in particular, the semiconductor pattern 33 may be undoped InGaN. Hereinafter, a case in which the semiconductor pattern 33 is an n-type semiconductor will be described.

The void V may be disposed between the first semiconductor layer 31, the semiconductor pattern 33, and the common electrode layer CEL. The void V may be formed by removing a portion of the semiconductor pattern 33. For example, the void V may be in contact with each of a surface of the first semiconductor layer 31, side surfaces of the semiconductor pattern 33, and a surface of the common electrode layer CEL by removing the side surface of the semiconductor pattern 33.

In the embodiment, as described above, the lattice constant of a surface of the first semiconductor layer 31 in contact with the active layer 36 may increase by the semiconductor pattern 33, and stress may be relieved. However, since the interface in which materials having different lattice constants are in contact with each other has a greater strain than a surface that is relatively far from the interface, it is preferable to minimize the interface area in which the semiconductor pattern 33 and the first semiconductor layer 31 are in contact with each other. For example, as illustrated in FIG. 4, by removing a portion of the semiconductor pattern layer 33 to form the semiconductor pattern 33 and the void V, a width WE1_1 of the semiconductor pattern 33 may be smaller than the width of the first semiconductor layer 31. Accordingly, an interface area in which two materials having different lattice constants are in contact with each other may be minimized, and strain of the first semiconductor layer 31 may be minimized.

The semiconductor pattern 33 may overlap the first light emitting element ED1 and the second light emitting element ED2 in the third direction DR3, but may not overlap the third light emitting element ED3 in the third direction DR3. Since the lattice constant of the third active layer 36_3 is the largest, the possibility that internal defects of the third active layer 36_3 will occur may be the highest. To prevent this, the third light emitting element ED3 may be disposed so as not to overlap the interface area in which the semiconductor pattern 33 and the first semiconductor layer 31 are in contact with each other. For example, by disposing the third light emitting element ED3 so as not to overlap the interface area in which internal defects are relatively likely to occur, internal defects of the third light emitting element ED3 may be minimized.

The width WE1_1 of the semiconductor pattern 33 may be greater than the first to third widths W1, W2 and W3 of the first to third light emitting elements ED1, ED2, and ED3, but is not limited thereto. Referring to FIG. 5, according to an embodiment, the width WE1_2 of the semiconductor pattern 33 may be smaller than the first width W1 of the first light emitting element ED1. As the width of the semiconductor pattern 33 is narrower, the interface area in contact with the first semiconductor layer 31 may be minimized. The width of the semiconductor pattern 33 may be minimized within a range capable of stably separating the first semiconductor layer 31 from the common electrode layer CEL.

The common electrode layer CEL may be disposed on the semiconductor pattern 33. The common electrode layer CEL may be disposed on an entire surface of the display substrate 200 regardless of the light emitting elements ED as one common layer.

The common electrode layer CEL may be an n-type semiconductor including the same material as the material of the first semiconductor layer 31. The common electrode layer CEL may include a semiconductor material having a chemical formula of $Al_xGayIn_{1-x-y}N$ ($0 \leq x \leq 1$, $0 \leq y \leq 1$, $0 \leq x+y \leq 1$). For example, the common electrode layer CEL may include any one or more of n-type doped AlGaInN, GaN, AlGaN, InGaN, AlN, and InN. The common electrode layer CEL may be doped with an n-type dopant, and the n-type dopant may be Si, Ge, Sn, or the like. For example, the common electrode layer CEL may be GaN doped with n-type Si.

The undoped semiconductor layer USEM may include an undoped semiconductor, and may include a material that is not n-type or p-type doped. The undoped semiconductor layer USEM may include at least one of undoped InAlGaN, GaN, AlGaN, InGaN, AlN, or InN, but is not limited thereto. The undoped semiconductor layer USEM may be disposed to reduce a lattice constant difference between the common electrode layer CEL and the second substrate 210 to be described later.

The connection electrode BE may be disposed between the display substrate 200 and the semiconductor circuit substrate 100. The connection electrode BE may be disposed to correspond to the light emitting elements ED and the pixel electrode AE. The connection electrode BE may be disposed on a surface of the second semiconductor layer 32 of the light emitting elements ED. The connection electrode BE may be directly disposed on the pixel electrode AE, and may be electrically connected to the pixel electrode AE to transmit an emission signal applied to the pixel electrode AE to the light emitting element ED. The width of the electrode BE may be smaller than the width of the light emitting element ED, but is not limited thereto. The connection electrode BE may serve as a bonding metal to adhere the pixel electrode AE and the light emitting elements ED to each other in a fabricating process. The connection electrode BE may include a material that may be electrically connected to the pixel electrode AE and the light emitting elements ED. For example, the electrode BE may include at least one of gold (Au), copper (Cu), aluminum (Al), or tin (Sn), or may include a transparent conductive oxide such as indium tin oxide (ITO) or indium zinc oxide (IZO).

The light emitting elements ED may be commonly electrically connected to the common electrode layer CEL through the semiconductor pattern 33, but the second semiconductor layers 32 of the different light emitting elements ED1, ED2, and ED3 may be electrically connected to different pixel circuit parts PXC on the semiconductor circuit substrate 100. For example, one ends of the light emitting elements ED may be electrically connected to different pixel electrodes AE of the semiconductor circuit substrate 100 through the connection electrode BE. The other ends of the light emitting elements ED may be electrically connected to the common electrode connection portion CEP (shown in FIG. 2) of the semiconductor circuit substrate 100 through the first semiconductor layer 31, the semiconductor pattern 33, and the common electrode layer CEL. Each of the different light emitting elements ED1, ED2, and ED3 may have an end electrically connected to each of the pixel circuit parts PXC of the semiconductor circuit substrate 100, and another end electrically connected to the common electrode connection portion CEP of the semiconductor circuit substrate 100 through the common electrode layer CEL. For example, the common electrode layer CEL may serve as a common electrode of the light emitting elements ED.

FIG. 6 is a flowchart illustrating a method of fabricating a base substrate and a double semiconductor layer of a display device according to an embodiment. FIG. 7 is a flowchart showing a method of fabricating a display device according to an embodiment.

Referring to FIG. 6, the method of fabricating a base substrate SUB and a double semiconductor layer 30 of the display device 1_1 according to an embodiment may include preparing a base substrate SUB in which an undoped semiconductor layer USEM is formed on a second substrate 210 and a common electrode layer CEL is formed on the undoped semiconductor layer USEM (step S110); forming a double semiconductor material layer 300 including a semiconductor pattern layer 330 and a first semiconductor material layer 310 on the common electrode layer CEL of the base substrate SUB (step S120); exposing the first semiconductor material layer 310 by forming an insulating layer INS on the first semiconductor material layer 310 and etching a portion of the insulating layer INS (step S130); forming a semiconductor pattern 33 and a first semiconductor layer 31 by etching the semiconductor pattern layer 330 and the first semiconductor material layer 310 by using the insulating layer INS as a mask (step S140); and forming a void V by etching a portion of the semiconductor pattern 33 via photo-electro-chemical etching, and forming the double semiconductor layer 30 including the semiconductor pattern 33, the void V, and the first semiconductor layer 31 (step S150).

Referring to FIG. 7, a method of fabricating the display device 1_1 including the light emitting elements ED by using the double semiconductor layer 30 including the void V, the semiconductor pattern 33, and the first semiconductor layer 31 as a growth substrate will be described.

The method of fabricating the display device 1_1 according to an embodiment may include forming a first hole H1 penetrating the insulating layer INS to expose a portion of the first semiconductor layer 31, forming a first light emitting element ED1 in the first hole H1, and forming a first mask layer ML1 covering the first light emitting element ED1 (step S210); forming a second holes H2 penetrating the insulating layer INS and the first mask layer ML1, forming a second light emitting element ED2 in the second holes H2, and forming a second mask layer ML2 covering the second light emitting element ED2 (step S220); forming a third holes H3 penetrating the insulating layer INS, the first mask layer ML1, and the second mask layer ML2, and forming a third light emitting element ED3 in the third holes H3 (step S230); removing the first mask layer ML1 and second mask layer ML2, and forming connection electrodes BE on the first to third light emitting elements ED1 to ED3 (step S240); and bonding the semiconductor circuit substrate 100 to the base substrate SUB on which the light emitting elements ED1, ED2, and ED3 are formed (step S250).

The method for fabricating the display device 1_1 may include a process of preparing each of the semiconductor circuit substrate 100 and the display substrate 200 and bonding them together. In the fabricating process of the display substrate 200, the base substrate SUB including the undoped semiconductor layer USEM and the common electrode layer CEL, and the double semiconductor layer 30 including the void V, the semiconductor pattern 33, and the first semiconductor layer 31 may be prepared, and a process of forming multiple light emitting elements ED thereon may be performed. The light emitting elements ED may include active layers 36_1, 36_2, and 36_3 having different materials, and may be formed by layers of different materials according to positions.

Hereinafter, the method for fabricating the display device 1_1 will be described in detail with further reference to other drawings.

FIGS. 8 to 22 are schematic cross-sectional views sequentially illustrating a fabricating process of a display device according to an embodiment.

Figure 8:
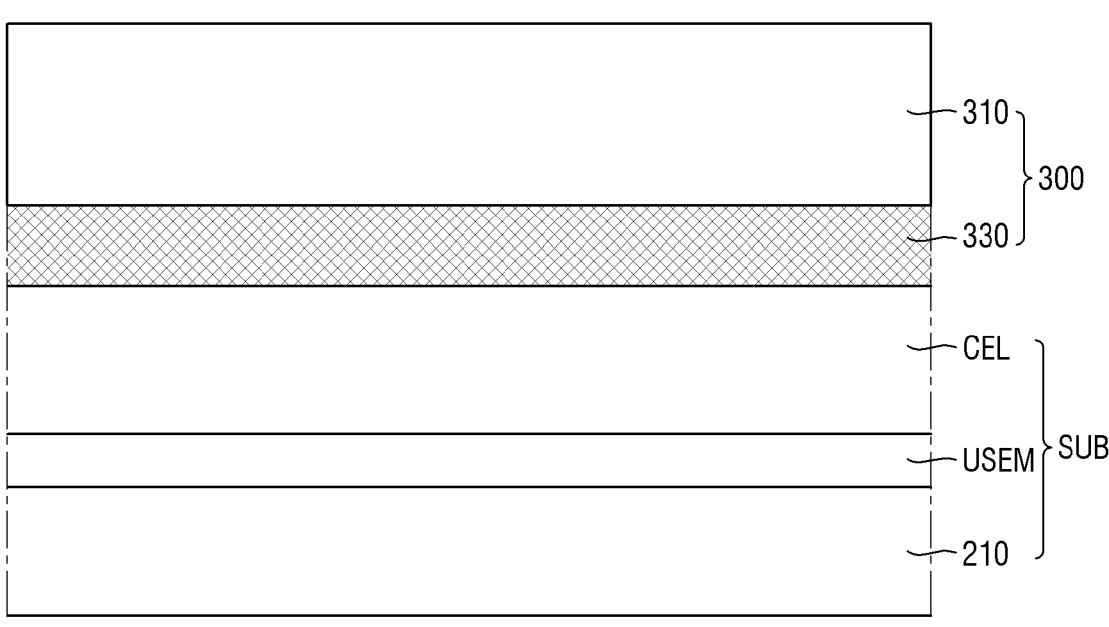

First, referring to FIG. 8, the base substrate SUB may be prepared in which the undoped semiconductor layer USEM is formed on the second substrate 210 and the common electrode layer CEL is formed on the undoped semiconductor layer USEM (step S110). The double semiconductor material layer 300 including the semiconductor pattern layer 330 and the first semiconductor material layer 310 may be formed on the common electrode layer CEL of the base substrate SUB (step S120).

The base substrate SUB may include the second substrate 210, the undoped semiconductor layer USEM disposed on the second substrate 210, and the common electrode layer CEL disposed on the undoped semiconductor layer USEM. The second substrate 210 may be a sapphire substrate ($Al_2O_3$) or a silicon wafer including silicon. However, the disclosure is not limited thereto, and the second substrate 210 may also be a semiconductor substrate such as a GaAs substrate. Hereinafter, a case in which the second substrate 210 is a sapphire substrate will be described as an embodiment.

The undoped semiconductor layer USEM and the common electrode layer CEL disposed on the second substrate 210 may be the same as described above with reference to FIG. 4. The common electrode layer CEL may include an n-type semiconductor, and the undoped semiconductor layer USEM may include an undoped semiconductor, and may include a material that is not n-type or p-type doped. In an embodiment, the common electrode layer CEL may include any one or more of n-type doped AlGaInN, GaN, AlGaN, InGaN, AlN, and InN. The undoped semiconductor layer USEM may include at least one of undoped InAlGaN, GaN, AlGaN, InGaN, AlN, or InN, but is not limited thereto. Although the drawing illustrates that one layer of the undoped semiconductor layer USEM is formed, the disclosure is not limited thereto, and multiple undoped semiconductor layers may be formed. The undoped semiconductor layer USEM may be disposed to reduce a lattice constant difference between the common electrode layer CEL and the second substrate 210.

The double semiconductor material layer 300 may include the semiconductor pattern layer 330 and the first semiconductor material layer 310. The semiconductor pattern layer 330 may be formed on the common electrode layer CEL. The semiconductor pattern layer 330 may include a semiconductor having a lattice constant greater than a lattice constant of the common electrode layer CEL. The semiconductor pattern layer 330 may be an n-type semiconductor or an undoped semiconductor, as described above with reference to FIG. 4. For example, the semiconductor pattern layer 330 may be InGaN doped with n-type. In another embodiment, the semiconductor pattern layer 330 may be undoped InGaN.

The first semiconductor material layer 310 may be formed on the semiconductor pattern layer 330. The first semiconductor material layer 310 and the common electrode layer CEL may include substantially the same material. For example, the first semiconductor material layer 310 may include any one or more of n-type doped AlGaInN, GaN, AlGaN, InGaN, AlN, and InN.

The first semiconductor material layer 310 may have a lattice constant increased by the semiconductor pattern layer 330, and internal defects caused by strain during growth may be minimized. In the process of forming the first semiconductor material layer 310 on the semiconductor pattern layer 330, atoms constituting the material of the semiconductor pattern layer 330 and atoms constituting the material of the first semiconductor material layer 310 may be bonded. Accordingly, since the lattice constant of the first semiconductor material layer 310 may increase, and the first semiconductor material layer 310 grows on the semiconductor pattern layer 330 having a small lattice constant difference, internal defects caused by strain may be minimized.

Accordingly, in the process of growing the light emitting elements ED on the double semiconductor material layer 300 including the semiconductor pattern layer 330 and the first semiconductor material layer 310, internal defects of the light emitting elements ED may be minimized.

The undoped semiconductor layer USEM, the common electrode layer CEL, the semiconductor pattern layer 330, and the first semiconductor material layer 310 may be formed through an epitaxial growth method. The epitaxial growth method may include electron beam deposition, physical vapor deposition (PVD), chemical vapor deposition (CVD), plasma laser deposition (PLD), dual-type thermal evaporation, sputtering, metal organic chemical vapor deposition (MOCVD), or the like. In another embodiment, the undoped semiconductor layer USEM, the common electrode layer CEL, the semiconductor pattern layer 330, and the first semiconductor material layer 310 may be formed by metal organic chemical vapor deposition (MOCVD), but is not limited thereto.

A precursor material for forming multiple semiconductor material layers may be selected to form a target material in a typically selectable range without any limitation. For example, the precursor material may be a metal precursor including an alkyl group such as a methyl group or an ethyl group. Examples of the precursor material may include, but are not limited to, trimethylgallium Ga(CH₃)₃, trimethylaluminum Al(CH₃)₃, and triethyl phosphate (C₂H₅)₃PO₄.

Referring to FIGS. 9 and 10, the insulating layer INS may be formed on the first semiconductor material layer 310, and the first semiconductor material layer 310 may be exposed by etching a portion of the insulating layer INS (step S130). The step of exposing the first semiconductor material layer 310 may include forming multiple photoresist layers PR on the insulating layer INS, and etching a portion on which the photoresist layer PR is not disposed in a direction perpendicular to the top surface of the base substrate SUB.

As illustrated in FIG. 9, the insulating layer INS may be formed on the first semiconductor material layer 310, and the photoresist layers PR disposed to be spaced apart from each other may be formed on the insulating layer INS. The insulating layer INS may be disposed on an entire surface of the first semiconductor material layer 310. The insulating layer INS may include an insulating material such as silicon oxide (SiO$_x$), silicon nitride (SiN$_x$), or silicon oxynitride (SiO$_x$N$_y$). The insulating layer INS may function as a mask in a process for forming the double semiconductor layer 30 as illustrated in FIG. 11. The insulating layer INS may function as a mask in a process for forming the light emitting elements ED as illustrated in FIGS. 13 to 22. The insulating layer INS may be a barrier wall or a pixel defining layer defining the light emitting elements ED.

The photoresist layer PR may be utilized as a mask layer for etching the insulating layer INS.

As illustrated in FIG. 10, a first etching process Etch 1 may be performed by etching the exposed insulating layer INS in which the photoresist layer PR is not disposed, perpendicularly to the top surface of the base substrate SUB, and the photoresist layer PR may be removed. The first etching process Etch 1 may be performed by dry etching, wet etching, reactive ion etching (RIE), inductively coupled plasma reactive ion etching (ICP-RIE), or the like. The dry etching method may be suitable for vertical etching because anisotropic etching may be performed. In the case of using the aforementioned etching technique, it may be possible to use Cl₂ or O₂ as an etchant. However, the disclosure is not limited thereto. The interval and the width of double semiconductor layers 30' may be determined by the first etching process Etch 1.

Referring to FIG. 11, the semiconductor pattern layer 330 and the first semiconductor material layer 310 may be etched by using the insulating layer INS as a mask to form the semiconductor pattern 33 and the first semiconductor layer 31 (step S140).

The insulating layer INS may be utilized as a mask layer for etching the double semiconductor material layer 300. A second etching process Etch 2 may be performed by etching the exposed first semiconductor material layer 310 in which the insulating layer INS is not disposed. The second etching process Etch 2 may be performed by a dry etching process or a wet etching process, and the dry etching process may be selected. Multiple double semiconductor layers 30' disposed to be spaced apart from each other may be formed by the second etching process Etch 2.

Referring to FIG. 12, the void V may be formed by etching a portion of the semiconductor pattern 33 through photo-electro-chemical etching, and the double semiconductor layer 30 including the semiconductor pattern 33, the void V, and the first semiconductor layer 31 may be formed (step S150).

A third etching process Etch 3 may be performed by etching the side surface of the semiconductor pattern 33 to expose the bottom surface of the first semiconductor layer 31 and the top surface of the common electrode layer CEL. The third etching process Etch 3 may be performed by a photo-electro-chemical etching (PEC etching) method. Photo-electro-chemical etching may be an etching process in which wet etching is performed while the surface of a semiconductor material dissolved by an electrolyte is irradiated with ultraviolet light. In photo-electro-chemical etching, isotropic etching may be performed, etching may be performed in all directions, and a semiconductor material may be selectively etched.

For example, the semiconductor pattern 33 may be selectively etched through the third etching process Etch 3. As the semiconductor pattern 33 is selectively etched, the side surface of the semiconductor pattern 33, the bottom surface of the first semiconductor layer 31, and the top surface of the common electrode layer CEL may be exposed, and the void Vin contact (e.g., directly in contact) with the exposed area may be formed.

As the side surface of the semiconductor pattern 33 is exposed, a width of the semiconductor pattern 33 in a direction may become smaller than a width of the first semiconductor layer 31 in a direction. The void V may overlap the first semiconductor layer 31 and the common electrode layer CEL in a direction perpendicular to the base substrate SUB. The double semiconductor layers 30 including the first semiconductor layer 31, the semiconductor pattern 33, and the void V may be formed through the third etching process Etch 3. The double semiconductor layers 30 may be disposed to be spaced apart from each other on the common electrode layer CEL that is disposed on an entire surface of the base substrate 300.

Since the void V may minimize the interface area between the semiconductor pattern 33 and the first semiconductor layer 31, internal defects of the light emitting elements ED1, ED2, and ED3 formed on the double semiconductor layer 30 may be minimized. In case that the semiconductor pattern 33 includes an n-type doped semiconductor, the etching speed of the third etching process Etch 3 may increase.

With reference to FIGS. 13 to 22, the process of fabricating multiple holes H1, H2, and H3 and multiple light emitting elements ED1, ED2, and ED3 formed on a double semiconductor layer 30 will be described. FIGS. 13 to 22 are enlarged schematic cross-sectional views of area A of FIG. 12.

Figure 14:
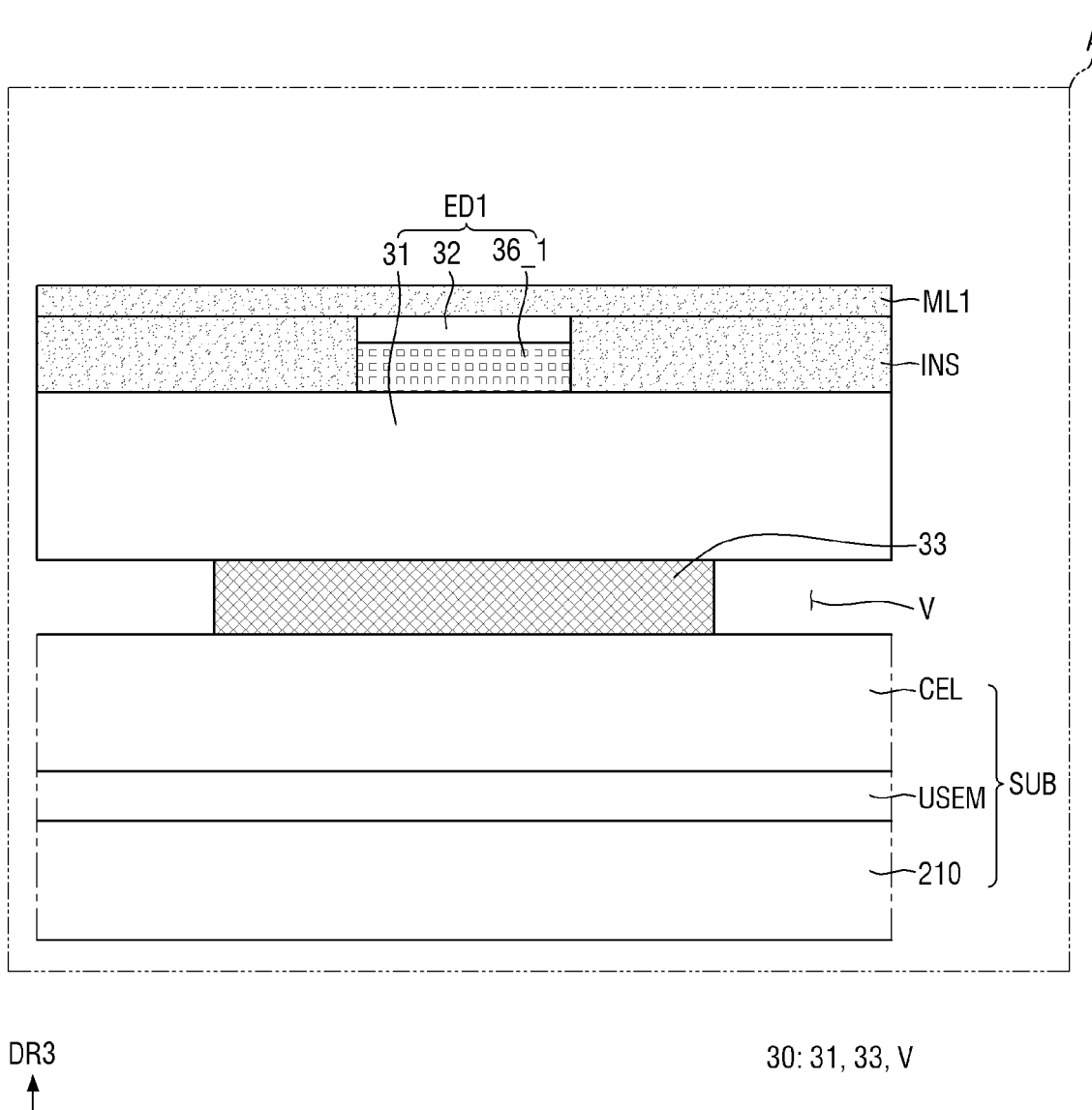

Referring to FIGS. 13 and 14, the first hole H1 penetrating the insulating layer INS to expose the first semiconductor layer 31 may be formed, the first light emitting element ED1 may be formed in the first hole H1, and the first mask layer ML1 covering the first light emitting element ED1 may be formed (step S210).

The insulating layer INS may be etched to form the first holes H1 exposing the first semiconductor layer 31. The process of etching the first holes H1 may be performed through a fourth etching process Etch 4_1. The first holes H1 may be spaced apart from each other on the double semiconductor layers 30. The first light emitting element ED1 may be formed in each of the first holes H1. The interval, width, and the like of the first holes H1 may be determined according to the disposition and size of the first light emitting elements ED1 disposed on the display substrate 200. The insulating layer INS may be a barrier wall or a pixel defining layer for defining the first light emitting elements ED1.

The process of forming the light emitting elements ED may be performed through an epitaxial growth method like the process of forming the undoped semiconductor layer USEM, the common electrode layer CEL, the semiconductor pattern 33, and the first semiconductor layer 31. In case that the top surface of the first semiconductor layer 31 is exposed by the first hole H1, the first active layer 36_1 and the second semiconductor layer 32 may be sequentially grown to form the first light emitting element ED1. In the process, only the first light emitting elements ED1 having the first active layer 36_1 may be formed, and in the subsequent repeated process, the light emitting elements ED2 and ED3 including the second active layer 36_2 or the third active layer 36_3 may be formed.

The first mask layer ML1 covering the first light emitting element ED1 may be formed. The first mask layer ML1 may be formed of an inorganic layer such as a silicon oxide layer (SiO$_2$), an aluminum oxide layer (Al$_2$O$_3$), or a hafnium oxide layer (HfO$_x$), and may include the same material as the above-described insulating layer INS, but the embodiment of the disclosure is not limited thereto. The first mask layer ML1 may be a passivation layer or a barrier layer that protects the first light emitting element ED1. The first mask layer ML1 may be formed on an entire surface of the first light emitting element ED1 and the insulating layer INS, but is not limited thereto. For example, the first mask layer ML1 may be formed in a pattern shape on the first light emitting element ED1 through an additional etching process.

Figure 15:
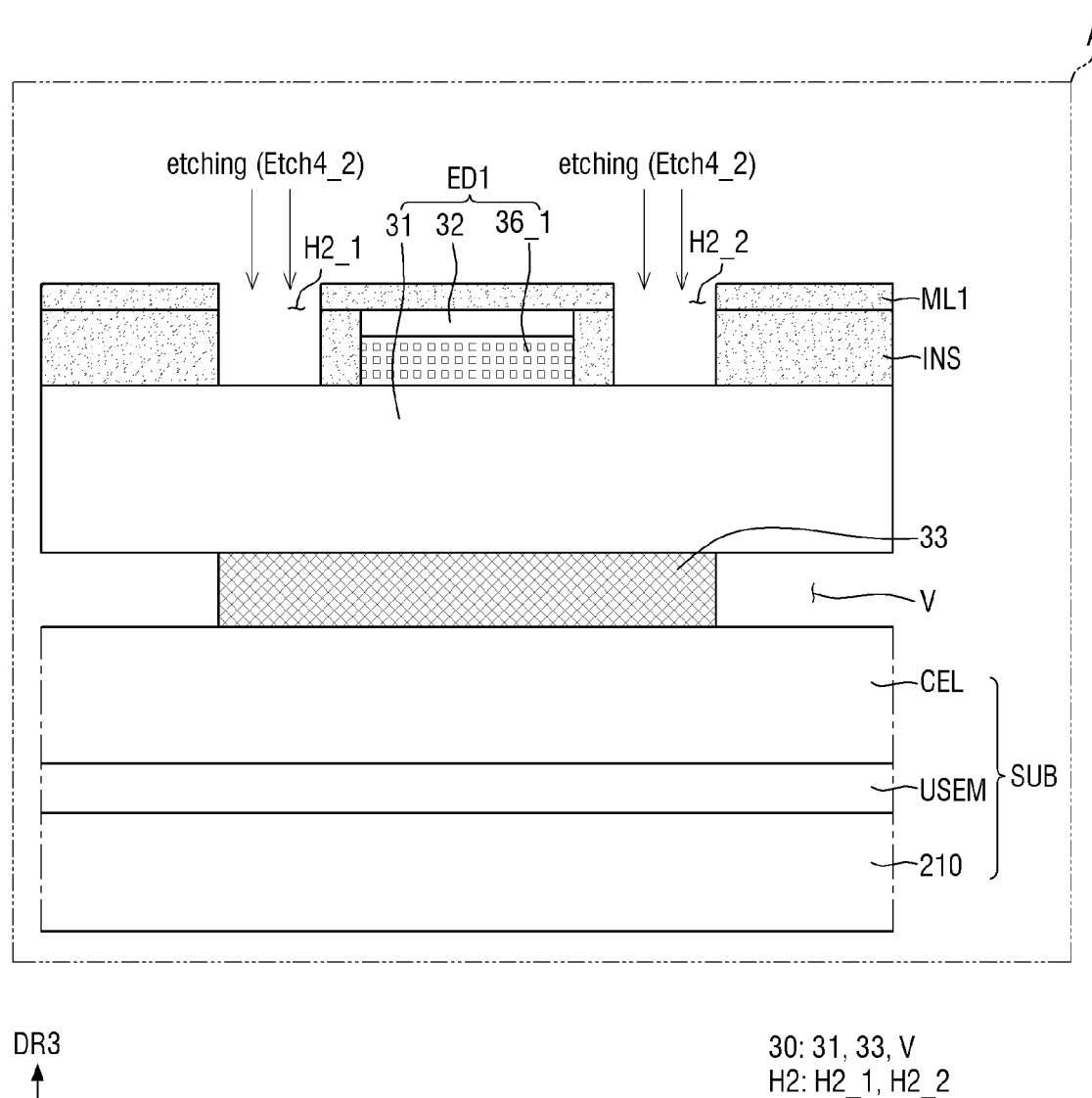
Figure 16:
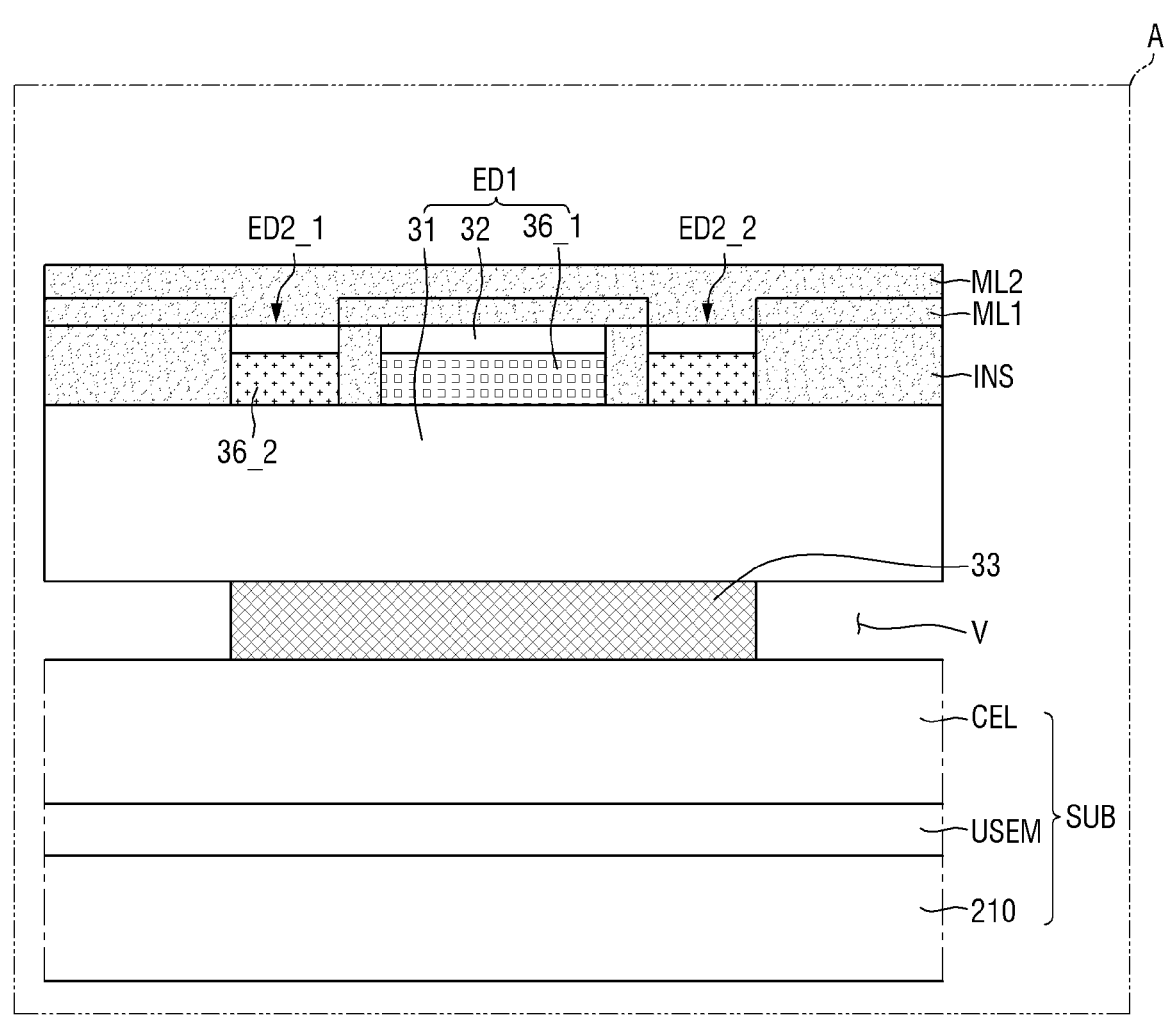

Referring to FIGS. 15 and 16, the second holes H2 penetrating the insulating layer INS and the first mask layer ML1 may be formed, the second light emitting element ED2 may be formed in the second holes H2, and the second mask layer ML2 covering the second light emitting element ED2 may be formed (step S220).

The insulating layer INS and the first mask layer ML1 may be etched to form multiple second holes H2 exposing the first semiconductor layer 31. The process of etching the second holes H2 may be performed through a fourth etching process Etch 4_2. The second holes H2 may be spaced apart from each other on the double semiconductor layers 30. The second light emitting element ED2 may be formed in each of the second holes H2. The interval, width, and the like of the second holes H2 may be determined according to the disposition and size of the second light emitting elements ED2 disposed on the display substrate 200. The insulating layer INS may be a barrier wall or a pixel defining layer for defining the second light emitting elements ED2.

The second light emitting element ED2 may be formed by sequentially growing the second active layer 36_2 and the second semiconductor layer 32 on the first semiconductor layer 31 exposed by the second hole H2.

The process of forming the second light emitting element ED2 may be performed using precursor materials and process conditions different from the process of forming the first light emitting element ED1. The first light emitting element ED1 and the second light emitting element ED2 may include the first active layer 36_1 and the second active layer 36_2, respectively, and as described above, may include different doping concentrations, indium (In) contents, and the like. In the fabricating process of the display device 1_1, the same process of forming the light emitting element ED may be repeated, but process conditions in each process may be partially different.

The second mask layer ML2 covering the second light emitting element ED2 may be formed. The second mask layer ML2 may be formed of an inorganic layer such as a silicon oxide layer (SiO$_2$), an aluminum oxide layer (Al$_2$O$_3$), or a hafnium oxide layer (HfO$_x$), and may include the same material as the above-described insulating layer INS, but the embodiment of the disclosure is not limited thereto. The second mask layer ML2 may be a passivation layer or a barrier layer that protects the second light emitting element ED2. The second mask layer ML2 may be formed on the entire surface of the second light emitting element ED2 and the insulating layer INS, but is not limited thereto.

Figure 17:
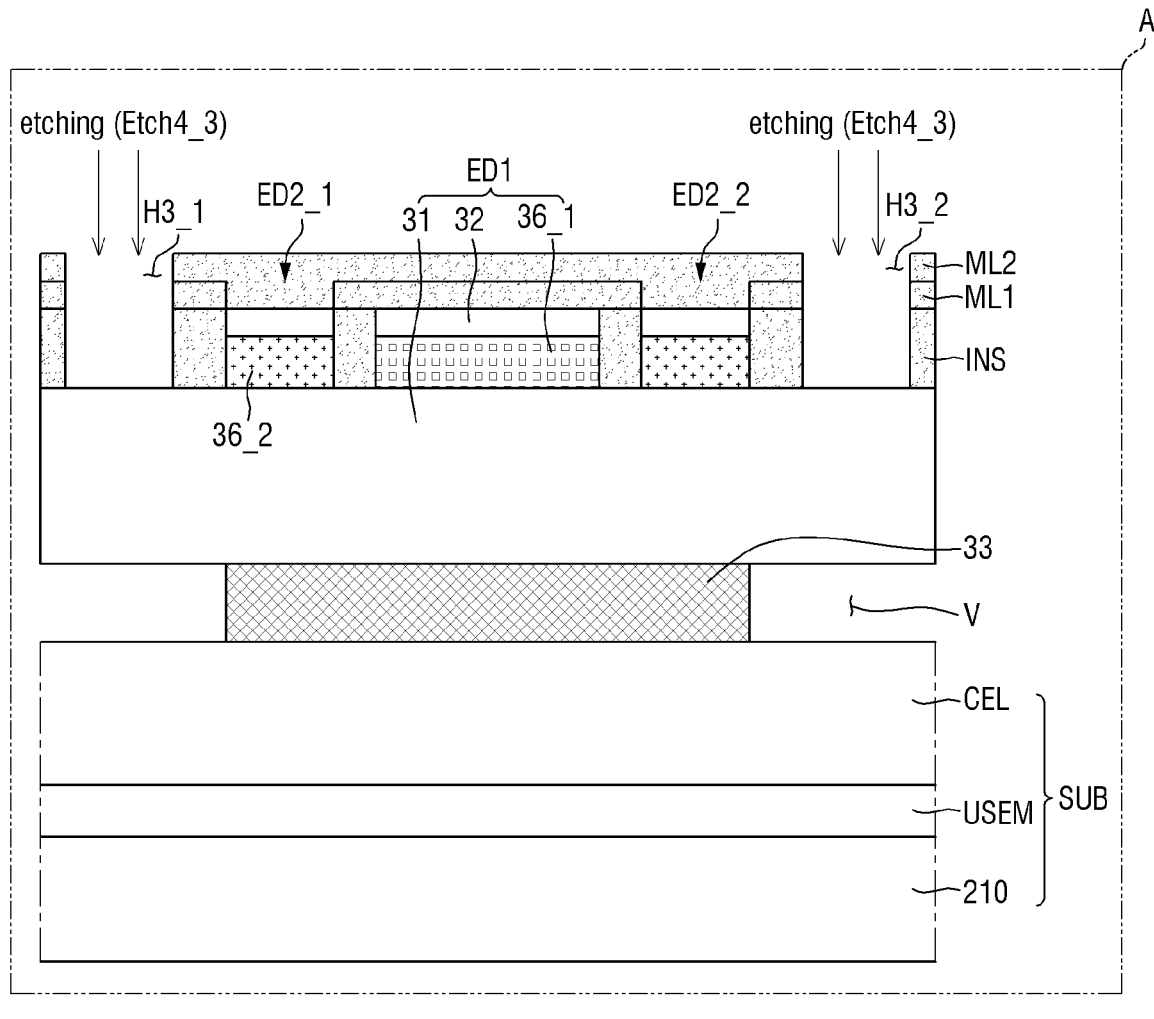
Figure 18:
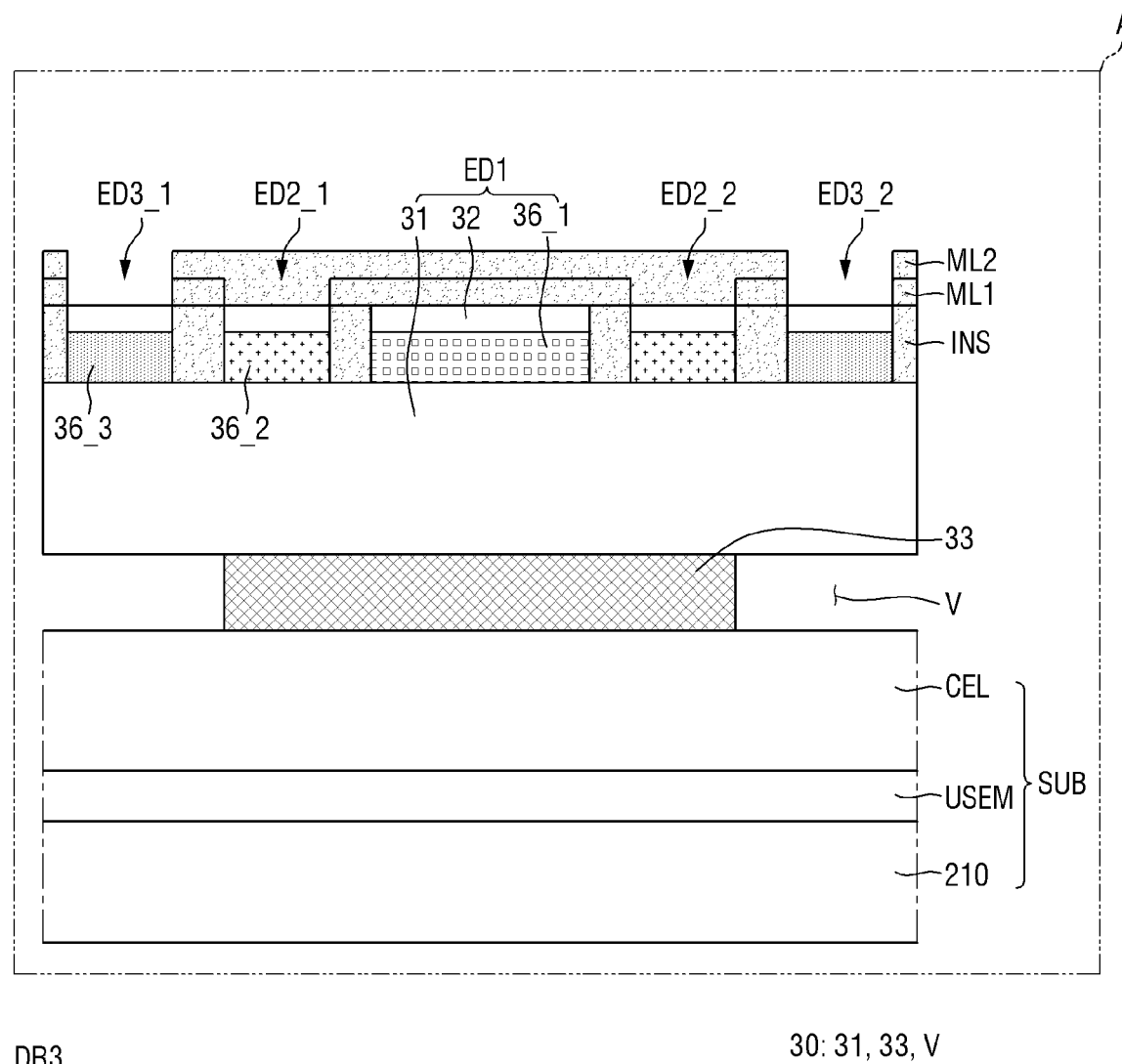

Referring to FIGS. 17 and 18, the third holes H3 penetrating the insulating layer INS, the first mask layer ML1, and the second mask layer ML2 may be formed, and the third light emitting element ED3 may be formed in the third holes H3 (step S230).

The third light emitting element ED3 including the third active layer 36_3 may be formed on the first semiconductor layer 31 in the same manner as described above but under different process conditions and materials. The detailed description thereof is the same as described above.

In the process, the first light emitting element ED1, the second light emitting element ED2, and the third light emitting element ED3 may be sequentially formed according to the above-described order. According to an embodiment, as the indium (In) contents of the active layers 36_1, 36_2, and 36_3 increase, the active layers 36_1, 36_2, and 36_3 may be vulnerable to a high growth temperature. For example, as the content of indium (In) increases, the active layers 36_1, 36_2, and 36_3 may be damaged due to high volatility during high-temperature growth. For example, the growth temperature of the third active layer 36_3 may be the lowest, the growth temperature of the second active layer 36_2 may be the next lowest, and the growth temperature of the first active layer 36_1 may be the highest. Accordingly, in case that each of the active layers 36_1, 36_2, and 36_3 is grown in the order of the first active layer 36_1, the second active layer 36_2, and the third active layer 36_3, the active layers 36_1, 36_2, and 36_3 may grow without being damaged.

The second light emitting element ED2 and the third light emitting element ED3 may be formed to be spaced apart from each other in the horizontal direction with respect to the first light emitting element ED1 in the center therebetween. In the case of the first light emitting element ED1 having the lowest indium content, the number of internal defects during growth may be minimal, so that there may be few internal defects although the first light emitting element ED1 grows in the vicinity of the interface area between the semiconductor pattern 33 and the first semiconductor layer 31. On the other hand, since the third light emitting element ED3 has the highest indium content and is more likely to generate internal defects, the third light emitting element ED3 may be formed to be spaced furthest apart from the interface area between the semiconductor pattern 33 and the first semiconductor layer 31. Accordingly, internal defects of the third light emitting element ED3 may be minimized. For example, the first light emitting element ED1 may overlap the semiconductor pattern 33 in the third direction DR3. The third light emitting element ED3 may not overlap the semiconductor pattern 33 in the third direction DR3. The third light emitting element ED3 may overlap the void V in the third direction DR3.

Figure 19:
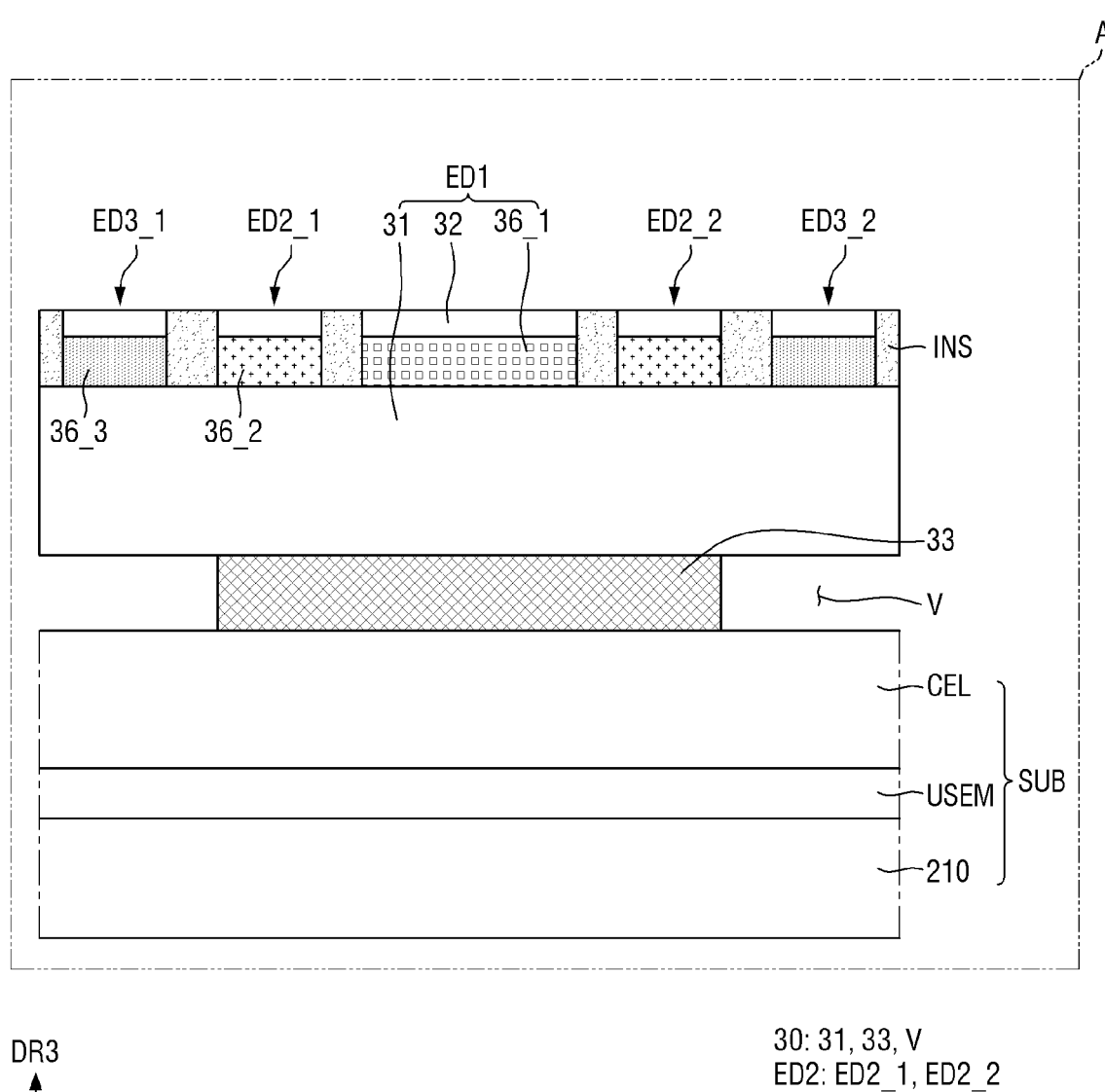
Figure 20:
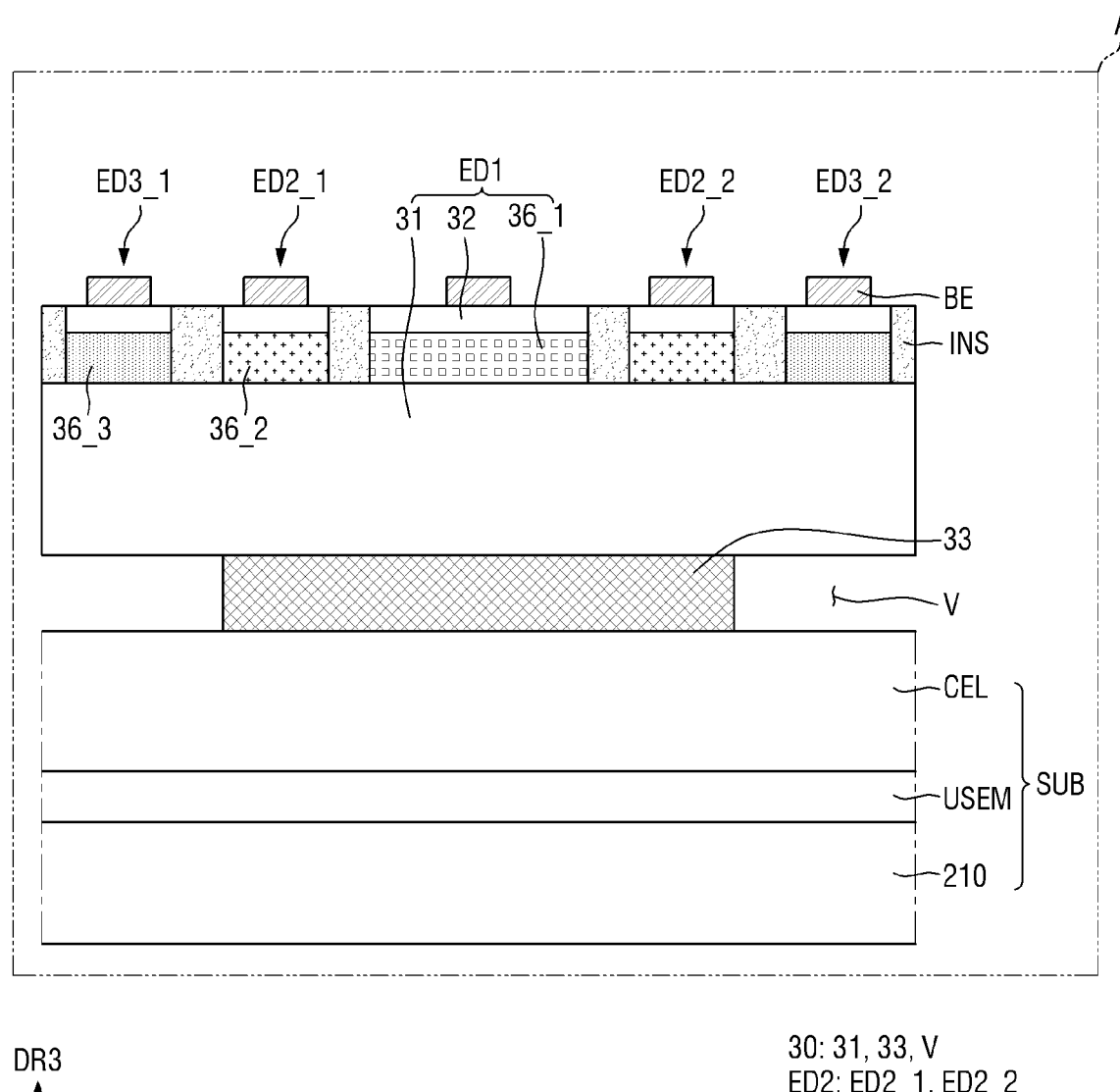

Referring to FIGS. 19 and 20, the first mask layer ML1 and the second mask layer ML2 may be removed, and the connection electrode BE may be formed on the first to third light emitting elements ED1, ED2, and ED3 (step S240).

The top surfaces of the first to third light emitting elements ED1, ED2, and ED3 may be exposed by removing the mask layers ML1 and ML2. The top surfaces of the first to third light emitting elements ED1, ED2, and ED3 and the top surface of the insulating layer INS may be planarized. The process of removing the mask layers ML1 and ML2 may be performed through a dry etching process or a wet etching process.

The connection electrodes BE may be formed on the top surface of each of the first to third light emitting elements ED1, ED2, and ED3 where the top surface of the second semiconductor layer 32 is exposed. The connection electrodes BE may be formed on the first to third light emitting elements ED1, ED2, and ED3 through a photo process.

Through the above process, the display substrate 200 disposed on the second substrate 210 may be fabricated. The display device 1 may be fabricated by bonding the semiconductor circuit substrate 100 and the display substrate 200 to each other.

Figure 21:
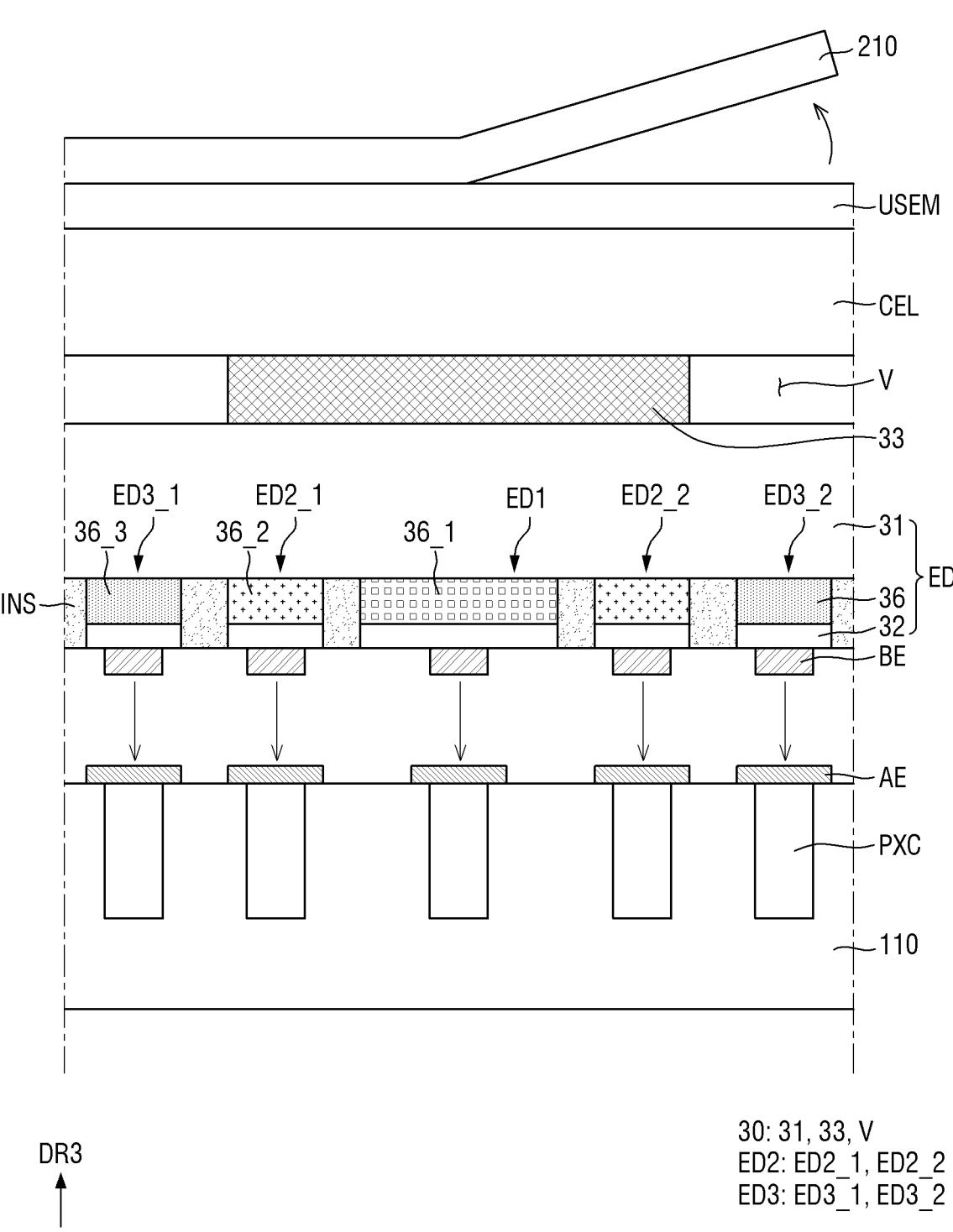
Figure 22:
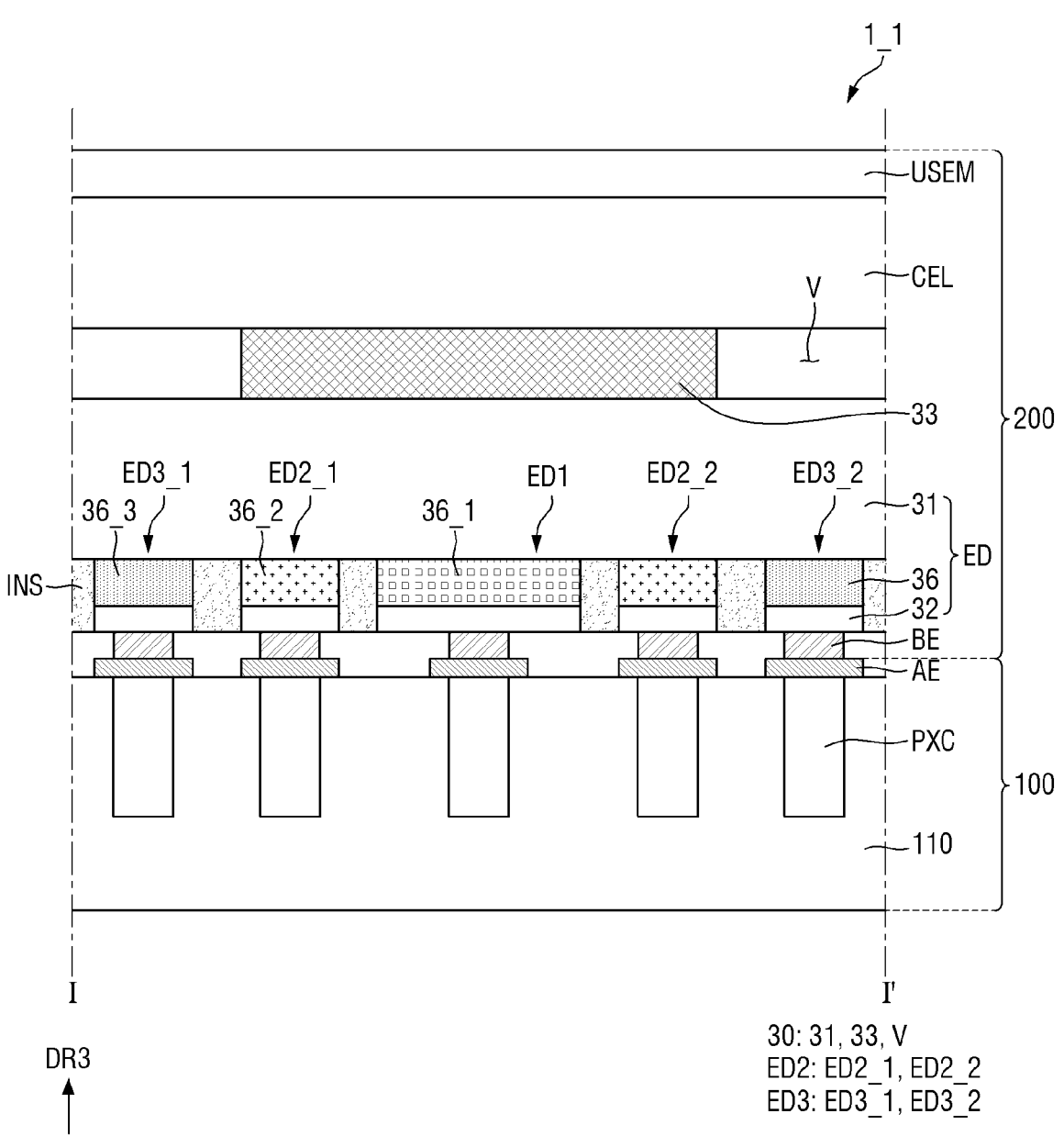

Referring to FIGS. 21 and 22, the base substrate SUB on which the light emitting elements ED1, ED2, and ED3 are formed and the semiconductor circuit substrate 100 are bonded (step S250).

The semiconductor circuit substrate 100 may include the first substrate 110 including pixel circuit parts PXC, and a pixel electrode AE formed on a surface of the first substrate 110. The second substrate 210 and the display substrate 200 may be aligned on the semiconductor circuit substrate 100 so that the light emitting elements ED correspond to the pixel electrodes AE of the semiconductor circuit substrate 100. The connection electrode BE may be aligned to overlap the pixel electrode AE in a thickness direction. In case that the second substrate 210 and the display substrate 200 are aligned with the semiconductor circuit substrate 100, the display substrate 200 and the semiconductor circuit substrate 100 may be bonded to each other. The connection electrode BE disposed on the light emitting elements ED of the display substrate 200 may be in contact (e.g., directly in contact) with the pixel electrode AE. In case that the semiconductor circuit substrate 100 and the display substrate 200 are bonded to each other, both ends of the light emitting elements ED may be electrically connected to the pixel circuit part PXC of the semiconductor circuit substrate 100.

The display device 1_1 may be fabricated by removing the second substrate 210 disposed on the undoped semiconductor layer USEM of the display substrate 200.

Through the above process, the light emitting elements ED1, ED2, and ED3 may be formed on the double semiconductor layer 30 including the void V, the semiconductor pattern 33, and the first semiconductor layer 31. The third light emitting element ED3, which is a light emitting element of a long wavelength band having a high indium content, may be formed on the first semiconductor layer 31 in which the strain is relaxed by the semiconductor pattern 33 and the lattice constant is increased, so that internal defects that may occur during the growth process of the third light emitting element ED3 may be reduced.

Hereinafter, a display device 1_2 according to another embodiment will be described. In the embodiment, the light emitting elements ED may include a semiconductor rod structure.

Figure 23:
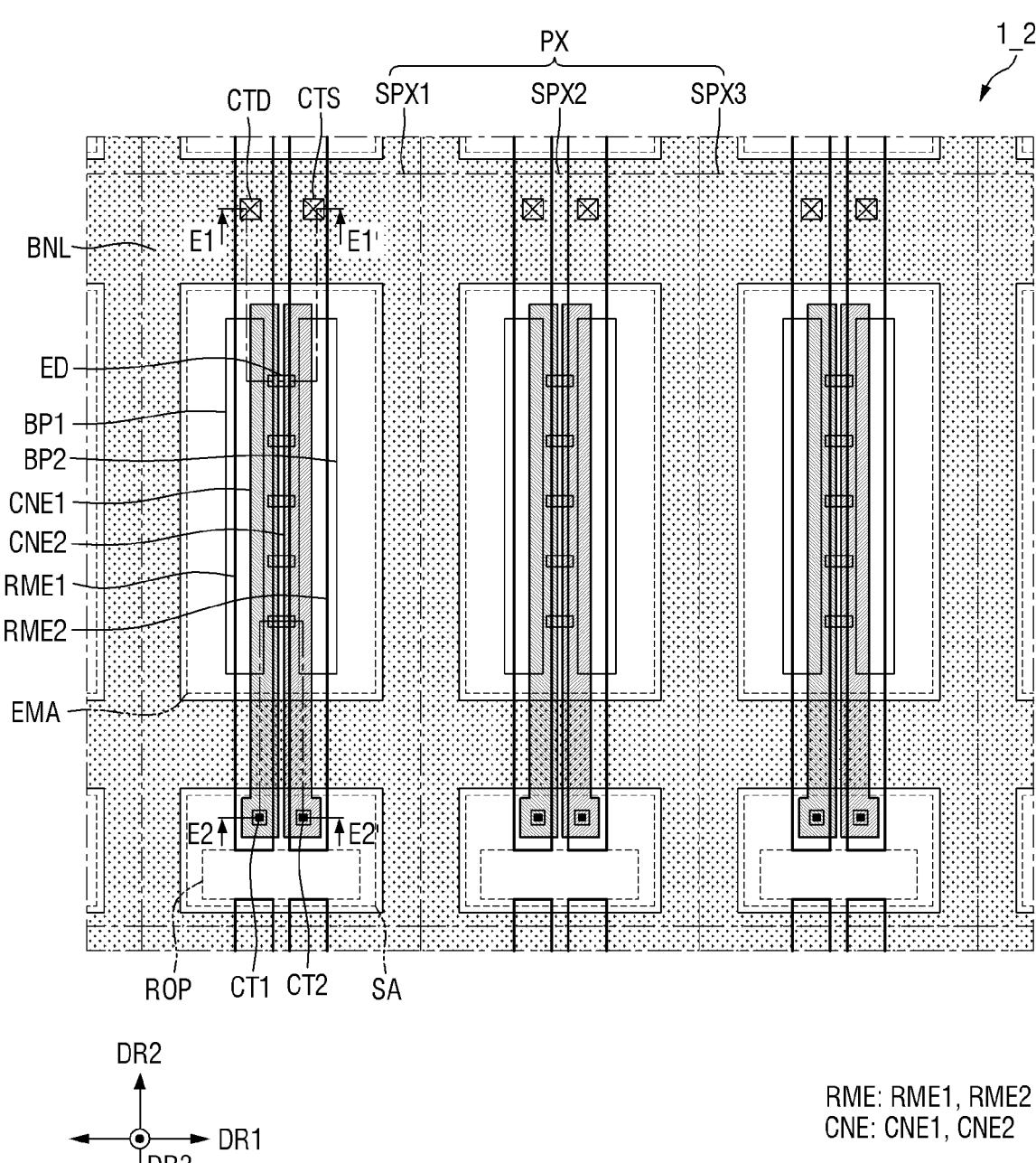
FIG. 23 is a plan view illustrating one pixel of a display device according to another embodiment.

FIG. 23 is a plan view illustrating a pixel of a display device according to another embodiment. FIG. 23 illustrates planar arrangement of electrodes RME (RME1 and RME2), bank patterns BP1 and BP2, a bank layer BNL, multiple light emitting elements ED, and connection electrodes CNE (CNE1 and CNE2) disposed in a pixel PX of the display device 1_2.

Referring to FIG. 23, each of the pixels PX of the display device 1_2 may include multiple sub-pixels SPXn. For example, a pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the disclosure is not limited thereto, and the sub-pixels SPXn may emit light of the same color. In an embodiment, each of the sub-pixels SPXn may emit blue light. Although it is illustrated in the drawing that a pixel PX includes three sub-pixels SPXn, the disclosure is not limited thereto, and a pixel PX may include a larger number of sub-pixels SPXn.

Each sub-pixel SPXn of the display device 1_2 may include an emission area EMA and a non-emission area. The emission area EMA may be an area in which the light emitting element ED is disposed to emit light of a specific wavelength band. The non-emission area may be a region in which the light emitting element ED is not disposed and a region from which light is not emitted because light emitted from the light emitting element ED does not reach it.

The emission area EMA may include the region in which the light emitting element ED is disposed, and a region adjacent to the light emitting element ED in which the lights emitted from the light emitting element ED are emitted. For example, the emission area EMA may further include a region in which the light emitted from the light emitting element ED is reflected or refracted by another member and emitted. The light emitting elements ED may be disposed in each sub-pixel SPXn, and the emission area may be formed to include an area where the light emitting elements ED are disposed and an area adjacent thereto.

Although it is shown in the drawing that the sub-pixels SPXn have the emission areas EMA that are substantially identical in size, the disclosure is not limited thereto. In some embodiments, the emission areas EMA of the sub-pixels SPXn may have different sizes according to a color or wavelength band of light emitted from the light emitting element ED disposed in each sub-pixel.

Each sub-pixel SPXn may further include a sub-region SA disposed in the non-emission area. The sub-region SA of the corresponding sub-pixel SPXn may be disposed on a lower side of the emission area EMA, which is another side in the second direction DR2. The emission area EMA and the sub-region SA may be alternately arranged in the second direction DR2, and the sub-region SA may be disposed between the emission areas EMA of adjacent sub-pixels SPXn spaced apart from each other in the second direction DR2. For example, the emission area EMA and the sub-region SA may be alternately arranged in the second direction DR2, and each of the emission area EMA and the sub-region SA may be repeatedly arranged in the first direction DR1. However, the disclosure is not limited thereto, and the arrangement of the emission areas EMA and the sub-regions SA in the pixels PX may be different from that shown in FIG. 23.

Light may not be emitted from the sub-region SA because the light emitting element ED is not disposed in the sub-region SA, but an electrode RME disposed in each sub-pixel SPXn may be partially disposed in the sub-region SA. The electrodes RME disposed in different sub-pixels SPXn may be disposed to be separated at a separation portion ROP of the sub-region SA.

The display device 1_2 may include a multiple electrodes RME (RME1 and RME2), the bank patterns BP1 and BP2, the bank layer BNL, the light emitting elements ED, and the connection electrode CNE (CNE1 and CNE2).

The bank patterns BP1 and BP2 may be disposed in the emission area EMA of each sub-pixel SPXn. The bank patterns BP1 and BP2 may have a predetermined (or selectable) width in the first direction DR1 and may have a shape extending in the second direction DR2.

For example, the bank patterns BP1 and BP2 may include a first bank pattern BP1 and a second bank pattern BP2 spaced apart from each other in the first direction DR1 in the emission area EMA of each sub-pixel SPXn. The first bank pattern BP1 may be disposed on the left side with respect to the center of the emission area EMA, which is a side in the first direction DR1, and the second bank patterns BP2 may be disposed on the right side with respect to the center of the emission area EMA, which is another side in the first direction DR1, while being spaced apart from the first bank pattern BP1. The first bank pattern BP1 and the second bank pattern BP2 may be alternately disposed in the first direction DR1 and may be disposed in an island-shaped pattern in the display area DA. The light emitting elements ED may be arranged between the first bank pattern BP1 and the second bank pattern BP2.

The lengths of the first bank pattern BP1 and the second bank pattern BP2 in the second direction DR2 may be the same, and may be smaller than the length of the emission area EMA surrounded by the bank layer BNL in the second direction DR2. The first bank pattern BP1 and the second bank pattern BP2 may be spaced apart from a portion of the bank layer BNL extending in the first direction DR1. However, the disclosure is not limited thereto, and the bank patterns BP1 and BP2 may be integrated with the bank layer BNL, or may partially overlap the portion of the bank layer BNL extending in the first direction DR1. The lengths of the bank patterns BP1 and BP2 in the second direction DR2 may be greater than or equal to the length of the emission area EMA surrounded by the bank layer BNL in the second direction DR2.

The widths of the first bank pattern BP1 and the second bank pattern BP2 in the first direction DR1 may be the same. However, the disclosure is not limited thereto, and they may have different widths. For example, a bank pattern may have a larger width than another bank pattern, and the bank pattern having a larger width may be disposed across the emission areas EMA of adjacent sub-pixels SPXn in the first direction DR1. In the bank pattern disposed across the emission areas EMA, a portion of the bank layer BNL extending in the second direction DR2 may overlap the second bank pattern BP2 in the thickness direction. Although it is illustrated in the drawing that two bank patterns BP1 and BP2 having the same width are arranged for each sub-pixel SPXn, the disclosure is not limited thereto. The number and the shape of the bank patterns BP1 and BP2 may vary depending on the number or the arrangement structure of the electrodes RME.

The electrodes RME (RME1 and RME2) may have a shape extending in a direction and may be disposed in each sub-pixel SPXn. The electrodes RME1 and RME2 may extend in the second direction DR2 to be disposed across the emission area EMA of the sub-pixel SPXn and the sub-region SA, and may be disposed to be spaced apart from each other in the first direction DR1. The electrodes RME may be electrically connected to the light emitting elements ED to be described later. However, the disclosure is not limited thereto, and the electrodes RME may not be electrically connected to the light emitting element ED.

The display device 1_2 may include the first electrode RME1 and the second electrode RME2 arranged in each sub-pixel SPXn. The first electrode RME1 may be located on the left side with respect to the center of the emission area EMA, and the second electrode RME2 may be located on the right side with respect to the center of the emission area EMA while being spaced apart from the first electrode RME1 in the first direction DR1. A first electrode RME1 may be disposed on the first bank pattern BP1, and a second electrode RME2 may be disposed on the second bank pattern BP2. The first electrode RME1 and the second electrode RME2 may be partially arranged in the corresponding sub-pixel SPXn and the sub-region SA over the bank layer BNL. The first electrode RME1 and the second electrode RME2 of different sub-pixels SPXn may be separated with respect to the separation portion ROP located in the sub-region SA of a sub-pixel SPXn.

Although it is illustrated in the drawing that two electrodes RME have a shape extending in the second direction DR2 for each sub-pixel SPXn, the disclosure is not limited thereto. For example, the display device 1_2 may have a shape in which a larger number of electrodes RME are disposed in a sub-pixel SPXn or the electrodes RME are partially bent and have different widths depending on positions.

The bank layer BNL may be disposed to surround the sub-pixels SPXn, the emission area EMA, and the sub-region SA. The bank layer BNL may be disposed at the boundary between adjacent sub-pixels SPXn in the second direction DR2 and the first direction DR1, and may also be disposed at the boundary between the emission area EMA and the sub-region SA. The sub-pixels SPXn, the emission area EMA, and the sub-region SA of the display device 1_2 may be the areas distinguished by the arrangement of the bank layer BNL. The gaps between the sub-pixels SPXn, the emission areas EMA, and the sub-regions SA may vary depending on the width of the bank layer BNL.

The bank layer BNL may include portions extending in the second direction DR2 and the first direction DR1 in a plan view to be arranged in a grid pattern over the entire surface of the display area DA. The bank layer BNL may be disposed along the boundaries between the sub-pixels SPXn to delimit the neighboring sub-pixels SPXn. The bank layer BNL may also be arranged to surround the emission area EMA and the sub-region SA disposed for each sub-pixel SPXn to delimit them from each other.

The light emitting elements ED may be arranged in the emission area EMA. The light emitting elements ED may be disposed between the bank patterns BP1 and BP2, and may be arranged to be spaced apart from each other in the second direction DR2. In an embodiment, the light emitting elements ED may have a shape extending in a direction, and both ends thereof may be disposed on different electrodes RME. The length of the light emitting element ED may be greater than the gap between the electrodes RME spaced apart from each other in the first direction DR1. The extension direction of the light emitting elements ED may be substantially perpendicular to the second direction DR2 in which the electrodes RME extend. However, the disclosure is not limited thereto, and the light emitting element ED may extend in the second direction DR2 or in a direction oblique to the first direction DR1.

Multiple connection electrodes CNE (CNE1 and CNE2) may be disposed on the electrodes RME and the bank patterns BP1 and BP2. The connection electrodes CNE may have a shape extending in a direction, and may be disposed to be spaced apart from each other. Each of the connection electrodes CNE may be in electrical contact with the light emitting element ED, and may be electrically connected to the electrode RME or the conductive layer disposed thereunder.

The connection electrodes CNE may include a first connection electrode CNE1 and a second connection electrode CNE2 disposed in each sub-pixel SPXn. The first connection electrode CNE1 may have a shape extending in the second direction DR2 and may be disposed on the first electrode RME1 or the first bank pattern BP1. The first connection electrode CNE1 may partially overlap the first electrode RME1 and may be disposed across the emission area EMA and the sub-region SA over the bank layer BNL. The second connection electrode CNE2 may have a shape extending in the second direction DR2 and may be disposed on the second electrode RME2 or the second bank pattern BP2. The second connection electrode CNE2 may partially overlap the second electrode RME2 and may be disposed across the emission area EMA and the sub-region SA over the bank layer BNL.

Figure 25:
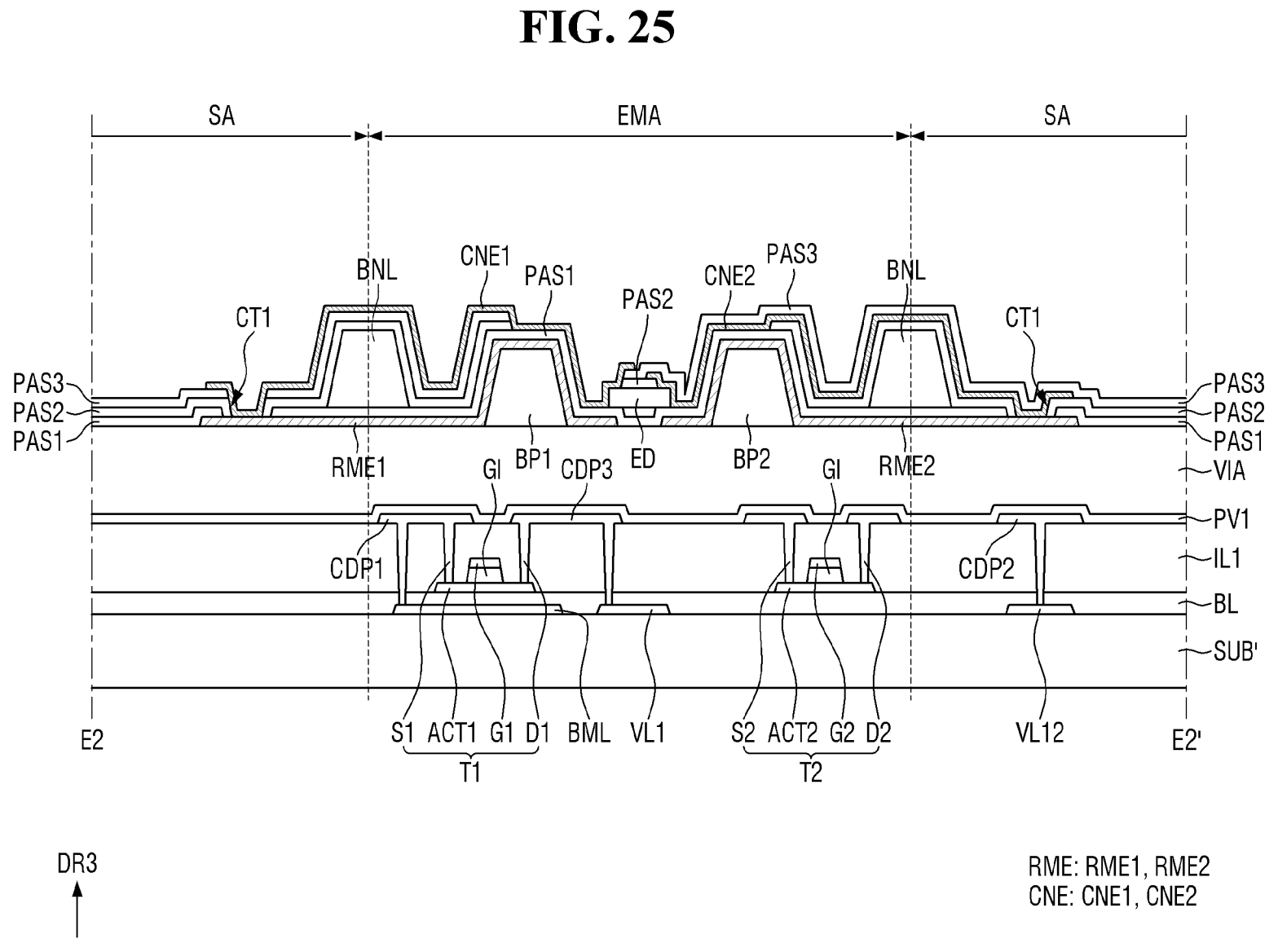

FIG. 24 is a schematic cross-sectional view taken along line E1-E1' of FIG. 23. FIG. 25 is a schematic cross-sectional view taken along line E2-E2' of FIG. 23. FIG. 24 illustrates a schematic cross section across both ends of the light emitting element ED and electrode contact holes CTD and CTS disposed in the first sub-pixel SPX1, and FIG. 25 illustrates a schematic cross section across both ends of the light emitting element ED and contact portions CT1 and CT2 disposed in the first sub-pixel SPX1.

A schematic cross-sectional structure of the display device 1_2 will be described with reference to FIGS. 23 to 25. The display device 1_2 may include the first substrate SUB, and a semiconductor layer, multiple conductive layers, and multiple insulating layers, disposed on the first substrate SUB. The display device 1_2 may include the electrodes RME (RME1 and RME2), the light emitting element ED, and the connection electrodes CNE (CNE1 and CNE2). The semiconductor layer, the conductive layers, and the insulating layers may each constitute a circuit layer of the display device 1_2.

The first substrate SUB may be an insulating substrate. The first substrate SUB may be made of an insulating material such as glass, quartz, or polymer resin. The first substrate SUB may be a rigid substrate, but may be a flexible substrate which may be bent, folded or rolled. The first substrate SUB may include the display area DA and the non-display area NDA disposed adjacent to the display area DA, and the display area DA may include the emission area EMA, the non-emission area, and the sub-region SA that is a portion of the non-emission area.

A first conductive layer may be disposed on the first substrate SUB. The first conductive layer may include a lower metal layer BML, a first voltage line VL1 and a second voltage line VL2. The lower metal layer BML may be arranged to overlap an active layer ACT1 of a first transistor T1. The lower metal layer BML may prevent light from entering the first active layer ACT1 of the first transistor T1, and may be electrically connected to the first active layer ACT1 to stabilize electrical characteristics of the first transistor T1. However, the lower metal layer BML may be omitted.

The first voltage line VL1 may be applied with a high potential voltage (or a first power voltage) transmitted to a first electrode RME1, and the second voltage line VL2 may be applied with a low potential voltage (or a second power voltage) transmitted to a second electrode RME2. The first voltage line VL1 may be electrically connected to the first transistor T1 through a conductive pattern (e.g., a third conductive pattern CDP) of a third conductive layer. The second voltage line VL2 may be electrically connected to the second electrode RME2 through a conductive pattern (e.g., a second conductive pattern CDP) of a third conductive layer.

Although it is illustrated in the drawing that the first voltage line VL1 and the second voltage line VL2 are disposed on the first conductive layer, the disclosure is not limited thereto. In some embodiments, the first voltage line VL1 and the second voltage line VL2 may be disposed on the third conductive layer and electrically connected directly to the first transistor T1 and the second electrode RME2, respectively.

A buffer layer BL may be disposed on the first conductive layer and the first substrate SUB. The buffer layer BL may be formed on the first substrate SUB to protect the transistors of the pixel PX from moisture permeating through the first substrate SUB susceptible to moisture permeation, and may perform a surface planarization function.

A semiconductor layer may be disposed on the buffer layer BL. The semiconductor layer may include a first active layer ACT1 of the first transistor T1 and a second active layer ACT2 of the second transistor T2. The first active layer ACT1 and the second active layer ACT2 may be disposed to partially overlap a first gate electrode G1 and a second gate electrode G2 of a second conductive layer to be described later, respectively.

The semiconductor layer may include polycrystalline silicon, monocrystalline silicon, oxide semiconductor, and the like. The oxide semiconductor may be an oxide semiconductor containing indium (In). For example, the oxide semiconductor may include at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

Although it is illustrated in the drawing that one first transistor T1 and one second transistor T2 are disposed in the sub-pixel SPXn of the display device 1_2, but the disclosure is not limited thereto, and the display device 1_2 may include a larger number of transistors.

A first gate insulating layer G1 may be disposed on the semiconductor layer in the display area DA. The first gate insulating layer G1 may serve as a gate insulating layer of each of the transistors T1 and T2. Although it is illustrated in the drawing that the first gate insulating layer G1 is patterned together with the gate electrodes G1 and G2 of the second conductive layer to be described later and partially disposed between the second conductive layer and the active layers ACT1 and ACT2 of the semiconductor layer, the disclosure is not limited thereto. In some embodiments, the first gate insulating layer G1 may be entirely disposed on the buffer layer BL.

The second conductive layer may be disposed on the first gate insulating layer G1. The second conductive layer may include a first gate electrode G1 of the first transistor T1 and a second gate electrode G2 of the second transistor T2. The first gate electrode G1 may be disposed to overlap the channel region of the first active layer ACT1 in a third direction DR3 that is a thickness direction, and the second gate electrode G2 may be disposed to overlap the channel region of the second active layer ACT2 in the third direction DR3 that is the thickness direction. Although not shown in the drawing, the second conductive layer may further include an electrode of the storage capacitor.

A first interlayer insulating layer IL1 may be disposed on the second conductive layer. The first interlayer insulating layer IL1 may function as an insulating film between the second conductive layer and other layers disposed thereon, and may protect the second conductive layer.

A third conductive layer may be disposed on the first interlayer insulating layer IL1. The third conductive layer may include multiple conductive patterns CDP1, CDP2 and CDP3, and source electrodes S1 and S2 and drain electrodes D1 and D2 of the respective transistors T1 and T2. Some of the conductive patterns CDP1, CDP2 and CDP3 may electrically connect the conductive layers or the semiconductor layers of different layers to each other and serve as source/drain electrodes of the transistors T1 and T2.

The first conductive pattern CDP1 may be in electrical contact with the first active layer ACT1 of the first transistor T1 through the contact hole penetrating the first interlayer insulating layer IL1. The first conductive pattern CDP1 may be in electrical contact with the lower metal layer BML through a contact hole penetrating the first interlayer insulating layer IL1 and the buffer layer BL. The first conductive pattern CDP1 may serve as a first source electrode S1 of the first transistor T1. The first conductive pattern CDP1 may be electrically connected to the first electrode RME1 and the first connection electrode CNE1. The first transistor T1 may transmit the first power voltage applied from the first voltage line VL1 to the first electrode RME1 and the first connection electrode CNE1.

The second conductive pattern CDP2 may be in electrical contact with the second voltage line VL2 through a contact hole penetrating the first interlayer insulating layer IL1 and the buffer layer BL. The second conductive pattern CDP2 may be electrically connected to the first electrode RME1 and the first connection electrode CNE1. The second voltage line VL2 may transmit a second power voltage to the second electrode RME2 and the second connection electrode CNE2.

The third conductive pattern CDP3 may be in electrical contact with the first power voltage line VL1 through a contact hole penetrating the first interlayer insulating layer IL1 and the buffer layer BL. Further, the third conductive pattern CDP3 may be in electrical contact with the first active layer ACT1 of the first transistor T1 through the contact hole penetrating the first interlayer insulating layer IL1. The third conductive pattern CDP3 may electrically connect the first voltage line VL1 to the first transistor T1 and serve as a first drain electrode D1 of the first transistor T1.

The second source electrode S2 and the second drain electrode D2 may be in electrical contact with the second active layer ACT2 of the second transistor T2 through the contact holes penetrating the first interlayer insulating layer IL1. The second transistor T2 may transmit a data signal to the first transistor T1 or transmit an initialization signal.

A first passivation layer PV1 may be disposed on the third conductive layer. The first passivation layer PV1 may function as an insulating layer between the third conductive layer and other layers and may protect the third conductive layer.

The buffer layer BL, the first gate insulating layer G1, the first interlayer insulating layer IL1, and the first passivation layer PV1 described above may be formed of multiple inorganic layers stacked each other in an alternating manner. For example, the buffer layer BL, the first gate insulating layer G1, the first interlayer insulating layer IL1, and the first passivation layer PV1 may be formed as a double layer formed by stacking, or a multilayer formed by alternately stacking each other, inorganic layers including at least one of silicon oxide ($SiO_x$), silicon nitride ($SiN_x$), or silicon oxynitride ($SiO_xN_y$). However, the disclosure is not limited thereto, and the buffer layer BL, the first gate insulating layer G1, the first interlayer insulating layer IL1, and the first passivation layer PV1 may be formed as a single inorganic layer containing the above-described insulating material. Further, in some embodiments, the first interlayer insulating layer IL1 may be made of an organic insulating material such as polyimide (PI) or the like.

A via layer VIA may be disposed on the third conductive layer in the display area DA. The via layer VIA may contain an organic insulating material, e.g., polyimide (PI), and may compensate the stepped portion formed by the conductive layers disposed thereunder to flatten the top surface. However, in some embodiments, the via layer VIA may be omitted.

The display device 1_2 may include, as a display element layer disposed on the via layer VIA, the bank patterns BP1 and BP2, the electrodes RME (RME1 and RME2), the bank layer BNL, the light emitting elements ED, and the connection electrodes CNE (CNE1 and CNE2). The display device 1_2 may include the insulating layers PAS1, PAS2, and PAS3 disposed on the via layer VIA.

The bank patterns BP1 and BP2 may be disposed on the via layer VIA. For example, each of the bank patterns BP1 and BP2 may be directly disposed on the via layer VIA, and may have a structure in which at least a part thereof protrudes from the top surface of the via layer VIA. The protruding portions of the bank patterns BP1 and BP2 may have an inclined surface or a curved surface with a certain curvature, and the light emitted from the light emitting element ED may be reflected by the electrode RME disposed on the bank patterns BP1 and BP2 and emitted in the upward direction of the via layer VIA. Unlike the embodiment illustrated in the drawing, the bank patterns BP1 and BP2 may have a shape, e.g., a semicircular or semi-elliptical shape, in which the outer surface is curved with a certain curvature in a cross-sectional view. The bank patterns BP1 and BP2 may include an organic insulating material such as polyimide (PI), but is not limited thereto.

The electrodes RME (RME1 and RME2) may be disposed on the bank patterns BP1 and BP2 and the via layer VIA. For example, the first electrode RME1 and the second electrode RME2 may be arranged at least on the inclined surfaces of the bank patterns BP1 and BP2. The widths of the electrodes RME measured in the first direction DR1 may be smaller than the widths of the bank patterns BP1 and BP2 measured in the first direction DR1, and the gap between the first electrode RME1 and the second electrode RME2 in the first direction DR1 may be smaller than the gap between the bank patterns BP1 and BP2. At least a portion of the first electrode RME1 and the second electrode RME2 may be directly arranged on the via layer VIA, so that the first electrode RME1 and the second electrode RME2 may be arranged on a same plane.

The light emitting element ED disposed between the bank patterns BP1 and BP2 may emit light toward both ends, and the emitted light may be directed toward the electrodes RME disposed on the bank patterns BP1 and BP2. The electrodes RME may have a structure in which portions thereof disposed on the bank patterns BP1 and BP2 may reflect the light emitted from the light emitting element ED. The first electrode RME1 and the second electrode RME2 may be arranged to cover at least a side surfaces of the bank patterns BP1 and BP2 and may reflect the light emitted from the light emitting element ED.

The electrodes RME may be in direct contact with the third conductive layer through the electrode contact holes CTD and CTS at the portions overlapping the bank layer BNL between the emission area EMA and the sub-region SA. The first electrode contact hole CTD may be formed in an area in which the bank layer BNL and the first electrode RME1 overlap, and the second electrode contact hole CTS may be formed in an area in which the bank layer BNL and the second electrode RME2 overlap. The first electrode RME1 may be in electrical contact with the first conductive pattern CDP1 through the first electrode contact hole CTD penetrating the via layer VIA and the first passivation layer PV1. The second electrode RME2 may be in electrical contact with the second voltage line VL2 through the second electrode contact hole CTS penetrating the via layer VIA and the first passivation layer PV1. The first electrode RME1 may be electrically connected to the first transistor T1 through the first conductive pattern CDP1, so that the first power voltage may be applied to the first electrode RME1, and the second electrode RME2 may be electrically connected to the second voltage line VL2, so that the second power voltage may be applied to the second electrode RME2. However, the disclosure is not limited thereto. In another embodiment, the electrodes RME1 and RME2 may not be electrically connected to the voltage lines VL1 and VL2 of the third conductive layer, respectively, and the connection electrode CNE to be described later may be directly connected to the third conductive layer.

The electrodes RME may include a conductive material having high reflectivity. For example, the electrodes RME may contain a metal such as silver (Ag), copper (Cu), or aluminum (Al), or may contain an alloy including aluminum (Al), nickel (Ni), lanthanum (La), or the like. In another embodiment, the electrodes RME may have a structure in which a metal layer such as titanium (Ti), molybdenum (Mo), and niobium (Nb) and the alloy are stacked each other. In some embodiments, the electrodes RME may be formed as a double layer or a multilayer formed by stacking at least one metal layer made of an alloy including aluminum (Al) and titanium (Ti), molybdenum (Mo), and niobium (Nb).

The disclosure is not limited thereto, and each electrode RME may include a transparent conductive material. For example, each electrode RME may include a material such as ITO, IZO, and ITZO. In some embodiments, each of the electrodes RME may have a structure in which at least one transparent conductive material and at least one metal layer having high reflectivity are stacked each other, or may be formed as one layer including them. For example, each electrode RME may have a stacked structure of ITO/Ag/ ITO, ITO/Ag/IZO, ITO/Ag/ITZO/IZO, or the like. The electrodes RME may be electrically connected to the light emitting element ED, and may reflect some of the lights emitted from the light emitting element ED in an upward direction of the first substrate SUB.

The first insulating layer PAS1 may be disposed in the entire display area DA and may be disposed on the via layer VIA and the electrodes RME. The first insulating layer PAS1 may include an insulating material to protect the electrodes RME and insulate different electrodes RME from each other. The first insulating layer PAS1 may be disposed to cover the electrodes RME before the bank layer BNL is formed, so that it is possible to prevent the electrodes RME from being damaged in a process of forming the bank layer BNL. The first insulating layer PAS1 may prevent the light emitting element ED disposed thereon from being damaged by direct contact with other members.

In an embodiment, the first insulating layer PAS1 may have stepped portions such that the top surface thereof is partially depressed between the electrodes RME spaced apart in the second direction DR2. The light emitting element ED may be disposed on the top surface of the first insulating layer PAS1, where the stepped portions are formed, and thus a space may remain between the light emitting element ED and the first insulating layer PAS1.

The first insulating layer PAS1 may include the contact portions CT1 and CT2 disposed in the sub-region SA. The contact portions CT1 and CT2 may be disposed to overlap different electrodes RME, respectively. For example, the contact portions CT1 and CT2 may include first contact portions CT1 disposed to overlap the first electrode RME1 and second contact portions CT2 disposed to overlap the second electrode RME2. The first contact portions CT1 and the second contact portions CT2 may penetrate the first insulating layer PAS1 to partially expose the top surface of the first electrode RME1 or the second electrode RME2 thereunder. Each of the first contact portion CT1 and the second contact portion CT2 may further penetrate some of the other insulating layers disposed on the first insulating layer PAS1. The electrode RME exposed by each of the contact portions CT1 and CT2 may be in electrical contact with the connection electrode CNE.

The bank layer BNL may be disposed on the first insulating layer PAS1. The bank layer BNL may include portions extending in the first direction DR1 and the second direction DR2, and may surround the sub-pixels SPXn. The bank layer BNL may surround and distinguish the emission area EMA and the sub-region SA of each sub-pixel SPXn, and may surround the outermost portion of the display area DA and distinguish the display area DA and the non-display area NDA.

Similar to the bank patterns BP1 and BP2, the bank layer BNL may have a certain height. In some embodiments, a top surface of the bank layer BNL may be higher than that of the bank patterns BP1 and BP2, and the thickness of the bank layer BNL may be equal to or greater than that of the bank patterns BP1 and BP2 in the thickness direction. The bank layer BNL may prevent ink from overflowing to adjacent sub-pixels SPXn in an inkjet printing process during the manufacturing process of the display device 1_2. Similar to the bank patterns BP1 and BP2, the bank layer BNL may include an organic insulating material such as polyimide.

The light emitting elements ED may be arranged in the emission area EMA. The light emitting elements ED may be disposed on the first insulating layer PAS1 between the bank patterns BP1 and BP2. The light emitting element ED may be disposed such that a direction in which the light emitting element ED extends may be parallel to the top surface of the first substrate SUB. As will be described later, the light emitting element ED may include multiple semiconductor layers arranged in a direction in which the light emitting element ED extends, and the semiconductor layers may be sequentially arranged in the direction parallel to the top surface of the first substrate SUB. However, the disclosure is not limited thereto, and the semiconductor layers may be arranged in the direction perpendicular to the first substrate SUB in case that the light emitting element ED has another structure.

The light emitting elements ED disposed in each sub-pixel SPXn may emit light of different wavelength bands depending on a material constituting the semiconductor layer. However, the disclosure is not limited thereto, and the light emitting elements ED arranged in each sub-pixel SPXn may include the semiconductor layer of the same material and emit light of the same color.

The light emitting elements ED may be electrically connected to the electrode RME and the conductive layers below the via layer VIA while being in electrical contact with the connection electrodes CNE (CNE1 and CNE2), and may emit light of a specific wavelength band by receiving an electrical signal.

The second insulating layer PAS2 may be disposed on the light emitting elements ED, the first insulating layer PAS1, and the bank layer BNL. The second insulating layer PAS2 may include a pattern portion disposed on the light emitting elements ED extending in the first direction DR1 between the bank patterns BP1 and BP2. The pattern portion may be disposed to partially surround an outer surface of the light emitting element ED, and may not cover both sides or both ends of the light emitting element ED. The pattern portion may form a linear or island-like pattern in each sub-pixel SPXn in a plan view. The pattern portion of the second insulating layer PAS2 may protect the light emitting element ED and fix the light emitting elements ED during a manufacturing process of the display device 1_2. Further, the second insulating layer PAS2 may be disposed to fill the space between the light emitting element ED and the first insulating layer PAS1 thereunder. Further, a portion of the second insulating layer PAS2 may be disposed on the bank layer BNL and in the sub-regions SA.

The second insulating layer PAS2 may include the contact portions CT1 and CT2 disposed in the sub-region SA. The second insulating layer PAS2 may include the first contact portion CT1 disposed to overlap the first electrode RME1, and the second contact portion CT2 disposed to overlap the second electrode RME2. The contact portions CT1 and CT2 may penetrate the second insulating layer PAS2 in addition to the first insulating layer PAS1. The first contact portions CT1 and the second contact portions CT2 may partially expose the top surface of the first electrode RME1 or the second electrode RME2 disposed thereunder.

The connection electrodes CNE (CNE1 and CNE2) may be disposed on the electrodes RME and the bank patterns BP1 and BP2. The first connection electrode CNE1 may be disposed on the first electrode RME1 and the first bank pattern BP1. The first connection electrode CNE1 may partially overlap the first electrode RME1 and may be disposed across the emission area EMA and the sub-region SA over the bank layer BNL. The second connection electrode CNE2 may be disposed on the second electrode RME2 and the second bank pattern BP2. The second connection electrode CNE2 may partially overlap the second electrode RME2 and may be disposed across the emission area EMA and the sub-region SA over the bank layer BNL.

Each of the first connection electrode CNE1 and the second connection electrode CNE2 may be disposed on the second insulating layer PAS2 and may be in electrical contact with the light emitting elements ED. The first connection electrode CNE1 may partially overlap the first electrode RME1 and may be in electrical contact with one ends of the light emitting elements ED. The second connection electrode CNE2 may partially overlap the second electrode RME2 and may be in electrical contact with the other ends of the light emitting elements ED. The connection electrodes CNE may be disposed across the emission area EMA and the sub-region SA. The connection electrodes CNE may be in electrical contact with the light emitting elements ED at portions disposed in the emission area EMA, and may be electrically connected to the third conductive layer at portions disposed in the sub-region SA. The first connection electrode CNE1 may be in electrical contact with a first end of the light emitting element ED, and the second connection electrode CNE2 may be in electrical contact with a second end of the light emitting element ED.

In an embodiment, in the display device 1_2, the connection electrodes CNE may be in electrical contact with the electrode RME through the contact portions CT1 and CT2 disposed in the sub-region SA. The first connection electrode CNE1 may be in electrical contract with the first electrode RME1 through the first contact portion CT1 penetrating the first insulating layer PAS1, the second insulating layer PAS2, and the third insulating layer PAS3 in the sub-region SA. The second connection electrode CNE2 may be in electrical contact with the second electrode RME2 through the second contact portion CT2 penetrating the first insulating layer PAS1 and the second insulating layer PAS2 in the sub-region SA. Each of the connection electrodes CNE may be electrically connected to the third conductive layer through each respective electrodes RME. The first connection electrode CNE1 may be electrically connected to the first transistor T1, so that the first power voltage may be applied to the first connection electrode CNE1, and the second connection electrode CNE2 may be electrically connected to the second voltage line VL2, so that the second power voltage may be applied to the second connection electrode CNE2. Each connection electrode CNE may be in electrical contact with the light emitting element ED in the emission area EMA to transmit the power voltage to the light emitting element ED.

However, the disclosure is not limited thereto. In some embodiments, the connection electrodes CNE may be in direct contact with the third conductive layer, and may be electrically connected to the third conductive layer through patterns other than the electrodes RME.

The connection electrodes CNE may include a conductive material. For example, the connection electrodes CNE may include ITO, IZO, ITZO, aluminum (Al), or the like. In an embodiment, the connection electrodes CNE may include a transparent conductive material, and light emitted from the light emitting element ED may pass through the connection electrodes CNE.

The third insulating layer PAS3 may be disposed on the second connection electrode CNE2 of the first connection electrode layer and the second insulating layer PAS2. The third insulating layer PAS3 may be disposed on the entire second insulating layer PAS2 to cover the second connection electrode CNE2, and the first connection electrode CNE1 of the second connection electrode layer may be disposed on the third insulating layer PAS3. The third insulating layer PAS3 may insulate the first connection electrode CNE1 and the second connection electrode CNE2 from each other to prevent direct contact therebetween.

The third insulating layer PAS3 may include the first contact portions CT1 disposed in the sub-region SA. The first contact portion CT1 may penetrate the third insulating layer PAS3 in addition to the first insulating layer PAS1 and the second insulating layer PAS2. The first contact portions CT1 may partially expose the top surface of the first electrode RME1 disposed thereunder.

Although not illustrated in the drawings, another insulating layer may be further disposed on the third insulating layer PAS3 and the first connection electrode CNE1. The insulating layer may protect the members disposed on the first substrate SUB from the external environment.

Each of the first insulating layer PAS1, the second insulating layer PAS2, and the third insulating layer PAS3 described above may include an inorganic insulating material or an organic insulating material. For example, each of the first insulating layer PAS1, the second insulating layer PAS2, and the third insulating layer PAS3 may include an inorganic insulating material. In another embodiment, the first insulating layer PAS1 and the third insulating layer PAS3 may include an inorganic insulating material, whereas the second insulating layer PAS2 may include an organic insulating material. Each or at least one of the first insulating layer PAS1, the second insulating layer PAS2, and the third insulating layer PAS3 may have a structure in which multiple insulating layers are stacked each other, alternately or repeatedly. In an embodiment, each of the first insulating layer PAS1, the second insulating layer PAS2, and the third insulating layer PAS3 may include any one of silicon oxide ($SiO_x$), silicon nitride ($SiN_x$), and silicon oxynitride ($SiO_xN_y$). The first insulating layer PAS1, the second insulating layer PAS2, and the third insulating layer PAS3 may be made of the same material or different materials. In another embodiment, some of them may be made of the same material and some of them may be made of different materials.

Figure 26:
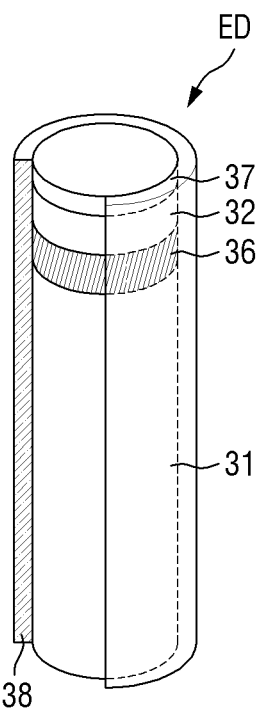
FIG. 26 is a perspective view of a light emitting element according to the embodiment of FIG. 23.

FIG. 26 is a perspective view of a light emitting element according to the embodiment of FIG. 23.

Referring to FIG. 26, the light emitting element ED may be a light emitting diode. For example, the light emitting element ED may be an inorganic light emitting diode that has a nanometer or micrometer size, and may be made of an inorganic material. The light emitting element ED may be aligned between two electrodes having polarity in case that an electric field is formed in a specific direction between two electrodes facing each other.

The light emitting element ED according to an embodiment may have a shape elongated in a direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped, and a hexagonal prism, or may have various shapes such as a shape elongated in a direction and having an outer surface partially inclined.

The light emitting element ED may include a semiconductor layer doped with a conductivity type (e.g., p-type or n-type) dopant. The semiconductor layer may emit light of a specific wavelength band by receiving an electrical signal applied from an external power source. The light emitting element ED may include a first semiconductor layer 31, a second semiconductor layer 32, an active layer 36, an electrode layer 37, and an insulating layer 38.

The descriptions of the first semiconductor layer 31, the second semiconductor layer 32, and the active layer 36 are the same as those described above with reference to FIG. 4, and thus descriptions thereof will be omitted.

The electrode layer 37 may be an ohmic connection electrode. However, the disclosure is not limited thereto, and the electrode layer 37 may be a Schottky connection electrode. The light emitting element ED may include at least one electrode layer 37. The light emitting element ED may include one or more electrode layers 37, but the disclosure is not limited thereto, and the electrode layer 37 may be omitted.

In the display device 1_2, in case that the light emitting element ED is electrically connected to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO.

The insulating film 38 may be arranged to surround the outer surfaces of the semiconductor layers and electrode layers described above. For example, the insulating film 38 may be disposed to surround at least an outer surface of the active layer 36, and may be formed to expose both ends of the light emitting element ED in the longitudinal direction. Further, in a cross-sectional view, the insulating film 38 may have a top surface, which is rounded in a region adjacent to at least an end of the light emitting element ED.

The insulating film 38 may include at least one of materials having insulating properties, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$). It is illustrated in the drawing that the insulating film 38 is formed as a single layer, but the disclosure is not limited thereto. In some embodiments, the insulating film 38 may be formed in a multilayer structure having multiple layers stacked each other therein.

The insulating film 38 may perform a function of protecting the semiconductor layers and the electrode layer of the light emitting element ED. The insulating film 38 may prevent an electrical short circuit that may occur at the active layer 36 in case that an electrode to which an electrical signal is transmitted is in direct contact with the light emitting element ED. The insulating film 38 may prevent a decrease in luminous efficiency of the light emitting element ED.

Further, the insulating film 38 may have an outer surface which is surface-treated. The light emitting elements ED may be aligned in such a way of spraying the ink in which the light emitting elements ED are dispersed on the electrodes. The surface of the insulating film 38 may be treated to have a hydrophobic property or hydrophilic property in order to keep the light emitting elements ED in the dispersed state without being aggregated with other adjacent light emitting elements ED in the ink.

Both ends of the light emitting element ED included in the display device 1_2 may be disposed on the electrodes RME1 and RME2. In an embodiment, the light emitting element ED may be sprayed onto the electrodes RME1 and RME2 in a dispersed state in ink through an inkjet printing process, and may be seated on the electrodes RME1 and RME2 while the positions of both ends of the light emitting element ED are changed by an electric field generated on the electrodes RME1 and RME2.

Hereinafter, a fabricating process of the light emitting element ED will be described with reference to other drawings. FIG. 27 is a flowchart illustrating a method of fabricating a display device according to another embodiment.

In the display device 1_2 according to the embodiment, the method is substantially identical to the method of fabricating the display device 1_1 of FIG. 6 in that the double semiconductor layer 30 including the void V, the semiconductor pattern 33, and the first semiconductor layer 31 is used as a growth substrate. In other words, the method of fabricating a base substrate SUB and a double semiconductor layer 30 of the display device 1_2 according to an embodiment may include preparing the base substrate SUB in which the undoped semiconductor layer USEM is formed on the second substrate 210 and the common electrode layer CEL is formed on the undoped semiconductor layer USEM (step S110); forming the double semiconductor material layer 300 including the semiconductor pattern layer 330 and the first semiconductor material layer 310 on the common electrode layer CEL of the base substrate SUB (step S120); exposing the first semiconductor material layer 310 by forming the insulating layer INS on the first semiconductor material layer 310 and etching a portion of the insulating layer INS (step S130); forming the semiconductor pattern 33 and the first semiconductor layer 31 by etching the semiconductor pattern layer 330 and the first semiconductor material layer 310 by using the insulating layer INS as a mask (step S140); and forming the void V by etching a portion of the semiconductor pattern 33 via photo-electrochemical etching, and forming the double semiconductor layer 30 including the semiconductor pattern 33, the void V, and the first semiconductor layer 31 (step S150).

A method of fabricating the display device 1_2 in which the light emitting elements ED are formed using the base substrate SUB and the double semiconductor layer 30 will be described with reference to FIG. 27.

The method of fabricating the display device 1_2 according to an embodiment may include exposing the top surface of the first semiconductor layer 31 of the double semiconductor layer 30 by etching the insulating layer INS (step S310), forming a stacked structure LS by forming an active material layer 360, a second semiconductor material layer 320, and ab electrode material layer 370 on the first semiconductor layer 31 (step S320), forming a mask layer 400 on the electrode material layer 370 of the stacked structure LS, forming multiple holes HOL by etching the stacked structure LS, and forming semiconductor rods SR spaced apart from each other (step S330); removing the mask layer 400, and forming an insulating material film 380 surrounding the side surfaces of the semiconductor rods SR (step S340); and forming the light emitting elements ED by etching the insulating material film 380 to separate the semiconductor rods SR in which the electrode layer 37 is exposed from the remaining first semiconductor layer 31 (step S350).

FIGS. 28 to 36 are schematic cross-sectional views sequentially illustrating a fabricating process of a display device according to another embodiment.

Referring first to FIG. 28, it corresponds to the fabricating method of FIGS. 8 to 12. The base substrate SUB including the second substrate 210, the undoped semiconductor layer USEM, and the common electrode layer CEL may be prepared, and the double semiconductor material layer 300 including the semiconductor pattern layer 330 and the first semiconductor material layer 310 may be formed on the base substrate SUB. The semiconductor pattern 33 and the first semiconductor layer 31 may be formed by etching the double semiconductor material layer 300. Thereafter, the double semiconductor layer 30 including the void V, the semiconductor pattern 33, and the first semiconductor layer 31 may be formed by etching a portion of the semiconductor pattern 33 through the third etching process Etch 3, which is a photo-electro-chemical etching process. Accordingly, the void V may be in contact (e.g., directly in contact) with the side surface of the semiconductor pattern 33, the bottom surface of the first semiconductor layer 31, and the top surface of the common electrode layer CEL.

Referring to FIG. 29, the top surface of the first semiconductor layer 31 of the double semiconductor layer 30 may be exposed by etching the insulating layer INS (step S310). The insulating layer INS may be removed through a fourth etching process Etch 4 which may be a dry etching process or a wet etching process, and the top surface of the first semiconductor layer 31 may be exposed.

Figure 30:
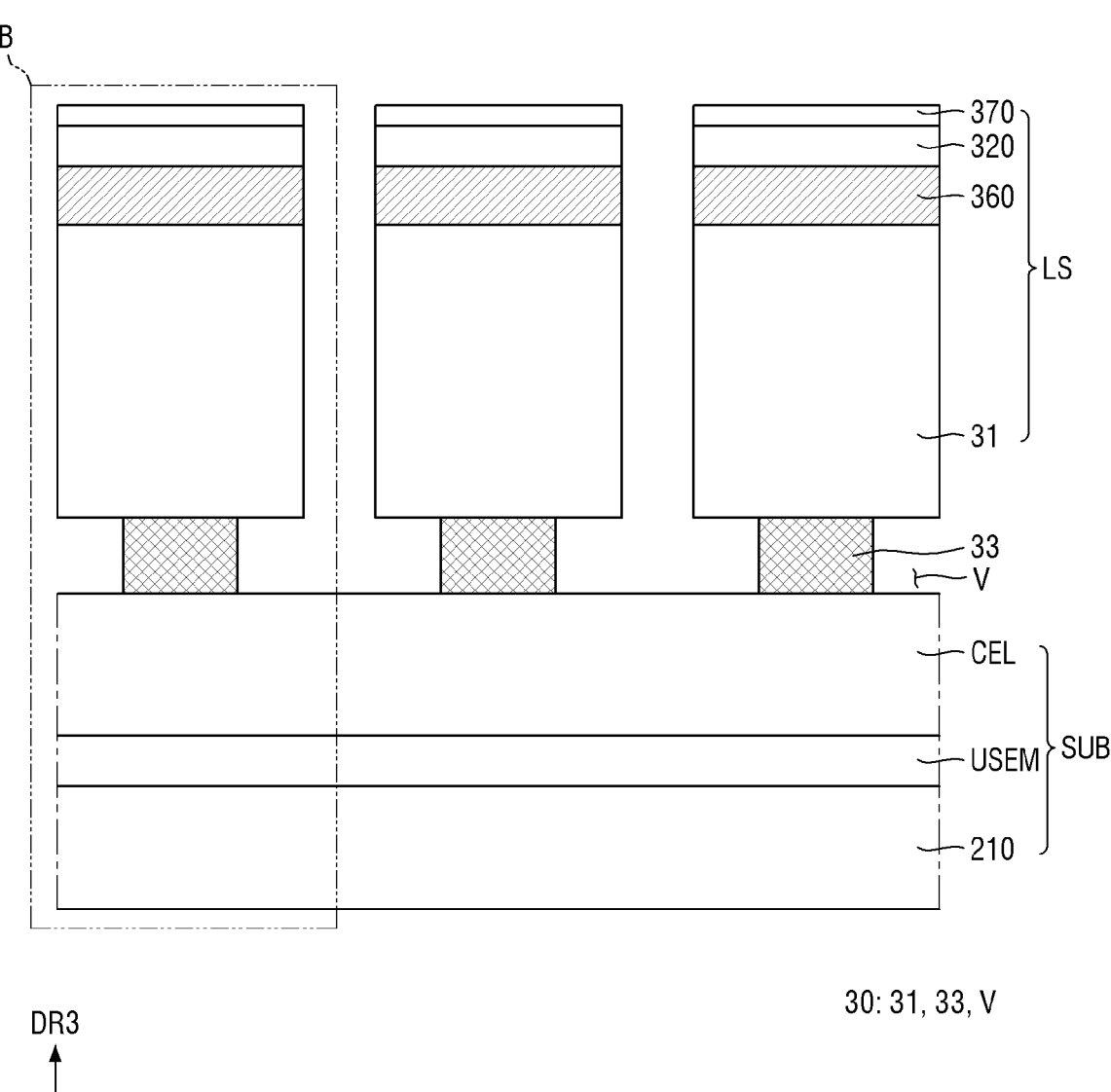

Referring to FIG. 30, multiple stacked structures LS may be formed by forming the active material layer 360, the second semiconductor material layer 320, and the electrode material layer 370 on the exposed first semiconductor layer 31 (step S320).

The active material layer 360, the second semiconductor material layer 320, and the electrode material layer 370 may correspond to the active layer 36, the second semiconductor layer 32, and the electrode layer 37 of the light emitting element ED, respectively. For example, the active material layer 360, the second semiconductor material layer 320, and the electrode material layer 370 may contain the same material as the active layer 36, the second semiconductor layer 32, and the electrode layer 37 of the light emitting element ED, respectively.

A process of fabricating the holes HOL and the light emitting elements ED formed on one stacked structure LS will be described with reference to FIGS. 31 to 36. FIGS. 31 to 36 are enlarged schematic cross-sectional views of area B of FIG. 30.

Figure 31:
Figure 32:

Referring to FIGS. 31 and 32, the mask layer 400 may be formed on the electrode material layer 370 of the stacked structure LS, the stacked structure LS may be etched to form the holes HOL, and the semiconductor rods SR spaced apart from each other may be formed (step S330). According to an embodiment, a fifth etching process Etch 5 of etching the stacked structure LS along the mask layer 400 may be included.

First, as illustrated in FIG. 31, the mask layer 400 may be formed on the electrode material layer 370. The mask layer 400 may include a first insulating mask layer 410, a second insulating mask layer 420 disposed on the electrode material layer 370, and mask patterns 430 disposed on the second insulating mask layer 420. The mask layer 400 may have a shape in which the insulating mask layers 410 and 420 are etched along a space in which the mask patterns 430 are spaced apart. The first semiconductor layer 31 and the second semiconductor material layer 320 may be etched along spaces between the insulating mask layers 410 and 420 and the mask patterns 430 of the mask layer 400. In some embodiments, the mask layer 400 may have the same diameter or width. The portion of the first semiconductor layer 31 and the second semiconductor material layer 320 that overlaps the portion on which the mask layer 400 may not be etched and may form the semiconductor rod SR constituting the light emitting element ED. A diameter of the mask layer 400 may be substantially the same as a diameter of the light emitting element ED. As the mask layers 400 have the same diameter or width, the light emitting elements ED may also have substantially the same diameter.

The first insulating mask layer 410 and the second insulating mask layer 420 may include an insulating material, and the mask pattern 430 may include a metal material. For example, each of the insulating mask layers 410 and 420 may include silicon oxide ($SiO_x$), silicon nitride ($SiN_x$), silicon oxynitride ($SiO_xN_y$), and the like. The mask pattern 430 may include a metal such as chromium (Cr), but is not limited thereto.

Subsequently, as illustrated in FIG. 32, a fifth etching process Etch 5 of forming the holes HOL by etching the first semiconductor layer 31 and the second semiconductor material layer 320 along the mask layer 400 may be performed. The fifth etching process Etch 5 may be performed in a direction perpendicular to the top surface of the base substrate SUB. At least some of the holes HOL formed by the fifth etching process Etch 5 may overlap the semiconductor pattern 33 in the third direction DR3, and the others may overlap the void V in the third direction DR3.

The etching process may be performed by dry etching, wet etching, reactive ion etching (RIE), inductively coupled plasma reactive ion etching (ICP-RIE), or the like. The dry etching method may be suitable for vertical etching because anisotropic etching may be performed. In the case of using the aforementioned etching technique, it may be possible to use $Cl_2$ or $O_2$ as an etchant. However, the disclosure is not limited thereto.

Multiple semiconductor rods SR spaced apart from each other may be formed on the base substrate SUB and the semiconductor pattern 33 by the fifth etching process Etch 5. Each of the semiconductor rods SR may include the first semiconductor layer 31, the active material layer 360, the second semiconductor material layer 320, and the electrode material layer 370. In the fifth etching process Etch 5, the lower end portion of the first semiconductor layer 31 may not be completely etched, and a lower portion of layer may remain. In the semiconductor rods SR, the first semiconductor layers 31 may be electrically connected to each other. The insulating material film 380 may be formed on outer surfaces of the semiconductor rods SR in a subsequent process to constitute the light emitting elements ED. At least some of the semiconductor rods SR formed by the fifth etching process Etch 5 may overlap the semiconductor pattern 33 in the third direction DR3, and the remaining others may overlap the void V in the third direction DR3.

Figure 33:
Figure 34:

Referring to FIGS. 33 and 34, the mask layer 400 may be removed, and the insulating material film 380 surrounding the side surface of the semiconductor rod SR may be formed (step S340). In the process of forming the insulating material film 380, the insulating material film 380 may be formed to surround the outer surface of the semiconductor rod SR.

The insulating material film 380 may be an insulating layer formed on the outer surface of the semiconductor rod SR, and may be formed by applying or immersing an insulating material on the vertically etched outer surface of the semiconductor rod SR. However, the disclosure is not limited thereto. For example, the insulating material film 380 may be formed by atomic layer deposition (ALD) or chemical vapor deposition (CVD).

The insulating material film 380 may also be formed on the side surface and the top surface of the semiconductor rod SR, and the remaining first semiconductor layer 31 exposed in an area in which the semiconductor rods SR are spaced apart from each other.

Figure 35:
Figure 36:

Referring to FIGS. 35 and 36, the light emitting element ED may be formed by etching the insulating material film 380 to separate the semiconductor rod SR in which the electrode layer 37 is exposed from the remaining first semiconductor layer 31 (step S350).

Referring to FIG. 35, the etching process of the insulating material film 380 may be performed by performing a sixth etching process Etch 6 of partially removing the insulating material film 380 so that the top surface of the semiconductor rod SR may be exposed. In the sixth etching process Etch 6, a process such as dry etching that is anisotropic etching or etch-back may be performed.

In the drawing, the top surface of the insulating material film 380 is removed to expose the electrode material layer 370, and in this process, the electrode material layer 370 may also be partially etched. In the light emitting element ED, the thickness of the electrode layer 37 of the finally fabricated light emitting element ED may be smaller than the thickness of the electrode material layer 370 formed during the fabricating process.

Although the figure illustrates that the top surface of the electrode material layer 370 is partially exposed and the top surface of the insulating material film 380 is flat, the disclosure is not limited thereto. In some embodiments, an outer surface of the insulating material film 380 may be partially curved in an area surrounding the electrode material layer 370. In the process of partially removing the insulating material film 380, not only the top surface of the insulating material film 380 but also the side surface of the insulating material film 380 may be partially removed, so that the end surface of the insulating material film 380 surrounding the layers may be partially etched. As the top surface of the insulating material film 380 is removed, the outer surface of the insulating layer 38 adjacent to the electrode layer 37 in the light emitting element ED may be partially removed.

Referring to FIG. 36, the semiconductor rod SR on which the insulating layer 38 is formed may be separated from the remaining first semiconductor layer 31. The semiconductor rod SR separated from the remaining first semiconductor layer 31 may become the light emitting element ED.

Through the above process, the light emitting elements ED may be formed on the double semiconductor layer 30 including the void V, the semiconductor pattern 33, and the first semiconductor layer 31. In particular, by forming the third light emitting element ED3 having a high indium content on the first semiconductor layer 31 of the double semiconductor layer 30 with a relaxed strain and an increased lattice constant, internal defects that may occur during the growth process of the third light emitting element ED3 may be minimized.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
   a plurality of pixel electrodes spaced apart from each other on a substrate;
   a plurality of light emitting elements disposed on the plurality of pixel electrodes, the plurality of light emitting elements comprising a first semiconductor layer;
   a semiconductor pattern disposed on the first semiconductor layer;
   a common electrode layer disposed on the semiconductor pattern; and
   a void disposed between the first semiconductor layer, the semiconductor pattern, and the common electrode layer,
   wherein the plurality of light emitting elements comprise a first light emitting element and a second light emitting element.

2. The display device of claim 1, wherein the first semiconductor layer and the semiconductor pattern include different materials.

3. The display device of claim 2, wherein a lattice constant of the semiconductor pattern is greater than a lattice constant of the first semiconductor layer.

4. The display device of claim 1, wherein the first semiconductor layer and the semiconductor pattern are each doped with an n-type dopant.

5. The display device of claim 1, wherein each of the plurality of light emitting elements further comprises:

a second semiconductor layer electrically connected to a corresponding one of the plurality of pixel electrodes, and an active layer disposed between the first semiconductor layer and the second semiconductor layer.

6. The display device of claim 5, wherein the semiconductor pattern and the active layer include a same material.

7. The display device of claim 1, wherein the first semiconductor layer and the common electrode layer are spaced apart from each other in a thickness direction of the substrate and are electrically connected to each other.

8. The display device of claim 1, wherein a width of the semiconductor pattern in a direction is smaller than a width of the first semiconductor layer in the direction.

9. The display device of claim 8, wherein the width of the semiconductor pattern in the direction is greater than a width of the first light emitting element in the direction.

10. The display device of claim 1, wherein the void is surrounded by each of the first semiconductor layer, the semiconductor pattern, and the common electrode layer.

11. The display device of claim 1, wherein the semiconductor pattern overlaps the first light emitting element in a thickness direction of the substrate.

12. The display device of claim 11, wherein the semiconductor pattern does not overlap the second light emitting element in the thickness direction of the substrate.

13. The display device of claim 12, wherein the first light emitting element emits light of a blue wavelength band, and the second light emitting element emits light of a red wavelength band.

14. The display device of claim 1, wherein the void overlaps at least one of the plurality of light emitting elements in a thickness direction of the substrate.

15. A method of fabricating a display device, comprising:

forming a common electrode layer comprising an n-type semiconductor on a substrate;

forming a semiconductor material layer on the common electrode layer;

forming a semiconductor pattern layer on the semiconductor material layer, forming an insulating layer on the semiconductor material layer;

forming a semiconductor pattern and a first semiconductor layer by etching the semiconductor pattern layer and the semiconductor material layer;

forming a void by etching a portion of the semiconductor pattern;

forming a plurality of holes penetrating the insulating layer to expose a portion of the first semiconductor layer; and forming an active layer and a second semiconductor layer comprising a p-type semiconductor in each of the plurality of holes.

16. The method of claim 15, wherein the forming of the void by etching a portion of the semiconductor pattern comprises exposing another portion of the first semiconductor layer and a portion of the common electrode layer.

17. The method of claim 15, wherein the display device comprises a plurality of light emitting elements, the plurality of light emitting elements include the first semiconductor layer, the active layer, and the second semiconductor layer, and the plurality of light emitting elements comprise a blue light emitting element, a green light emitting element, and a red light emitting element which are sequentially arranged in a direction.

18. The method of claim 15, wherein a lattice constant of the semiconductor pattern is greater than a lattice constant of the first semiconductor layer.

19. A method of fabricating a display device, comprising:

forming a common electrode layer comprising an n-type semiconductor on a substrate;

forming a first semiconductor material layer on the common electrode layer;

forming a semiconductor pattern layer on the first semiconductor material layer, forming a semiconductor pattern and a first semiconductor layer by etching the semiconductor pattern layer and the first semiconductor material layer;

forming a void by etching a portion of the semiconductor pattern;

forming a stacked structure by forming an active material layer on the first semiconductor layer and forming a second semiconductor material layer on the active material layer;

forming semiconductor rods spaced apart from each other by forming a plurality of holes by etching the stacked structure in a thickness direction of the substrate;

forming an insulating material film surrounding outer surfaces of the semiconductor rods, and separating the semiconductor rods from the substrate to form light emitting elements.

20. The method of claim 19, wherein at least some of the semiconductor rods overlap the semiconductor pattern in the thickness direction of the substrate, and other of the semiconductor rods overlap the void in the thickness direction of the substrate.

\* \* \* \* \*